United States Patent
Kusunoki

(10) Patent No.: US 10,290,693 B2
(45) Date of Patent: May 14, 2019

(54) DISPLAY PANEL AND METHOD FOR DRIVING THE SAME

(71) Applicant: Semiconductor Energy Laboratory Co., Ltd., Atsugi-shi, Kanagawa-ken (JP)

(72) Inventor: Koji Kusunoki, Kawasaki (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 145 days.

(21) Appl. No.: 15/225,173

(22) Filed: Aug. 1, 2016

(65) Prior Publication Data

US 2017/0040404 A1    Feb. 9, 2017

(30) Foreign Application Priority Data

Aug. 7, 2015   (JP) ................................. 2015-157369
Jun. 24, 2016  (JP) ................................. 2016-125619

(51) Int. Cl.
*G09G 3/3225* (2016.01)
*H01L 27/32* (2006.01)
(Continued)

(52) U.S. Cl.
CPC ........ *H01L 27/3267* (2013.01); *G02F 1/1368* (2013.01); *G02F 1/133553* (2013.01);
(Continued)

(58) Field of Classification Search
CPC .................................................. G09G 3/3225
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Nelson M Rosario
*Assistant Examiner* — Scott Au
(74) *Attorney, Agent, or Firm* — Robinson Intellectual Property Law Office; Eric J. Robinson

(57) ABSTRACT

Provided is a novel display panel that is highly convenient or reliable or a display panel with a high pixel aperture ratio. The display panel includes the first display element, the first conductive film electrically connected to the first display element, the second conductive film having a region overlapping with the first conductive film, the second insulating film having a region sandwiched between the second conductive film and the first conductive film, a pixel circuit electrically connected to the second conductive film, and the second display element electrically connected to the pixel circuit. The second insulating film includes an opening, and the second conductive film is electrically connected to the first conductive film in the opening.

15 Claims, 31 Drawing Sheets

(51) Int. Cl.
*G02F 1/1335* (2006.01)
*G02F 1/1362* (2006.01)
*G02F 1/1368* (2006.01)
*G09G 3/36* (2006.01)
*H01L 27/12* (2006.01)
*H01L 29/786* (2006.01)
*G09G 5/34* (2006.01)

(52) U.S. Cl.
CPC ..... *G02F 1/136286* (2013.01); *G09G 3/3225* (2013.01); *G09G 3/3648* (2013.01); *H01L 27/3262* (2013.01); *H01L 27/3276* (2013.01); *G02F 2001/133565* (2013.01); *G02F 2201/40* (2013.01); *G02F 2201/44* (2013.01); *G02F 2201/58* (2013.01); *G09G 5/34* (2013.01); *G09G 2300/023* (2013.01); *G09G 2300/046* (2013.01); *G09G 2300/0465* (2013.01); *G09G 2310/0205* (2013.01); *G09G 2320/0242* (2013.01); *G09G 2320/066* (2013.01); *G09G 2320/0626* (2013.01); *G09G 2320/0666* (2013.01); *G09G 2320/103* (2013.01); *G09G 2330/021* (2013.01); *G09G 2340/0435* (2013.01); *G09G 2360/144* (2013.01); *G09G 2360/16* (2013.01); *H01L 27/1225* (2013.01); *H01L 27/1237* (2013.01); *H01L 27/1251* (2013.01); *H01L 29/7869* (2013.01); *H01L 2251/533* (2013.01)

(56) References Cited

U.S. PATENT DOCUMENTS

| | | |
|---|---|---|
| 6,294,274 B1 | 9/2001 | Kawazoe et al. |
| 6,556,260 B1 | 4/2003 | Itou et al. |
| 6,563,174 B2 | 5/2003 | Kawasaki et al. |
| 6,714,268 B2 | 3/2004 | Wang et al. |
| 6,727,522 B1 | 4/2004 | Kawasaki et al. |
| 6,912,021 B2 | 6/2005 | Kimura |
| 7,038,641 B2 | 5/2006 | Hirota et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,084,936 B2 | 8/2006 | Kato |
| 7,102,704 B2 | 9/2006 | Mitsui et al. |
| 7,105,868 B2 | 9/2006 | Nause et al. |
| 7,176,991 B2 | 2/2007 | Mitsui et al. |
| 7,211,825 B2 | 5/2007 | Shih et al. |
| 7,239,361 B2 | 7/2007 | Kato |
| 7,248,235 B2 | 7/2007 | Fujii et al. |
| 7,282,782 B2 | 10/2007 | Hoffman et al. |
| 7,297,977 B2 | 11/2007 | Hoffman et al. |
| 7,304,696 B2 | 12/2007 | Yamagishi |
| 7,323,356 B2 | 1/2008 | Hosono et al. |
| 7,385,224 B2 | 6/2008 | Ishii et al. |
| 7,385,654 B2 | 6/2008 | Mitsui et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu |
| 2003/0102801 A1 | 6/2003 | Senbonmatsu |
| 2003/0189401 A1 | 10/2003 | Kido et al. |
| 2003/0201960 A1 | 10/2003 | Fujieda |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0072047 A1 | 4/2006 | Sekiguchi |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0242031 A1* | 10/2007 | Kimura ............ G02F 1/133603 345/102 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0180618 A1 | 7/2008 | Fujieda |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0171905 A1 | 7/2010 | Huang et al. |
| 2011/0205468 A1 | 8/2011 | Hirakata et al. |
| 2016/0042702 A1 | 2/2016 | Hirakata et al. |
| 2016/0275911 A1 | 9/2016 | Kubota et al. |

(56) References Cited

U.S. PATENT DOCUMENTS

| | | |
|---|---|---|
| 2016/0283028 A1 | 9/2016 | Yamazaki et al. |
| 2016/0299387 A1 | 10/2016 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-066593 A | 3/2001 |
| JP | 2002-076356 A | 3/2002 |
| JP | 2002-196702 A | 7/2002 |
| JP | 2002-289859 A | 10/2002 |
| JP | 2002-328630 A | 11/2002 |
| JP | 2003-076302 A | 3/2003 |
| JP | 2003-086000 A | 3/2003 |
| JP | 2003-086808 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-103957 A | 4/2004 |
| JP | 2004-273614 A | 9/2004 |
| JP | 2004-273732 A | 9/2004 |
| JP | 2004-296162 A | 10/2004 |
| JP | 2007-232882 A | 9/2007 |
| JP | 4161574 B2 | 10/2008 |
| JP | 2011-191750 | 9/2011 |
| JP | 2013-221965 A | 10/2013 |
| WO | WO-2004/053819 A | 6/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digset '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID Interational Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digset '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2FeO7 Types of Structures for Compounds in the In2O3 and SC2O3—A2O3—BO Systems [A; Fe, Ga or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m <4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW'02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Shieh.H, "Transflective display by Hybrid OLED and LCD", LEOS 2005 (IEEE Lasers and Electro-Optics Society Annual Meeting), Oct. 22, 2005, pp. 650-651, IEEE.

(56) References Cited

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

* cited by examiner

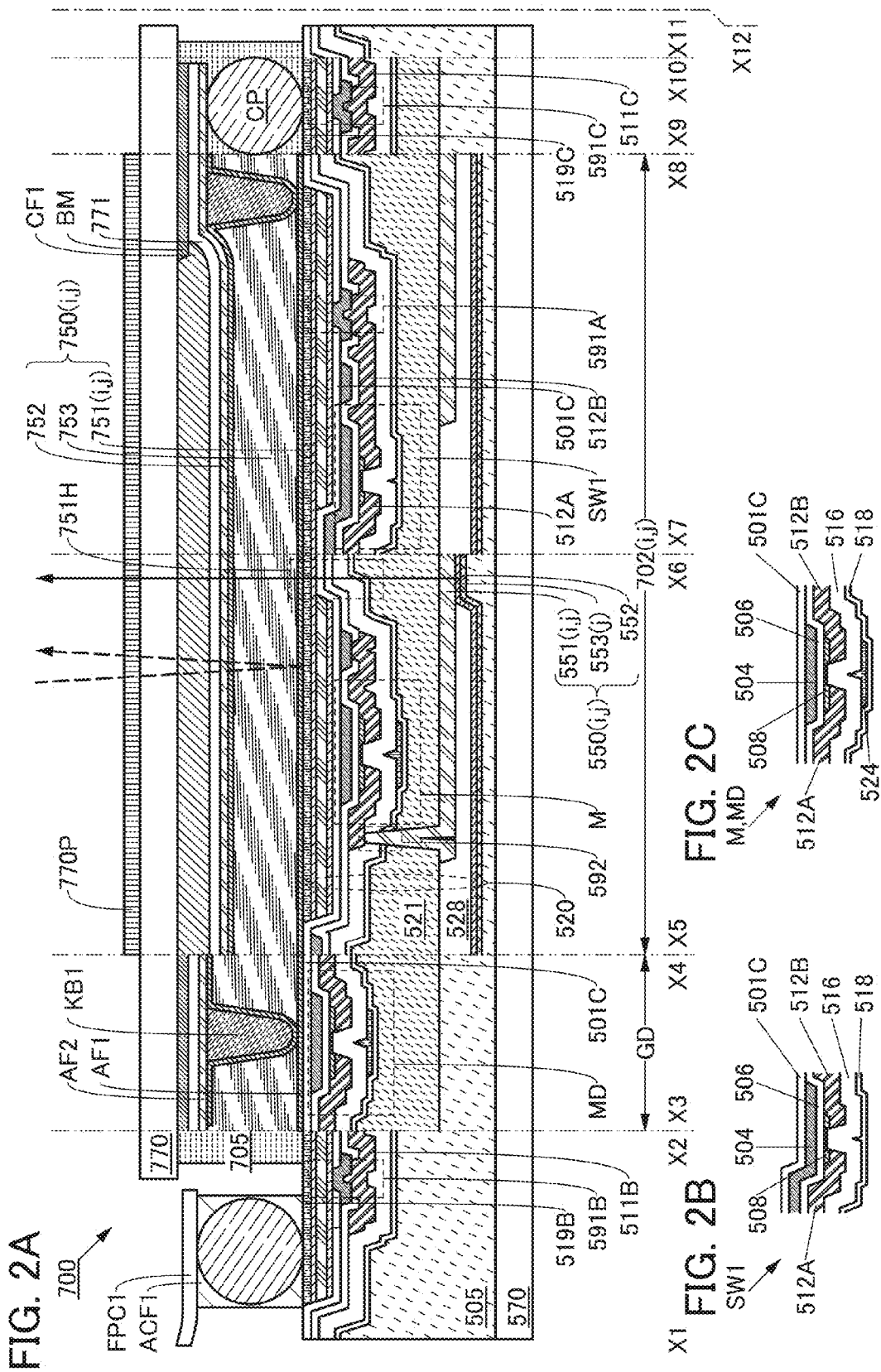

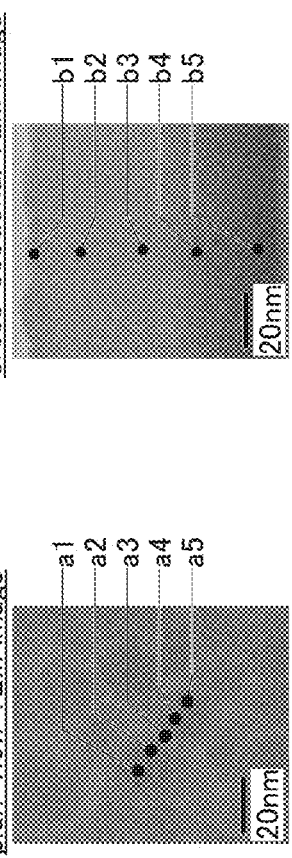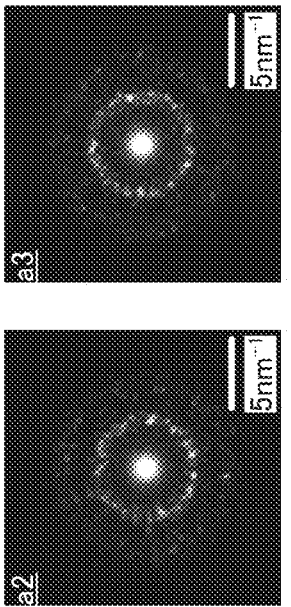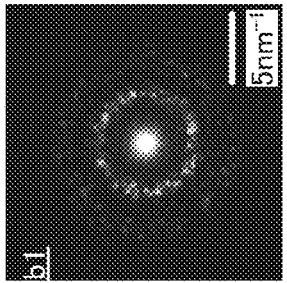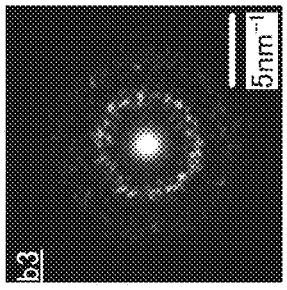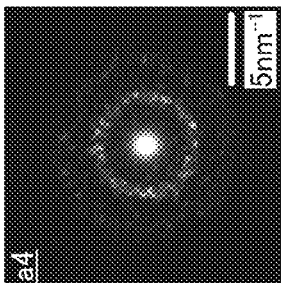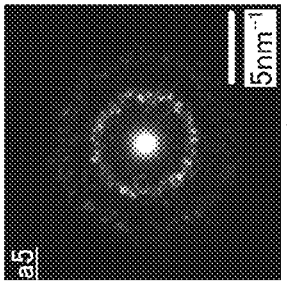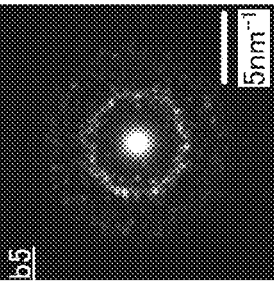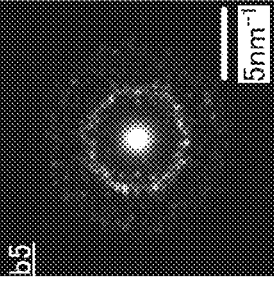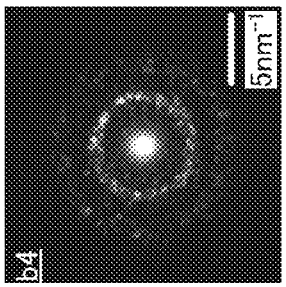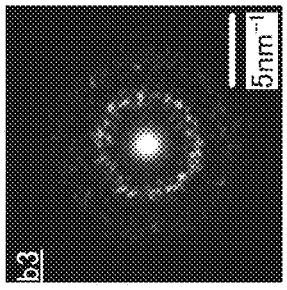

DISPLAY PANEL AND METHOD FOR DRIVING THE SAME

BACKGROUND OF THE INVENTION

1. Field of the Invention

One embodiment of the present invention relates to a display panel. One embodiment of the present invention relates to a method for driving the display panel.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A liquid crystal display device in which a light-condensing means and a pixel electrode are provided on one side of a substrate and a region transmitting visible light in the pixel electrode is provided to overlap with an optical axis of the light-condensing means is known. In addition, a liquid crystal display device which uses an anisotropic light-condensing means having a light-condensing direction X and a non-light-condensing direction Y, where the non-light-condensing direction Y corresponds to a longitudinal direction of a region transmitting visible light in the pixel electrode is known (Patent Document 1).

REFERENCE

Patent Document

[Patent Document 1] Japanese Published Patent Application No. 2011-191750

SUMMARY OF THE INVENTION

An object of one embodiment of the present invention is to provide a novel display panel that is highly convenient or reliable. Another object is to provide a display panel with a high pixel aperture ratio.

The description of these objects does not disturb the existence of other objects. Note that one embodiment of the present invention does not necessarily achieve all the objects. Other objects will be apparent from and can be derived from the description of the specification, the drawings, the claims, and the like.

(1) One embodiment of the present invention is a display panel including a signal line and a pixel.

The pixel is electrically connected to a signal line, and includes a first display element, a first conductive film, a second conductive film, a second insulating film, a pixel circuit, and a second display element.

The first conductive film is electrically connected to the first display element. The second conductive film has a region overlapping with the first conductive film. The second insulating film has a region sandwiched between the second conductive film and the first conductive film. The pixel circuit is electrically connected to the second conductive film. The second display element is electrically connected to the pixel circuit.

The second insulating film includes an opening, and is electrically connected to the first conductive film in the opening. The pixel circuit is electrically connected to the signal line.

(2) Another embodiment of the present invention is the above-described display panel in which the pixel circuit includes a first switch and a second switch. The first switch is electrically connected to the first display element, the second switch is electrically connected to the second display element, and the first switch and the second switch are electrically connected to the signal line. The switch is a transistor and the transistor includes an oxide semiconductor.

(3) Another embodiment of the present invention is the above-described display panel further including a first signal line driver circuit, a second signal line driver circuit, a first transistor, and a second transistor. The first signal line driver circuit is electrically connected to the signal line through the first transistor. The second signal line driver circuit is electrically connected to the signal line through the second transistor.

(4) Another embodiment of the present invention is the above-described display panel in which the second display element is configured to perform display in a direction the same as a direction in which the first display element performs display.

(5) Another embodiment of the present invention is the above-described display panel in which a display region of the second display element is surrounded by a display region of the first display element.

(6) Another embodiment of the present invention is the above-described display panel in which the first display element includes a reflective film and is configured to control the intensity of reflected light.

The reflective film has a function of reflecting incident light and includes an opening. The second display element is configured to emit light toward the opening.

(7) Another embodiment of the present invention is the above-described display panel further including a first group of pixels, a second group of pixels, and a scan line.

The first group of pixels include the above-described pixel, and are arranged in a row direction. The second group of pixels include the above-described pixel, and are arranged in a column direction that intersects with the row direction.

The scan line is electrically connected to the first group of pixels arranged in the row direction.

The second group of pixels arranged in the column direction are electrically connected to the signal line.

The positions of openings of pixels adjacent to each other in the row direction or the column direction are different.

(8) Another embodiment of the present invention is a method for driving any of the above-described display panels, in which one frame period has at least a first period and a second period, the first switch is selected in the first period, and the second switch is selected in the second period.

Although the block diagram attached to this specification shows components classified by their functions in independent blocks, it is difficult to classify actual components according to their functions completely and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

In this specification, a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

In this specification, a state in which transistors are connected to each other in series means, for example, a state in which only one of a source and a drain of a first transistor is connected to only one of a source and a drain of a second transistor. In addition, a state in which transistors are connected parallel to each other means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, a connection state means not only a state of direct connection but also a state of indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

In addition, in this specification, one of a first electrode and a second electrode of a transistor refers to a source electrode and the other refers to a drain electrode.

One embodiment of the present invention can provide a novel display panel that is highly convenient or reliable or a display panel having a high pixel aperture ratio.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 2A to 2C illustrate a structure of a display panel of Embodiment.

FIGS. 4A, 4B-1, and 4B-2 illustrate structures of display panels of Embodiment.

FIGS. 30A and 30B are TEM images of samples and FIGS. 30C to 30L are electron diffraction patterns thereof.

DETAILED DESCRIPTION OF THE INVENTION

Figure 1A:
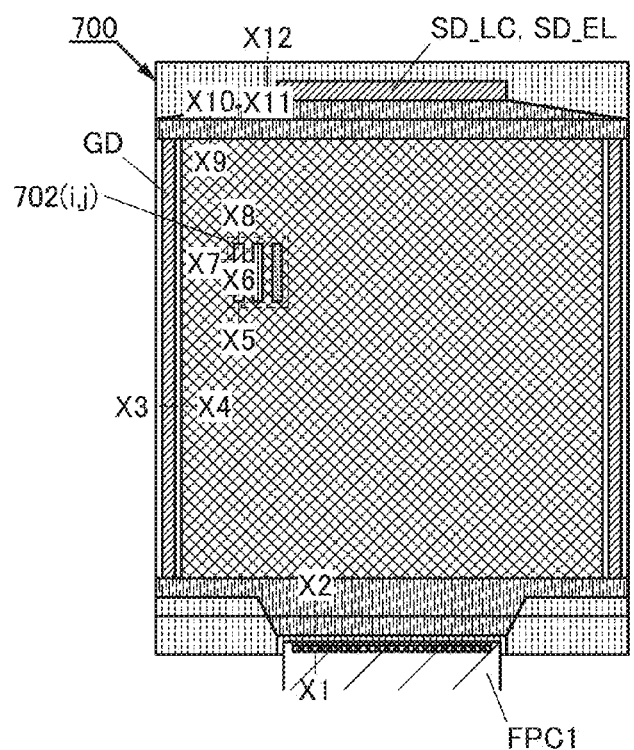
FIGS. 1A, 1B-1, and 1B-2 illustrate a structure of a display panel of Embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

(Embodiment 1)

In this embodiment, a structure of a display panel of one embodiment of the present invention will be described with reference to FIGS. 1A to 1B-2, FIGS. 2A to 2C, FIG. 3, FIGS. 4A to 4B-2, FIG. 5, and FIG. 6.

Figures 1, 1B:
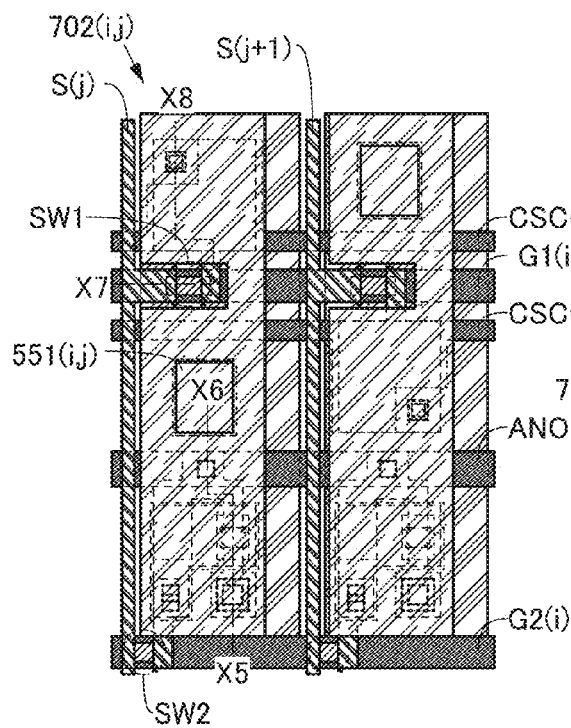

FIGS. 1A, 1B-1, and 1B-2 illustrate the structure of a display panel 700 of one embodiment of the present invention. FIG. 1A is a bottom view illustrating a display panel 700 of one embodiment of the present invention. FIG. 1B-1 is a bottom view illustrating part of FIG. 1A, and FIG. 1B-2 is a bottom view in which some components in FIG. 1B-1 are not illustrated.

Figures 1, 1B, 2:
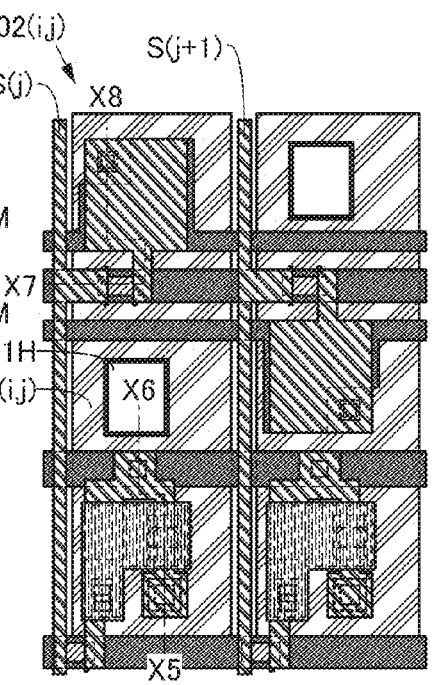

FIGS. 2A to 2C illustrate the structures of the display panel 700 of one embodiment of the present invention. FIG. 2A is a cross-sectional view taken along lines X1-X2, X3-X4, X5-X6, X7-X8, X9-X10, and X11-X12 in FIG. 2A. The X5-X6 cross section and the X7-X8 cross section in FIG. 2A correspond to the lines X5-X6 and X7-X8 in FIG. 1B-1 and FIG. 1B-2. FIG. 2B is a cross-sectional view illustrating part of the display panel. FIG. 2C is a cross-sectional view illustrating other part of the display panel.

Figure 3:
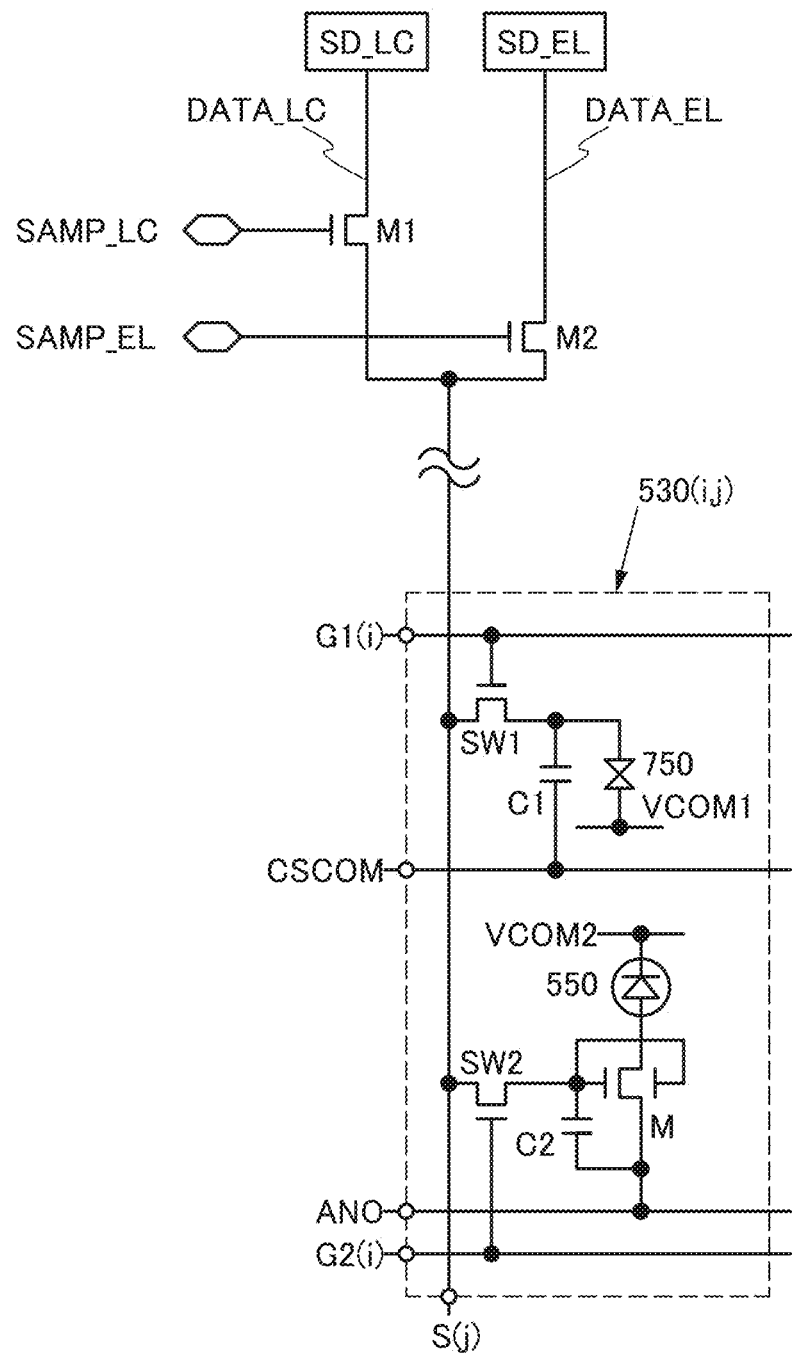
FIG. 3 is a block diagram illustrating a pixel circuit of Embodiment.

FIG. 3 illustrates the structure of the display panel 700 of one embodiment of the present invention. FIG. 3 is a block diagram illustrating a peripheral circuit and a pixel circuit 530(i, j) that can be used in a pixel circuit included in the display panel 700 of one embodiment of the present invention.

Figure 4A:
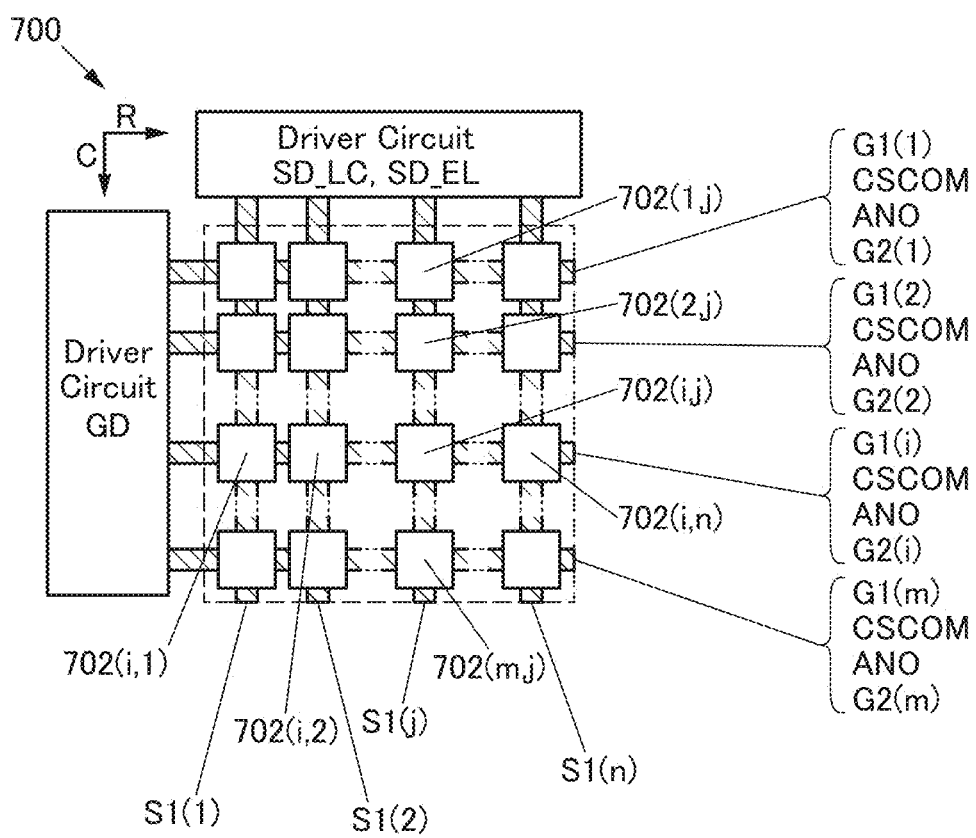
Figures 1, 4B:
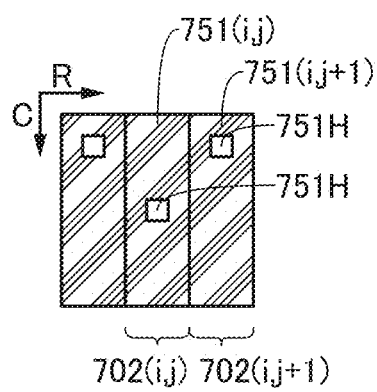
Figures 2, 4B:
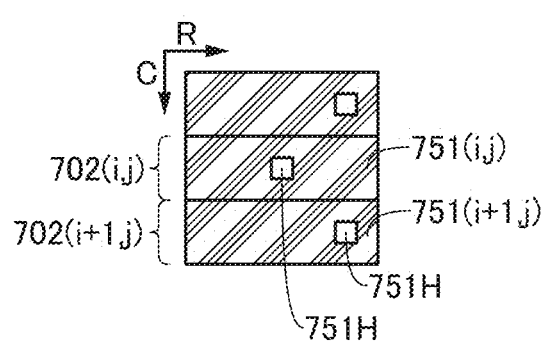
Figure 5:
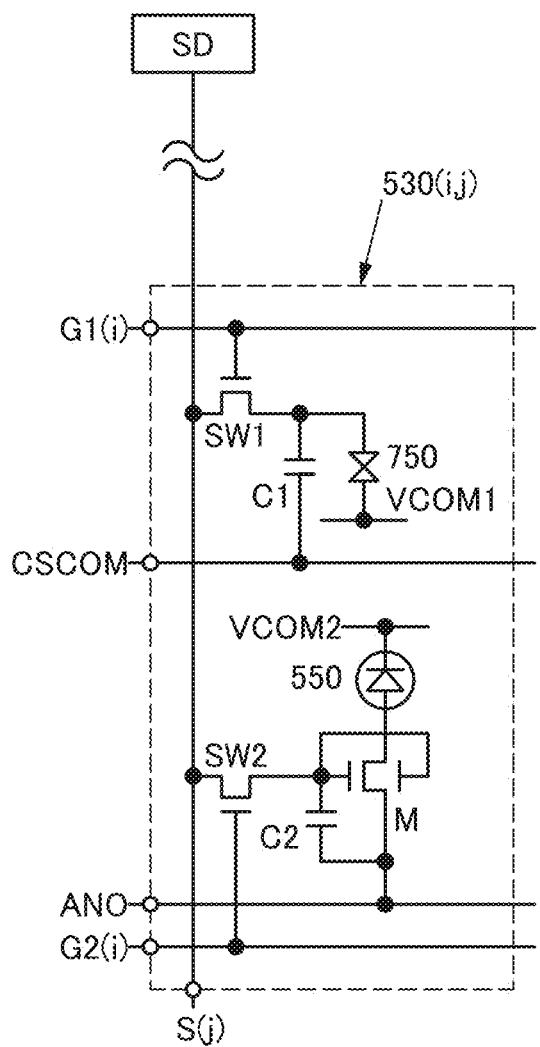
FIG. 5 is a circuit diagram illustrating a pixel circuit of Embodiment.

FIGS. 4A, 4B-1, and 4B-2 illustrate the structure of the display panel 700 of one embodiment of the present invention. FIG. 4A is a block diagram illustrating arrangement of pixels, wirings, and the like in the display panel 700 of one embodiment of the present invention. FIGS. 4B-1 and 4B-2 are schematic views each illustrating the positions of openings 751H in the display panel 700 of one embodiment of the present invention.

<Structure Example 1 of Display Panel>

The display panel 700 described in this embodiment includes a signal line S(j) and a pixel 702(i, j) (see FIGS. 1B-1 and 1B-2).

The pixel 702(i, j) is electrically connected to the signal line S(j).

The pixel 702(i, j) includes a first display element 750(i, j), the first conductive film, the second conductive film, a second insulating film 501C, the pixel circuit 530(i, j), and the second display element 550(i, j) (see FIG. 2A and FIG. 3).

The first conductive film is electrically connected to the first display element 750(i, j) (see FIG. 2A). For example, the first conductive film can be used for a first electrode 751(i, j) of the first display element 750(i, j).

The second conductive film has a region overlapping with the first conductive film. For example, the second conductive film can be used as a conductive film 512B that serves as a source electrode or a drain electrode of a transistor that can be used as a switch SW1.

The second insulating film 501C has a region sandwiched between the second conductive film and the first conductive film.

The pixel circuit 530(i, j) is electrically connected to the second conductive film. For example, a transistor in which the second conductive film is used as the conductive film 512B that serves as a source electrode or a drain electrode can be used as the switch SW1 of the pixel circuit 530(i, j) (see FIG. 2A and FIG. 3).

The second display element 550(i, j) is electrically connected to the pixel circuit 530(i, j).

A first connection portion 591A is provided in the second insulating film 501C (see FIG. 2A).

The second conductive film is electrically connected to the first conductive film in the first connection portion 591A. For example, the conductive film 512B is electrically connected to the first electrode 751(i, j) that also serves as the first conductive film.

The pixel circuit 530(i, j) is electrically connected to the signal line S(j) (see FIG. 3). Note that a conductive film 512A is electrically connected to the signal line S(j) (see FIG. 2A and FIG. 3).

The first electrode 751(i, j) is embedded in the second insulating film 501C.

The pixel circuit 530(i, j) of the display panel described in this embodiment includes the switch SW1. A transistor including an oxide semiconductor is used as the switch SW1.

The second display element 550(i, j) of the display panel described in this embodiment has a function of performing display in the same direction as a direction in which the first display element 750(i, j) performs display. For example, a dashed line arrow denotes the direction in which the first display element 750(i, j) performs display by controlling the intensity of external light reflection, and a solid line arrow denotes the direction in which the second display element 550(i, j) performs display (see FIG. 2A).

A display region of the second display element 550(i, j) in the display panel described in this embodiment is surrounded by a display region of the first display element 750(i, j) (see FIG. 4B-1 or FIG. 4B-2). The first display element 750(i, j) performs display in a region overlapping with the first electrode 751(i, j), and the second display element 550(i, j) performs display in a region overlapping with the opening 751H.

The first display element 750(i, j) of the display panel described in this embodiment includes a reflective film having a function of reflecting incident light and has a function of controlling the intensity of reflected light. The reflective film includes the opening 751H. Note that for the reflective film of the first display element 750(i, j), the first conductive film or first electrode 751(i, j) can be used, for example.

The second display element 550(i, j) has a function of emitting light toward the opening 751H.

The display panel described in this embodiment includes the pixel 702(i, j), a first group of pixels 702(i, 1) to 702(i, n), a second group of pixels 702(1, j) to 702(m, j), and a scan line G1(i) (see FIG. 4A). Note that i is an integer greater than or equal to 1 and less than or equal to m, j is an integer greater than or equal to 1 and less than or equal to n, and each of m and n is an integer greater than or equal to 1.

The display panel described in this embodiment includes a scan line G2(i), a wiring CSCOM, and a wiring ANO.

The first group of pixels 702(i, 1) to 702(i, n) include a pixel 702(i, j) and are arranged in the row direction (in the direction denoted by an arrow R).

The second group of pixels 702(1, j) to 702(m, j) include the pixel 702(i, j) and are arranged in the column direction (in the direction denoted by an arrow C) that intersects with the row direction.

The scan line G1(i) is electrically connected to the first group of pixels 702(i, 1) to 702(i, n) arranged in the row direction.

The second group of pixels 702(1, j) to 702(m, j) arranged in the column direction are electrically connected to the signal line S(j).

For example, the pixel 702(i, j+1) adjacent to the pixel 702(i, j) in the row direction preferably includes an opening in a position different from that of the opening 751H in the pixel 702(i, j) (see FIG. 4B-1).

For example, the pixel 702(i+1, j) adjacent to the pixel 702(i, j) in the column direction preferably includes an opening in a position different from that of the opening 751H in the pixel 702(i, j) (see FIG. 4B-2). Note that the first electrode 751(i, j) can be used as the reflective film, for example.

The above-described display panel of one embodiment of the present invention includes the first display element, the first conductive film electrically connected to the first display element, the second conductive film having a region overlapping with the first conductive film, the second insulating film having a region sandwiched between the second conductive film and the first conductive film, a pixel circuit electrically connected to the second conductive film, and the second display element electrically connected to the pixel circuit. The second insulating film includes an opening, and the second conductive film is electrically connected to the first conductive film in the opening.

Accordingly, for example, with use of the pixel circuits formed through the same process, the first display element and the second display element that performs display by a different method from the first display element can be driven. Accordingly, a novel display panel that is highly convenient or reliable can be provided.

The display panel described in this embodiment includes a terminal 519B and a conductive film 511B (see FIG. 2A).

The second insulating film 501C has a region sandwiched between the terminal 519B and the conductive film 511B. A third connection portion 591B is provided in the second insulating film 501C.

The terminal 519B is electrically connected to the conductive film 511B in the third connection portion 591B. The conductive film 511B is electrically connected to the pixel circuit 530(i, j). In the case where, for example, the first electrode 751(i, j) or the first conductive film is used as the reflective film, a plane of the terminal 519B in contact with an anisotropic conductive film ACF1 and a plane of the first electrode 751(i, j) on the side where light enters the first display element 750(i, j) face in the same direction.

Thus, electric power or a signal can be supplied to the pixel circuit through the terminal. Accordingly, a novel display panel that is highly convenient or reliable can be provided. Note that a flexible printed circuit FPC1 is electrically connected to the terminal 519B through the anisotropic conductive film ACF1.

The first display element 750(i, j) of the display panel described in this embodiment includes the first electrode 751(i, j), a second electrode 752, and a layer 753 containing a liquid crystal material. The second electrode 752 is positioned such that an electric field which controls the alignment of the liquid crystal material is generated between the first electrode 751(i, j) and the second electrode 752.

The display panel described in this embodiment includes an alignment film AF1 and an alignment film AF2. The alignment film AF2 is disposed such that the layer 753 containing a liquid crystal material is sandwiched between the alignment film AF1 and the alignment film AF2.

The second display element 550(i, j) of the display panel described in this embodiment includes a third electrode 551(i, j), a fourth electrode 552, and a layer 553(j) containing a light-emitting organic compound.

The fourth electrode 552 has a region overlapping with the third electrode 551(i, j). The layer 553(j) containing a light-emitting organic compound is provided between the third electrode 551(i, j) and the fourth electrode 552. The third electrode 551(i, j) is electrically connected to the pixel circuit 530(i, j) in a second connection portion 592.

The pixel 702(i, j) of the display panel described in this embodiment includes a color film CF1, a light-blocking film BM, an insulating film 771, and a functional film 770P.

The color film CF1 has a region overlapping with the first display element 750(i, j). The light-blocking film BM has an opening in the region overlapping with the first display element 750(i, j).

The insulating film 771 is provided between the color film CF1 and the layer 753 containing a liquid crystal material or between the light-blocking film BM and the layer 753 containing a liquid crystal material. Owing to the insulating film 771, unevenness due to the thickness of the color film CF1 can be avoided. Alternatively, impurities can be prevented from being diffused from the light blocking film BM, the color film CF1, or the like to the layer 753 containing a liquid crystal material.

The functional film 770P has a region overlapping with the first display element 750(i, j). The functional film 770P is provided such that a substrate 770 is sandwiched between the functional film 770P and the first display element 750(i, j).

The display panel described in this embodiment includes a substrate 570, the substrate 770, and a functional layer 520.

The substrate 770 has a region overlapping with the substrate 570. The functional layer 520 is provided between the substrate 570 and the substrate 770.

The functional layer 520 includes the pixel circuit 530(i, j) including the switch SW1, the second display element 550(i, j), an insulating film 521, and an insulating film 528.

The insulating film 521 is provided between the pixel circuit 530(i, j) and the second display element 550(i, j).

The insulating film 528 is provided between the insulating film 521 and the substrate 570 and includes an opening in a region overlapping with the second display element 550(i, j). The insulating film 528 formed along the edges of the third electrode 551(i, j) can prevent a short circuit between the third electrode 551(i, j) and the fourth electrode 552.

The display panel described in this embodiment includes a bonding layer 505, a sealant 705, and a structure KB1.

The bonding layer 505 is provided between the functional layer 520 and the substrate 570, and has a function of bonding the functional layer 520 and the substrate 570.

The sealant 705 is provided between the functional layer 520 and the substrate 770, and has a function of bonding the functional layer 520 and the substrate 770.

The structure KB1 has a function of providing a certain space between the functional layer 520 and the substrate 770.

The display panel described in this embodiment includes a terminal 519C, a conductive film 511C, and a conductor CP.

The second insulating film 501C has a region sandwiched between the terminal 519C and the conductive film 511C. A third connection portion 591C is provided in the second insulating film 501C.

The terminal 519C is electrically connected to the conductive film 511C in the third connection portion 591C. The conductive film 511C is electrically connected to the pixel circuit 530(i, j).

The conductor CP is sandwiched between the terminal 519C and the second electrode 752, and electrically connects the terminal 519C and the second electrode 752. For example, a conductive particle can be used as the conductor CP.

The display panel described in this embodiment includes a driver circuit GD, a driver circuit SD_LC, and a driver circuit SD_EL (see FIG. 1A and FIG. 4A).

The driver circuit GD is electrically connected to the scan line G1($i$). The driver circuit GD includes, for example, a transistor MD. Specifically, a transistor including a semiconductor film which can be formed by the same step as a transistor included in the pixel circuit 530($i, j$) can be used as the transistor MD (see FIGS. 2A and 2C).

The driver circuit SD_LC is electrically connected to the signal line S(j) through a transistor M1 (see FIG. 3). The driver circuit SD_LC has a function of outputting a signal for driving the first display element 750. The driver circuit SD_EL is electrically connected to the signal line S(j) through a transistor M2. The driver circuit SD_EL has a function of outputting a signal for driving the second display element 550. Note that a driver circuit SD that has a function of selectively outputting signals for driving the first display element 750 and the second display element 550 may be used instead of the driver circuit SD_LC and the driver circuit SD_EL (see FIG. 5). In FIG. 3, a wiring that connects the driver circuit SD_LC and the transistor M1 is denoted as a wiring DATA_LC, and a wiring that connects the driver circuit SD_EL and the transistor M2 is denoted as a wiring DATA_EL. The driver circuit SD_LC and the driver circuit SD_EL are collectively referred to as a signal line driver circuit.

The driver circuit SD_LC and the driver circuit SD_EL share the same signal line S(j), in which case the number of wirings included in the pixel circuit 530($i, j$) can be reduced. In a layout of the pixel circuit, in order to prevent influence of a potential of the signal line on an electrode of a display element, the signal line and the electrode are preferably provided not to overlap each other. Consequently, the display panel of one embodiment of the present invention can have a high pixel aperture ratio due to a reduced number of wirings included in the pixel circuit 530($i, j$).

A sampling control circuit SAMP_LC is electrically connected to a gate electrode of the transistor M1. The sampling control circuit SAMP_LC has a function of outputting a control signal to the driver circuit SD_LC. The sampling control circuit SAMP_EL is electrically connected to a gate electrode of the transistor M2. The sampling control circuit SAMP_EL has a function of outputting a control signal to the driver circuit SD_EL.

The driver circuit SD_LC and the driver circuit SD_EL are electrically connected to, for example, a terminal that can be formed by the same step as the terminal 519B or the terminal 519C.

Individual components included in the display panel will be described below. Note that these units cannot be clearly distinguished and one unit also serves as another unit or includes part of another unit in some cases.

For example, the first conductive film can be used for the first electrode 751($i, j$). The first conductive film can be used for the reflective film.

The second conductive film can be used as the conductive film 512B that functions as a source electrode or a drain electrode of a transistor.

<<Substrate 570>>

A material having heat resistance high enough to withstand heat treatment in the manufacturing process can be used for the substrate 570. Specifically, non-alkali glass with a thickness of 0.7 mm can be used.

For example, a large-sized glass substrate having any of the following sizes can be used as the substrate 570: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570, an organic material, an inorganic material, a composite material of an organic material and an inorganic material, or the like can be used. For example, an inorganic material such as glass, ceramic, or a metal can be used for the substrate 570.

Specifically, non-alkali glass, soda-lime glass, potash glass, crystal glass, quartz, sapphire, or the like can be used for the substrate 570. Specifically, an inorganic oxide film, an inorganic nitride film, an inorganic oxynitride film, or the like can be used for the substrate 570. For example, a silicon oxide film, a silicon nitride film, a silicon oxynitride film, an aluminum oxide film, or the like can be used for the substrate 570. Stainless steel, aluminum, or the like can be used for the substrate 570.

For example, a single crystal semiconductor substrate or a polycrystalline semiconductor substrate of silicon or silicon carbide, a compound semiconductor substrate of silicon germanium, or an SOI substrate can be used as the substrate 570. Thus, a semiconductor element can be formed over the substrate 570.

An organic material such as a resin, a resin film, or plastic can be used for the substrate 570. Specifically, a resin film or resin plate of polyester, polyolefin, polyamide, polyimide, polycarbonate, an acrylic resin, or the like can be used for the substrate 570.

For example, a composite material, such as a resin film to which a metal plate, a thin glass plate, or an inorganic film is bonded can be used for the substrate 570. For example, a composite material formed by dispersing a fibrous or particulate metal, glass, inorganic material, or the like into a resin film can be used for the substrate 570. For example, a composite material formed by dispersing a fibrous or particulate resin, an organic material, or the like into an inorganic material can be used for the substrate 570.

A single-layer material or a stacked-layer material in which a plurality of layers are stacked can be used for the substrate 570. For example, a stacked-layer material in which a base, an insulating film that prevents diffusion of impurities contained in the base, and the like are stacked can be used for the substrate 570. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the substrate 570. Alternatively, a stacked-layer material in which a resin and a film for preventing diffusion of impurities that penetrate the resin, such as a silicon oxide film, a silicon nitride film, and a silicon oxynitride film are stacked can be used for the substrate 570.

Specifically, a resin film, a resin plate, a stack, or the like of polyester, polyolefin, polyamide, polyimide, polycarbonate, an acrylic resin, or the like can be used for the substrate 570.

Specifically, a material including polyester, polyolefin, polyamide (e.g., nylon or aramid), polyimide, polycarbonate, polyurethane, an acrylic resin, an epoxy resin, a resin having a siloxane bond, such as a silicone resin, or the like can be used for the substrate 570.

Specifically, polyethylene terephthalate (PET), polyethylene naphthalate (PEN), polyethersulfone (PES), acrylic, or the like can be used for the substrate 570.

Alternatively, paper, wood, or the like can be used for the substrate 570.

For example, a flexible substrate can be used as the substrate 570.

Note that as a method for forming the second display element 550(*i, j*) or the like over the substrate 570, a method in which a transistor, a capacitor, or the like is directly formed on a substrate may be employed. Alternatively, a method in which a transistor, a capacitor, or the like is formed over a substrate for use in manufacturing processes which can withstand heat applied in the manufacturing process and is transferred to the substrate 570 can be employed. Thus, a transistor, a capacitor, or the like can be formed over a flexible substrate, for example.

<<Substrate 770>>

A light-transmitting material can be used for the substrate 770, for example. Specifically, a material selected from the materials that can be used for the substrate 570 can be used for the substrate 770. More specifically, non-alkali glass polished to a thickness of approximately 0.7 mm or 0.1 mm can be used.

<<Structure KB1>>

An organic material, an inorganic material, or a composite material of an organic material and an inorganic material can be used for the structure KB1. Thus, a certain gap can be provided between components (e.g., the second electrode 752 and the alignment film AF1) with the structure KB1 sandwiched therebetween.

Specifically, for the structure KB1, polyester, polyolefin, polyamide, polyimide, polycarbonate, polysiloxane, an acrylic resin, or the like, or a composite material of a plurality of resins selected from these can be used. Alternatively, a photosensitive material may be used.

<<Sealant 705>>

An inorganic material, an organic material, a composite material of an inorganic material and an organic material, or the like can be used for the sealant 705 or the like.

For example, an organic material, such as a resin having thermal fusibility or a curable resin, can be used for the sealant 705 or the like.

For example, an organic material, such as a reactive curable adhesive, a light curable adhesive, a thermosetting adhesive, and/or an anaerobic adhesive, can be used for the sealant 705 or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin, or the like can be used for the sealant 705 or the like.

<<Bonding Layer 505>>

For example, a material that can be used for the sealant 705 can be used for the bonding layer 505.

<<Insulating Film 521>>

For example, an insulating inorganic material, an insulating organic material, or an insulating composite material containing an inorganic material and an organic material can be used for the insulating film 521.

Specifically, an inorganic oxide film, an inorganic nitride film, an inorganic oxynitride film, or a material obtained by stacking any of these films can be used for the insulating film 521. For example, a film including any of a silicon oxide film, a silicon nitride film, a silicon oxynitride film, and an aluminum oxide film, or a film including a material stacking any of these films can be used for the insulating film 521.

Specifically, for the insulating film 521, polyester, polyolefin, polyamide, polyimide, polycarbonate, polysiloxane, an acrylic resin, or the like, or a stacked or composite material of a plurality of resins selected from these can be used. Alternatively, a photosensitive material may be used.

Thus, steps due to components overlapping with the insulating film 521, for example, can be covered so that a flat surface can be formed.

<<Insulating Film 528>>

For example, a material that can be used for the insulating film 521 can be used for the insulating film 528. Specifically, a 1-µm-thick film containing polyimide can be used as the insulating film 528.

<<Second Insulating Film 501C>>

For example, a material that can be used for the insulating film 521 can be used for the second insulating film 501C. Specifically, a material containing silicon and oxygen can be used for the second insulating film 501C. Thus, impurity can be prevented from being diffused to the pixel circuit, the second display element, or the like.

For example, a 200-nm-thick film containing silicon, oxygen, and nitrogen can be used as the second insulating film 501C.

Note that the first connection portion 591A, the third connection portion 591B, and the third connection portion 591C are provided in the second insulating film 501C.

<<Wiring, Terminal, Conductive Film>>

A conductive material can be used for wirings and the like. Specifically, a conductive material can be used for the signal line S(j), the scan line G1(*i*), the scan line G2(*i*), the wiring CSCOM, the wiring ANO, the terminal 519B, the terminal 519C, the conductive film 511B, the conductive film 511C, or the like.

For example, an inorganic conductive material, an organic conductive material, a metal material, or a conductive ceramic material can be used for the wirings and the like.

Specifically, a metal element selected from aluminum, gold, platinum, silver, copper, chromium, tantalum, titanium, molybdenum, tungsten, nickel, iron, cobalt, palladium, and manganese can be used for the wirings and the like. Alternatively, an alloy including any of the above-described metal elements, or the like can be used for the wirings and the like. In particular, an alloy of copper and manganese is preferably used in microfabrication using wet etching.

Specifically, the following structures can be used for the wirings and the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like.

Specifically, a conductive oxide, such as indium oxide, indium tin oxide, indium zinc oxide, zinc oxide, or zinc oxide to which gallium is added, can be used for the wirings and the like.

Specifically, a film containing graphene or graphite can be used for the wirings and the like.

A film containing graphene can be formed, for example, by reducing a film containing graphene oxide. Examples of the reducing method include a method with application of heat and a method using a reducing agent.

Specifically, a conductive high molecule can be used for the wirings and the like.

<<First Conductive Film and Second Conductive Film>>

For example, any of the materials used for the wirings and the like can be used for the first conductive film or the second conductive film.

The first electrode 571(i, j), the wiring, or the like can be used for the first conductive film.

The conductive film 512B of a transistor that can be used as the switch SW1, the wiring, or the like can be used as the second conductive film.

<<Pixel Circuit 530(i, j)>>

The pixel circuit 530(i, j) is electrically connected to the signal line S(j), the scan line G1(i), the scan line G2(i), the wiring CSCOM, and the wiring ANO (see FIG. 3).

The pixel circuit 530(i, j) includes the switch SW1, the capacitor C1, the switch SW2, a transistor M, and the capacitor C2.

The switch SW1 is electrically connected to the first display element 750. The switch SW2 is electrically connected to the second display element 550 through the transistor M. The switch SW1 and the switch SW2 are electrically connected to the signal line S(j).

For example, a transistor including a gate electrode electrically connected to the scan line G1(i) and a first electrode electrically connected to the signal line S(j) can be used as the switch SW1.

The capacitor C1 includes a first electrode electrically connected to a second electrode of a transistor used as the switch SW1 and a second electrode electrically connected to the wiring CSCOM.

For example, a transistor including a gate electrode electrically connected to the scan line G2(i) and a first electrode electrically connected to the signal line S(j) can be used as the switch SW2.

The transistor M includes a gate electrode electrically connected to a second electrode of a transistor used as the switch SW2 and a first electrode electrically connected to the wiring ANO.

A transistor in which a semiconductor film is sandwiched between a conductive film and a gate electrode can be used as the transistor M. For example, a conductive film electrically connected to a wiring that can supply a potential the same as that of the gate electrode of the transistor M can be used. The conductive film can be called a second gate electrode of the transistor M.

The capacitor C2 includes a first electrode electrically connected to a second electrode of a transistor used as the switch SW2 and a second electrode electrically connected to a first electrode of the transistor M.

Note that a first electrode of the first display element 750 is electrically connected to the second electrode of the transistor used as the switch SW1, and a second electrode of the first display element 750 is electrically connected to a wiring VCOM1. Thus, the first display element 750 can be driven.

Note that a first electrode of the second display element 550 is electrically connected to a second electrode of the transistor M, and a second electrode of the second display element 550 is electrically connected to a wiring VCOM2. Thus, the second display element 550 can be driven.

<<Switch SW1, Switch SW2, Transistor M, and Transistor MD>>

For example, a bottom gate transistor or a top gate transistor can be used as the switch SW1, the switch SW2, the transistor M, or the transistor MD.

For example, a transistor in which a semiconductor containing a Group 14 element is used for a semiconductor film can be used. Specifically, a semiconductor containing silicon can be used for the semiconductor film. For example, single crystal silicon, polysilicon, microcrystalline silicon, or amorphous silicon can be used for the semiconductor film of the transistor.

For example, a transistor in which an oxide semiconductor is used for a semiconductor film can be used. Specifically, an oxide semiconductor containing indium or an oxide semiconductor containing indium, gallium, and zinc can be used for the semiconductor film.

For example, a transistor having a lower leakage current in an off state than a transistor that uses amorphous silicon for a semiconductor film can be used as the switch SW1, the switch SW2, the transistor M, or the transistor MD. Specifically, a transistor in which an oxide semiconductor is used for a semiconductor film 508 can be used as the switch SW1, the switch SW2, the transistor M, or the transistor MD.

Thus, a pixel circuit including a transistor that uses an oxide semiconductor for a semiconductor film can hold an image signal for a longer time than a pixel circuit including a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the information processing device can be reduced, and power consumption for driving can be reduced.

The transistor that can be used as the switch SW1 includes the semiconductor film 508 and a conductive film 504 having a region overlapping with the semiconductor film 508 (see FIG. 2B). The transistor that can be used as the switch SW1 includes the conductive film 512A and the conductive film 512B.

Note that the conductive film 504 and the insulating film 506 serve as a gate electrode and a gate insulating film, respectively. The conductive film 512A serves as one of a source electrode and a drain electrode, and the conductive film 512B serves as the other.

A transistor in which the semiconductor film 508 is sandwiched between a conductive film 524 and the conductive film 504 can be used as the transistor M (see FIG. 2C).

A conductive film in which a 10-nm-thick film containing tantalum and nitrogen and a 300-nm-thick film containing copper are stacked in this order can be used as the conductive film 504.

A film in which a 400-nm-thick film containing silicon and nitrogen and a 200-nm-thick film containing silicon, oxygen, and nitrogen are stacked can be used as the insulating film 506.

A 25-nm-thick film containing indium, gallium, and zinc can be used as the semiconductor film 508.

A conductive film in which a 50-nm-thick film containing tungsten, a 400-nm-thick film containing aluminum, and a 100-nm-thick film containing titanium are stacked in this order can be used as the conductive film 512A or the conductive film 512B.

<<First Display Element 750(i, j)>>

For example, a display element having a function of controlling transmission or reflection of light can be used as the first display element 750(i, j). For example, a combined structure of a polarizing plate and a liquid crystal element or a MEMS shutter display element can be used. The use of a reflective display element can reduce power consumption of a display panel. Specifically, a reflective liquid crystal display element can be used as the first display element 750(i, j).

A liquid crystal element that can be driven by any of the following driving methods can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by any of the following driving methods can be used: a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, and an advanced super view (ASV) mode.

For example, thermotropic liquid crystal, low-molecular liquid crystal, high-molecular liquid crystal, polymer dispersed liquid crystal, ferroelectric liquid crystal, or antiferroelectric liquid crystal can be used. Alternatively, a liquid crystal material that exhibits a cholesteric phase, a smectic phase, a cubic phase, a chiral nematic phase, an isotropic phase, or the like can be used. Further alternatively, a liquid crystal material that exhibits a blue phase can be used.

<<First Electrode 751(i, j)>>

For example, any of the materials used for the wirings and the like can be used for the first electrode 751(i, j). Specifically, a reflective film can be used for the first electrode 751(i, j).

<<Reflective Film>>

For example, a material that reflects visible light can be used for the reflective film. Specifically, a material containing silver can be used for the reflective film. For example, a material containing silver and palladium or a material containing silver and copper can be used for the reflective film.

The reflective film reflects, for example, light that passes through the layer 753 containing a liquid crystal material. This allows the first display element 750 to serve as a reflective liquid crystal element. A film with an uneven surface can be used for the reflective film, for example. In that case, incident light can be reflected in various directions, and a white image can be displayed.

Note that a structure other than the structure in which the first electrode 751(i, j) is used for the reflective film can be employed. For example, a structure in which the reflective film is provided between the layer 753 containing a liquid crystal material and the first electrode 751(i, j) may be employed. Alternatively, a structure in which a light-transmissive first electrode 751(i, j) is provided between the reflective film and the layer 753 containing a liquid crystal material may be employed.

<<Opening 751H>>

Considering the reflective film for each first display element 750(i, j), the ratio of the total area of the opening 751H to the total area of the non-opening portion is preferably larger than or equal to 0.052 and smaller than or equal to 0.6. If the ratio of the total area of the opening 751H to the total area of the non-opening portion is too large, display performed using the first display element 750(i, j) is dark. If the ratio of the total area of the opening 751H to the total area of the non-opening portion is too small, display performed using the second display element 550(i, j) is dark.

In the case where the first electrode 751(i, j) is used as the reflective film, the area of one opening 751H is larger than or equal to 3 $\mu m^2$ and smaller than or equal to 25 $\mu m^2$. If the area of the opening 751H is too large, an electric field is not uniformly applied to the layer 753 containing a liquid crystal material, which lowers the display performance of the first display element 750. If the area of the opening 751H in the first conductive film is too small, the light extraction efficiency of light emitted from the second display element 550 is reduced.

The opening 751H may have a polygonal shape, a quadrangular shape, an elliptical shape, a circular shape, a cross shape, a stripe shape, a slit-like shape, or a checkered pattern, for example. The opening 751H may be close to the adjacent pixel. The opening 751H is preferably disposed close to another pixel that displays the same color. Thus, a phenomenon in which light emitted from the second display element 550 enters a color film provided in an adjacent pixel (also referred to as crosstalk) can be inhibited.

<<Second Electrode 752>>

For example, a conductive material having a visible-light transmitting property can be used for the second electrode 752.

For example, a conductive oxide, a metal film thin enough to transmit light, or a metal nanowire can be used for the second electrode 752.

Specifically, a conductive oxide containing indium can be used for the second electrode 752. Alternatively, a metal thin film with a thickness greater than or equal to 1 nm and less than or equal to 10 nm can be used for the second electrode 752. Alternatively, a metal nanowire containing silver can be used for the second electrode 752.

Specifically, indium oxide, indium tin oxide, indium zinc oxide, zinc oxide, zinc oxide to which gallium is added, zinc oxide to which aluminum is added, or the like can be used for the second electrode 752.

<<Alignment Films AF1 and AF2>>

For example, a material containing polyimide or the like can be used for the alignment films AF1 and AF2. Specifically, a material that is formed by rubbing treatment or optical alignment technology to be oriented in a certain direction can be used.

For example, a film containing soluble polyimide can be used as the alignment films AF1 and AF2.

<<Color Film CF1>>

A material that transmits light of a certain color can be used for the color film CF1. In that case, the color film CF1 can be used as a color filter, for example.

For example, a material transmitting light of blue, green, red, yellow, or white can be used for the color film CF1.

<<Light-Blocking Film BM>>

A material that interrupts light transmission can be used for the light-blocking film BM, in which case, the light-blocking film BM serves as a black matrix, for example.

<<Insulating Film 771>>

The insulating film 771 can be formed with polyimide, an epoxy resin, an acrylic resin, or the like.

<<Functional Film 770P>>

For example, a polarizing plate, a retardation plate, a diffusing film, an anti-reflection film, a condensing film, or the like can be used as the functional film 770P. Alternatively, a polarizing plate containing a dichromatic pigment can be used for the functional film 770P.

Alternatively, an antistatic film preventing the attachment of a foreign substance, a water repellent film suppressing the attachment of stain, a hard coat film suppressing generation of a scratch in use, or the like can be used for the functional film 770P.

<<Second Display Element 550(*i, j*)>>

A light-emitting element, for example, can be used as the second display element 550(*i, j*). Specifically, an organic electroluminescent element, an inorganic electroluminescent element, a light-emitting diode, or the like can be used for the second display element 550(*i, j*).

For example, a stack formed to emit blue light, a stack formed to emit green light, or a stack formed to emit red light can be used as the layer 553(*j*) containing a light-emitting organic compound.

For example, a belt-shaped stack extended in the column direction along the signal line S(j) can be used as the layer 553(*j*) containing a light-emitting organic compound. A belt-shaped stack which is extended in the column direction along the signal line S(j+1) and emits light of a color different from a color of the light emitted from the layer 553(*j*) containing a light-emitting organic compound can be used as a layer 553(*j*+1) containing a light-emitting organic compound.

For example, a stack formed to emit white light can be used as the layer 553(*j*) containing a light-emitting organic compound and the layer 553(*j*+1) containing a light-emitting organic compound. Specifically, a stack of a layer containing a light-emitting organic compound containing a blue-light-emitting fluorescent material, a layer containing a green-light-emitting material that is other than a fluorescent material, and a layer containing a red-light emitting material that is other than a fluorescent material, or a stack of a layer containing a light-emitting organic material containing a blue-light-emitting fluorescent material and a layer containing a yellow-light-emitting material that is other than a fluorescent material can be used as the layer 553(*j*) containing a light-emitting organic material and the layer 553(*j*+1) containing a light-emitting organic compound.

For example, any of the materials that can be used for the wirings and the like can be used for the third electrode 551(*i, j*) or the fourth electrode 552.

For example, a material having a visible-light transmitting property selected from the materials that can be used for the wirings and the like can be used for the third electrode 551(*i, j*).

Specifically, conductive oxide, indium-containing conductive oxide, indium oxide, indium tin oxide, indium zinc oxide, zinc oxide, zinc oxide to which gallium is added, or the like can be used for the third electrode 551(*i, j*). Alternatively, a metal film thin enough to transmit light can be used as the third electrode 551(*i, j*).

For example, a material that reflects visible light selected from the materials that can be used for the wirings and the like can be used for the fourth electrode 552.

<<Driver Circuit GD>>

Any of a variety of sequential circuits, such as a shift register, can be used as the driver circuit GD. For example, the transistor MD, a capacitor, and the like can be used in the driver circuit GD. Specifically, a transistor including a semiconductor film that can be formed by the same step as the transistor M can be used.

Alternatively, the transistor MD may have a structure different from the structure of the transistor that can be used as the switch SW1. Specifically, a transistor including the conductive film 524 can be used as the transistor MD (see FIG. 2C).

The conductive film 524 is provided such that the semiconductor film 508 is sandwiched between the conductive films 504 and 524. The insulating film 516 is provided between the conductive film 524 and the semiconductor film 508. The insulating film 506 is provided between the semiconductor film 508 and the conductive film 504. For example, the conductive film 524 is electrically connected to a wiring supplying the same potential as that supplied to the conductive film 504.

Note that the transistor MD can have the same structure as the transistor M.

<<Driver Circuits SD_LC and SD_EL>>

For example, an integrated circuit can be used as the driver circuits SD_LC and SD_EL. Specifically, an integrated circuit formed over a silicon substrate can be used as the driver circuits SD_LC and SD_EL.

For example, a chip on glass (COG) method can be used to mount the driver circuits SD_LC and SD_EL on a pad electrically connected to the pixel circuit 530(*i, j*). Specifically, an anisotropic conductive film can be used to mount the integrated circuit on the pad.

Note that the pad can be formed through the same step as the terminal 519B or the terminal 519C.

<Driving Method of Display Panel>

Figure 6:
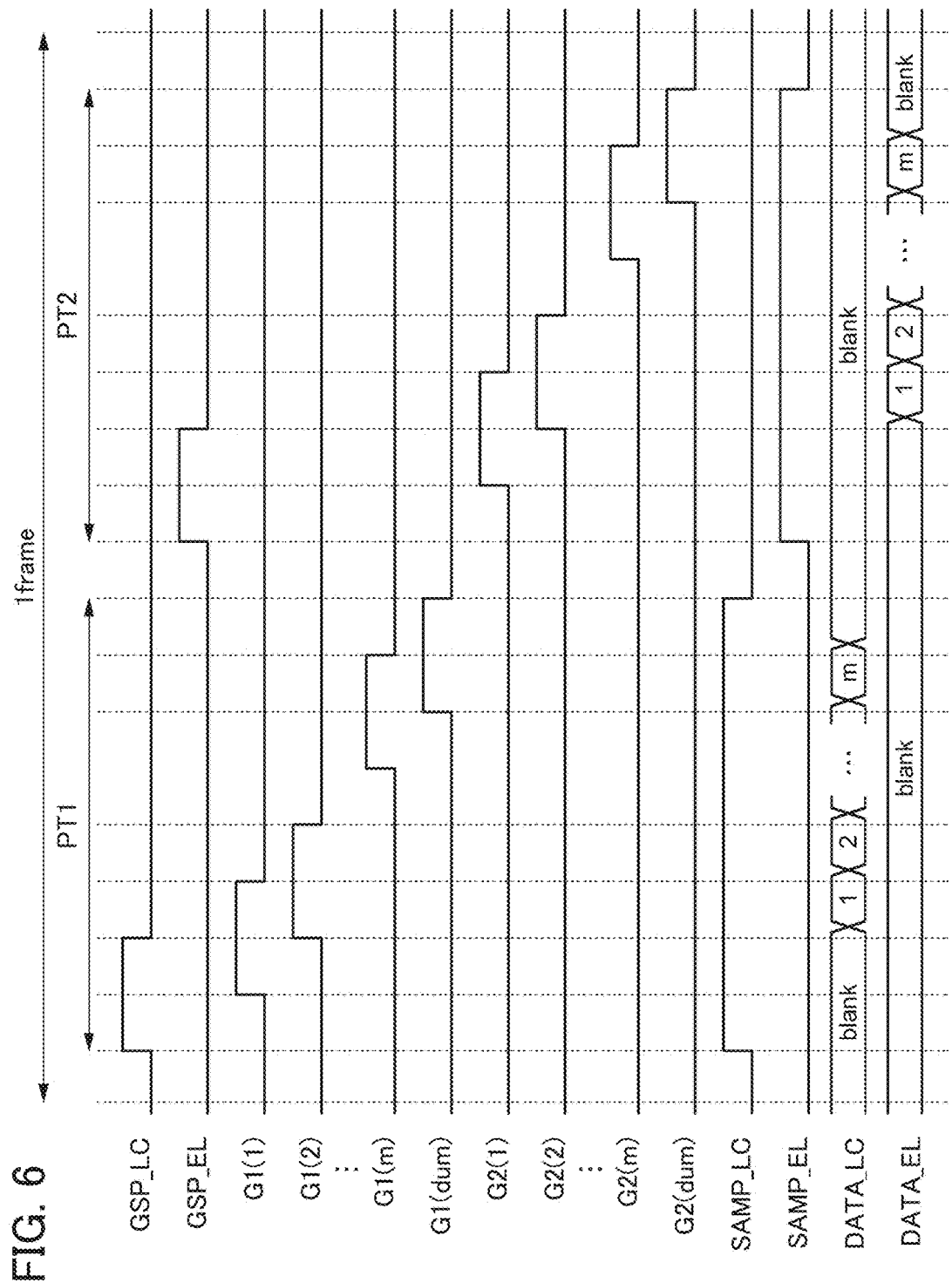
FIG. 6 is a timing chart showing a method for driving a display panel of Embodiment.

Here, a method for driving the display panel of one embodiment of the present invention is described. FIG. 6 is a timing chart showing voltage applied to a wiring or a circuit illustrated in the circuit configuration of FIG. 3. Note that wirings GSP_LC and GSP_EL shown in FIG. 6 have a function of supplying a start pulse signal to the driver circuit GD. Although a scan line G1(*dum*) and a scan line G2(*dum*) are dummy wirings, the display panel of one embodiment of the present invention does not necessarily include a dummy wiring.

One frame period has at least the period PT1 and the period PT2. In the period PT1, the driver circuit SD_LC outputs a signal for driving the first display element 750. In addition, in the period PT1, the transistor M1 is brought into a selected state (an on state) by a sampling signal output by the sampling control circuit SAMP_LC. In the period PT2, the driver circuit SD_EL outputs a signal for driving the second display element 550. In addition, in the period PT2, the transistor M2 is brought into a selected state by the sampling signal output by the sampling control circuit SAMP_EL.

The switch SW1 electrically connected to the first display element 750 of the pixel circuit 530(*i, j*) is in the selected state in an i-th gate selection period in the period PT1, and is in a non-selected state (an off state) in a period other than the i-gate selection period. Then, a (i+1)th gate selection period is provided after the i-th gate selection period in the period PT1. The switch SW2 electrically connected to the second display element 550 of the pixel circuit 530(*i, j*) is in the selected state in an i-th gate selection period in the period PT2, and is in the non-selected state (the off state) in a period other than the i-gate selection period. Then, a (i+1)th gate selection period is provided after the i-th gate selection period in the period PT2. By performing sequential scanning in this manner, all the pixels are sequentially selected in one frame period. Note that in FIG. 6, a first gate selection period, a second gate selection period, and an m-th gate selection period are shown in each of the period PT1 and the period PT2.

The driver circuit SD_LC outputs a data signal for performing display of the first display element 750 in each pixel circuit to the first display element 750 via the wiring DATA_LC while the transistor M1 is in the selected state and the switches SW1 in pixel circuits 530(*i,* 1) to 530(*i, n*) of the i-stage are in the selected state. During the non-selected state of the transistor M1, the potential of the wiring DATA_LC is not particularly limited. The driver circuit SD_EL outputs a data signal for performing display of the second display element 550 in each pixel circuit via the wiring DATA_EL while the transistor M2 is in the selected state and switches SW2 in pixel circuits 530(*i*, 1) to 530(*i, n*) of the i-stage are in the selected state. During the non-selected state of the transistor M2, the potential of the wiring DATA_EL is not particularly limited.

Since the driver circuit SD_LC and the driver circuit SD_EL share the same signal line S(j) and one frame period has the period PT1 in which the first display element 750 is driven and the period PT2 in which the second display element 550 is driven, the display panel 700 including the pixel circuits 530(*i, j*) can perform display.

<Method for Controlling Resistivity of Oxide Semiconductor Film>

The method for controlling the resistivity of an oxide semiconductor film will be described.

An oxide semiconductor film with a certain resistivity can be used as the semiconductor film 508 or the conductive film 524.

For example, a method for controlling the concentration of impurities such as hydrogen and water contained in an oxide semiconductor film and/or the oxygen vacancies in the film can be used as the method for controlling the resistivity of an oxide semiconductor film.

Specifically, plasma treatment can be used as a method for increasing or decreasing the concentration of impurities such as hydrogen and water and/or the oxygen vacancies in the film.

Specifically, plasma treatment using a gas containing one or more kinds selected from a rare gas (He, Ne, Ar, Kr, Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration of greater than or equal to $1\times10^{22}$ atoms/cm$^3$ is formed in contact with the oxide semiconductor film, in which case hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor with a hydrogen concentration measured by secondary ion mass spectrometry (SIMS) of greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$ can be suitably used for the conductive film 524.

On the other hand, an oxide semiconductor with a high resistivity can be used for a semiconductor film where a channel of a transistor is formed. Specifically, such an oxide semiconductor can be suitably used for the semiconductor film 508.

For example, an insulating film containing oxygen, in other words, an insulating film capable of releasing oxygen, is formed in contact with an oxide semiconductor film, and the oxygen is supplied from the insulating film to the oxide semiconductor film, so that oxygen vacancies in the film or at the interface can be filled. Thus, the oxide semiconductor film can have a high resistivity.

For example, a silicon oxide film or a silicon oxynitride film can be used as the insulating film capable of releasing oxygen.

The oxide semiconductor film in which oxygen vacancies are filled and the hydrogen concentration is reduced can be referred to as a highly purified intrinsic oxide semiconductor film or a substantially highly purified intrinsic oxide semiconductor film. The term "substantially intrinsic" refers to the state in which an oxide semiconductor film has a carrier density lower than $8\times10^{11}$/cm$^3$, preferably lower than $1\times10^{11}$/cm$^3$, further preferably lower than $1\times10^{10}$/cm$^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1\times10^6$ μm and a channel length of 10 μm, the off-state current can be lower than or equal to the measurement limit of a semiconductor parameter analyzer, that is, lower than or equal to $1\times10^{-13}$ A, at a voltage (drain voltage) between a source electrode and a drain electrode of from 1 V to 10 V.

The transistor in which a channel region is formed in a highly purified intrinsic or substantially highly purified intrinsic oxide semiconductor film can have a small change in electrical characteristics and high reliability.

Specifically, an oxide semiconductor has a hydrogen concentration which is measured by secondary ion mass spectrometry (SIMS) of lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$ can be favorably used for a semiconductor film where a channel of a transistor is formed.

An oxide semiconductor film that has a higher hydrogen concentration and/or a larger number of oxygen vacancies and that has a lower resistivity than the semiconductor film 508 is used as the conductive film 524.

A film having a hydrogen concentration twice or more, preferably ten times or more that in the semiconductor film 508 can be used as the conductive film 524.

A film having a resistivity greater than or equal to $1×10^{-8}$ times and less than $1×10^{-1}$ times that of the semiconductor film 508 can be used as the conductive film 524.

Specifically, a film having a resistivity higher than or equal to $1×10^{-3}$ Ωcm and lower than $1×10^{4}$ Ωcm, preferably higher than or equal to $1×10^{-3}$ Ωcm and lower than $1×10^{-1}$ Ωcm can be used as the conductive film 524.

<Structure Example 2 of Display Panel>

Another structure of the display panel of one embodiment of the present invention is described below.

FIGS. 7A to 7D illustrate structures of a pixel circuit which can be used for the display panel of one embodiment of the present invention. The pixel circuit illustrated in FIGS. 7A to 7D can be used instead of the pixel circuit 730(i, j) in FIG. 3.

Figure 7A:
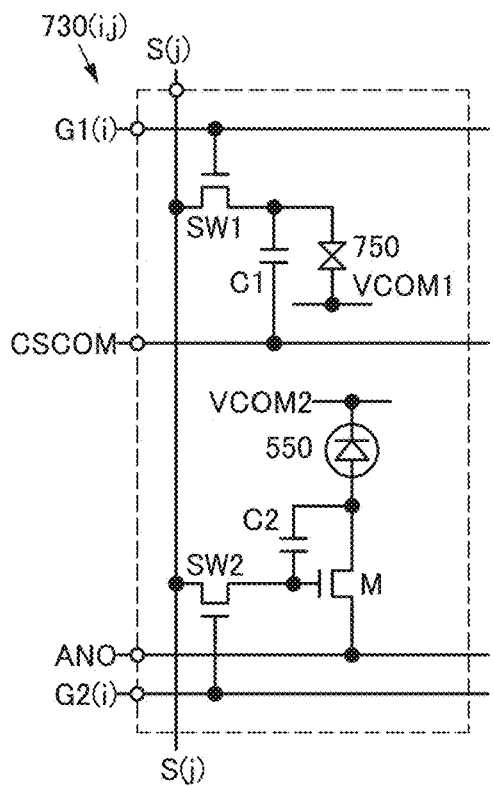
FIGS. 7A to 7D are circuit diagrams each illustrating a pixel circuit of Embodiment.

Note that the pixel circuit 730(i, j) illustrated in FIG. 7A differs from the pixel circuit 730(i, j) illustrated in FIG. 3 in that a second electrode of the capacitor C2 is electrically connected to a second electrode of the transistor M, and that the transistor M does not include a second gate electrode.

Figure 7B:
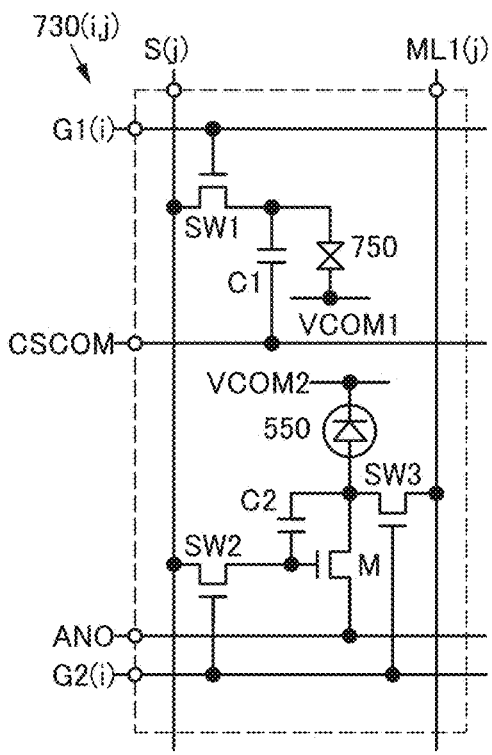

The pixel circuit 730(i, j) illustrated in FIG. 7B differs from the pixel circuit 730(i, j) illustrated in FIG. 7A in that the pixel circuit 730(i, j) is electrically connected to a wiring ML1(j) and includes a switch SW3. A transistor with the same structure as the switch SW2 can be used as the switch SW3. A gate electrode of a transistor used as the switch SW3 is electrically connected to the scan line G2(i), a first electrode thereof is electrically connected to the second electrode of the capacitor C2, and a second electrode thereof is electrically connected to the wiring ML1(j). Note that the wiring ML1(j) serves as a monitor line, for example.

Figure 7C:
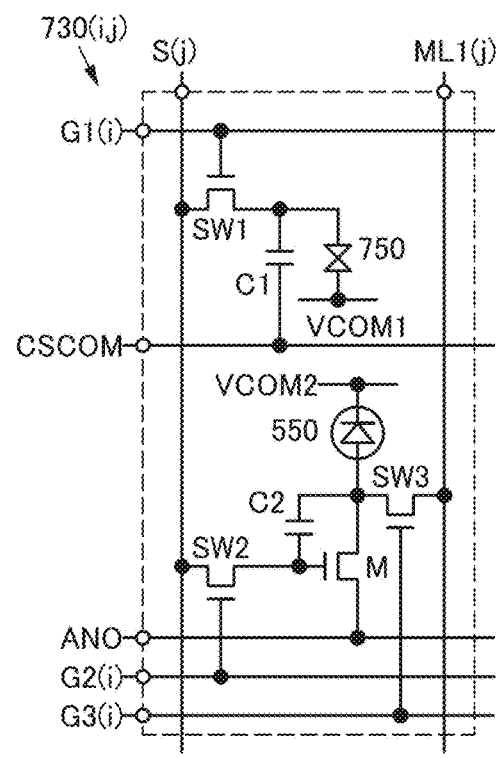

The pixel circuit 730(i, j) illustrated in FIG. 7C differs from the pixel circuit 730(i, j) illustrated in FIG. 7B in that the pixel circuit 730(i, j) is electrically connected to a scan line G3(i) and that the gate electrode of the transistor used as the switch SW3 is electrically connected to the scan line G3(i).

Figure 7D:
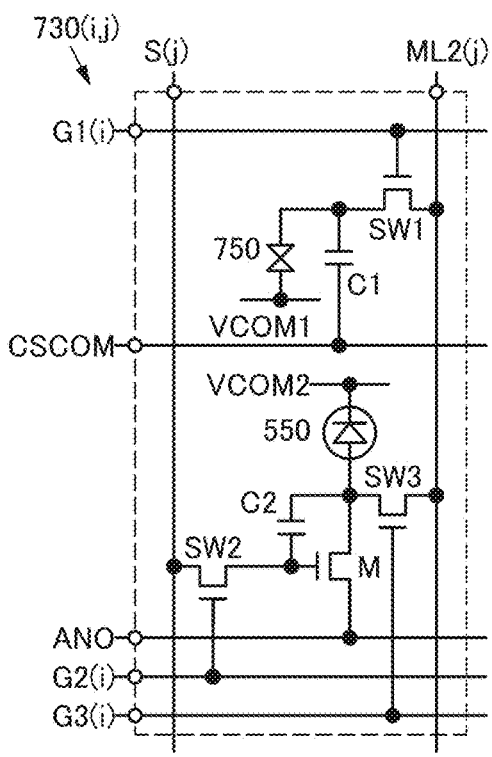

The pixel circuit 730(i, j) illustrated in FIG. 7D differs from the pixel circuit 730(i, j) illustrated in FIG. 7C in that the pixel circuit 730(i, j) is electrically connected to a wiring ML2(j), and that a first electrode of the transistor used as the switch SW1 is electrically connected to the wiring ML2(j). Note that the wiring ML2(j) serves as a signal line and a monitor line, for example. Specifically, when a display panel including the pixel circuit 730(i, j) illustrated in FIG. 7D is driven, the wiring ML2(j) serves as the signal line that transmits a signal for driving the first display element 750 in the period PT1, and serves as the monitor line that transmits a potential held in the capacitor C2 in the period PT2.

<Structure Example 3 of Display Panel>

Figure 8:
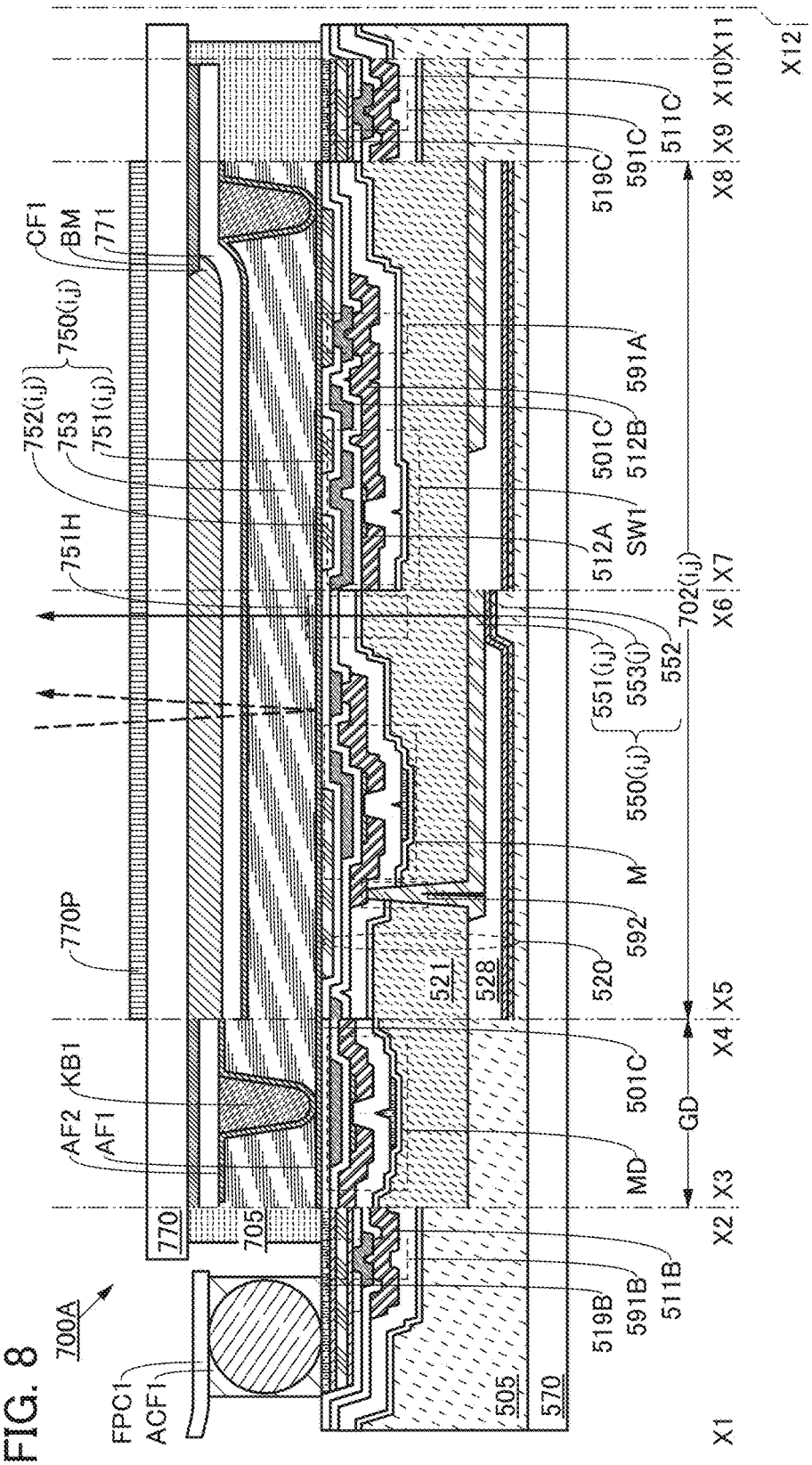
FIG. 8 illustrates a structure of a display panel of Embodiment.

FIG. 8 illustrates the structure of the display panel of one embodiment of the present invention. FIG. 8 is a cross-sectional view of a display panel 700A of one embodiment of the present invention taken along lines X1-X2, X3-X4, X5-X6, X7-X8, X9-X10, and X11-X12 in FIG. 1A.

The display panel 700A illustrated in FIG. 8 differs from the display panel 700 illustrated in FIG. 2A in it includes the first electrode 751(i, j) and the second electrode 752(i, j) embedded in the second insulating film 501C.

Specifically, the display panel 700A includes a liquid crystal display element driven in an IPS mode or the like as the first display element 750.

<Structure Example 4 of Display Panel>

Figure 9:
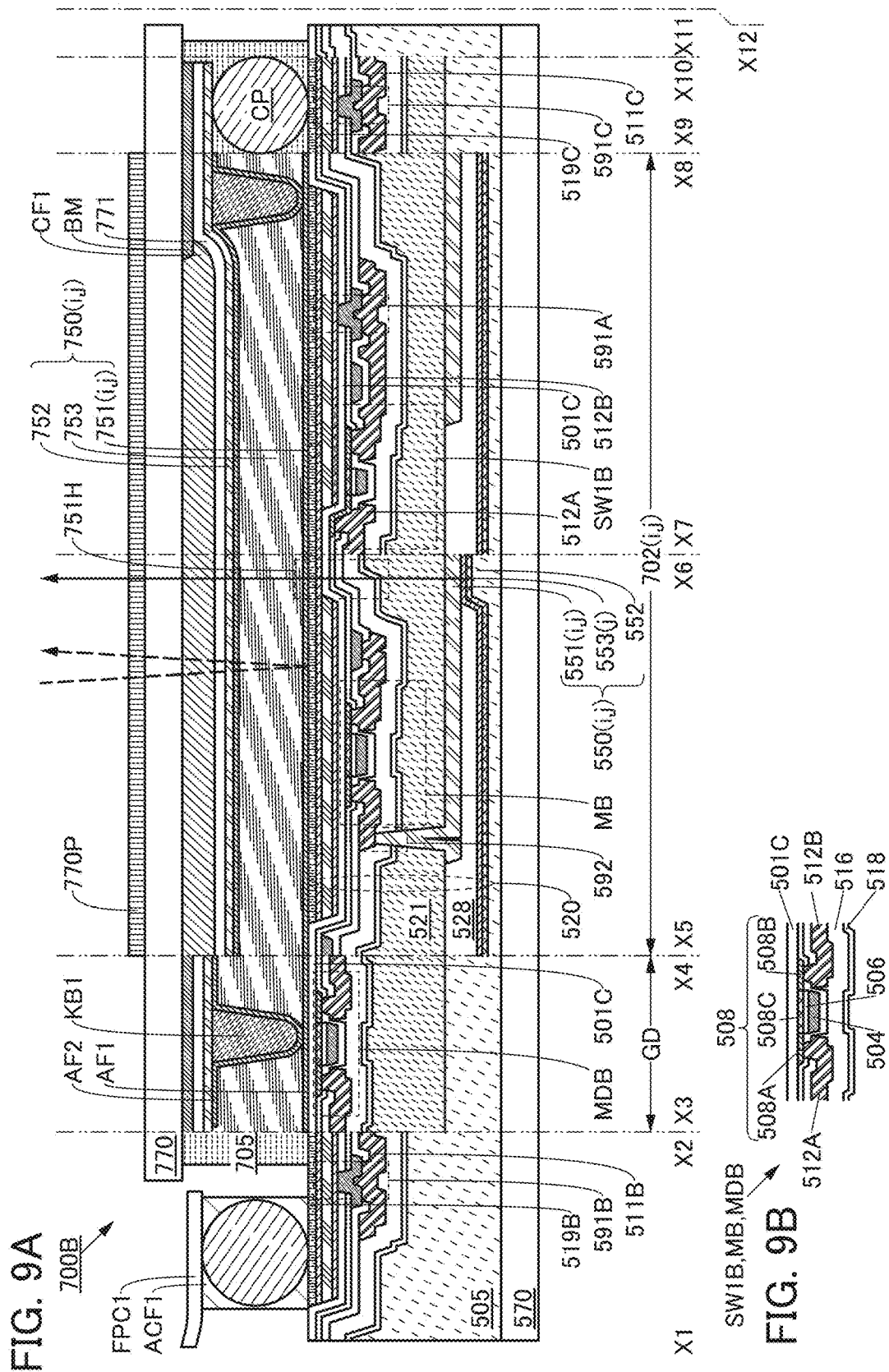
FIGS. 9A and 9B illustrate a structure of a display panel of Embodiment.

FIGS. 9A and 9B illustrate the structure of a display panel 700B of one embodiment of the present invention. FIG. 9A is a cross-sectional view taken along lines X1-X2, X3-X4, X5-X6, X7-X8, X9-X10, and X11-X12 in FIG. 1A. FIG. 9B is a cross-sectional view illustrating part of the structure of the display panel 700B.

The display panel 700B differs from the display panel 700 in FIGS. 2A to 2C in that it includes a top-gate transistor instead of a bottom-gate transistor. Different structures will be described in detail below, and the above description is referred to for the other similar structures.

<<Switch SW1B and Transistors MB and MDB>>

Each of a transistor MB and a transistor MDB, which can be used as a switch SW1B, includes the conductive film 504 having a region overlapping with the second insulating film 501C and the semiconductor film 508 having a region sandwiched between the second insulating film 501C and the conductive film 504. Note that the conductive film 504 serves as a gate electrode (see FIG. 9B).

The semiconductor film 508 has a first region 508A, a second region 508B, and a third region 508C. The first region 508A and the second region 508B do not overlap with the conductive film 504. The third region 508C is positioned between the first region 508A and the second region 508B and overlaps with the conductive film 504.

The transistor MDB includes an insulating film 506 between the third region 508C and the conductive film 504. Note that the insulating film 506 serves as a gate insulating film.

The first region 508A and the second region 508B have a lower resistivity than the third region 508C, and function as a source region and a drain region.

Note that, for example, a method for controlling the resistivity of the oxide semiconductor, which is described in detail in this embodiment, can be used for forming the first region 508A and the second region 508B in the semiconductor film 508. Specifically, plasma treatment using a gas containing a rare gas can be employed.

For example, the conductive film 504 can be a used as a mask. In that case, the third region 508C can be formed in a self-aligned manner using the conductive film 504 as a mask.

The transistor MDB includes the conductive films 512A and 512B which are in contact with the first region 508A and the second region 508B, respectively. The conductive film 512A and the conductive film 512B function as a source electrode and a drain electrode.

A transistor that can be formed by the same step as the transistor MDB can be used as the transistor MB.

This embodiment can be combined with any of the other embodiments in this specification as appropriate.

(Embodiment 2)

In this embodiment, a method for manufacturing a display panel of one embodiment of the present invention will be described with reference to FIG. 10, FIG. 11, FIG. 12, FIG. 13, FIG. 14, FIG. 15, FIG. 16, and FIG. 17.

Figure 10:
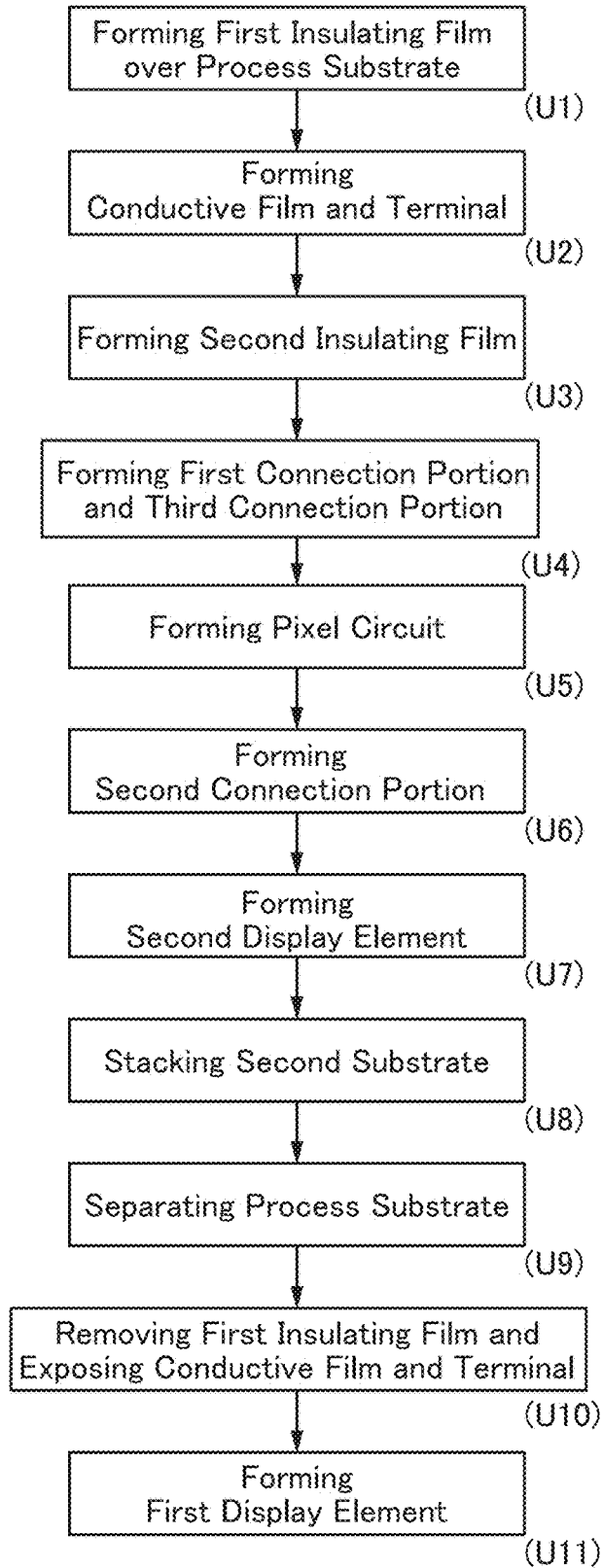
FIG. 10 is a flow chart showing a method for manufacturing a display panel of Embodiment.

FIG. 10 is a flow chart showing a method for manufacturing the display panel 700 of one embodiment of the present invention. FIG. 11 to FIG. 17 are cross-sectional views of the display panel 700 in the manufacturing process taken along lines X1-X2, X3-X4, X5-X6, X7-X8, X9-X10, and X11-X12 in FIG. 2A.

<Method for Manufacturing Display Panel>

The method for manufacturing the display panel 700 described in this embodiment includes the following 11 steps.

<<Step 1>>

In a step 1, the first insulating film 501A is formed over a substrate for use in manufacturing processes (see U1 in FIG. 10). For example, the first insulating film 501A is formed such that a separation film 510W is provided between the insulating film 501A and a substrate 510.

The substrate for use in manufacturing processes can include, for example, the substrate 510 and the separation film 510W having a region overlapping with the substrate 510.

The substrate 510 can be formed using a material having heat resistance high enough to withstand heat treatment in the manufacturing process.

For example, a large-sized glass substrate having any of the following sizes can be used as the substrate 510: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 510, an organic material, an inorganic material, a composite material of an organic material and an inorganic material, or the like can be used. For example, an inorganic material such as glass, ceramic, or metal can be used for the substrate 510.

Specifically, non-alkali glass, soda-lime glass, potash glass, crystal glass, quartz, sapphire, or the like can be used for the substrate 510. Specifically, an inorganic oxide, an inorganic nitride, an inorganic oxynitride, or the like can be used for the substrate 510. For example, a silicon oxide, a silicon nitride, a silicon oxynitride, or an aluminum oxide can be used for the substrate 510. Stainless steel, aluminum, or the like can be used for the substrate 510.

For example, an organic material such as a resin, a resin film, or plastic can be used for the substrate 510. Specifically, a resin film or resin plate of polyester, polyolefin, polyamide, polyimide, polycarbonate, an acrylic resin, or the like can be used for the substrate 510.

For example, a composite material such as a resin film to which a metal plate, a thin glass plate, or a film of an inorganic material or the like is attached can be used for the substrate 510. For example, a composite material formed by dispersing a fibrous or particulate metal, glass, inorganic material, or the like into a resin film can be used for the substrate 510. For example, a composite material formed by dispersing a fibrous or particulate resin, organic material, or the like into an inorganic material can be used for the substrate 510.

A single-layer material or a stacked-layer material in which a plurality of layers are stacked can be used for the substrate 510. For example, a stacked-layer material in which a base, an insulating film that prevents diffusion of impurities contained in the base, and the like are stacked can be used for the substrate 510.

For example, the separation film 510W can be formed using a material that allows the first insulating film 501A to be separated from the substrate 510 in the step 9.

Note that the first insulating film 501A can be separated from the substrate 510 while the separation film 510W remains on the substrate 510 side. Alternatively, the separation film 510W can be separated together with the first insulating film 501A from the substrate 510.

Specifically, the first insulating film 501A can be separated from the substrate 510 while the separation film 510W remains on the substrate 510 side in the case where the substrate 510, the separation film 510W, and the first insulating film 501A are formed using a non-alkali glass substrate, a film containing tungsten or the like, and a film containing inorganic oxide or inorganic oxynitride, respectively.

The separation film 510W can be separated together with the first insulating film 501A from the substrate 510 when the substrate 510, the separation film 510W, and the first insulating film 501A are formed using a non-alkali glass substrate, a film containing polyimide, and a film containing various materials, respectively.

For example, the first insulating film 501A is formed in contact with the separation film 510W. Specifically, a chemical vapor deposition method, a sputtering method, a coating method, or the like can be employed. Then, unnecessary portions are removed by a photolithography process or the like, so that the first insulating film 501A is completed.

Note that it is preferable that the first insulating film 501A be larger than the separation film 510W so that the peripheral portion of the first insulating film 501A is in contact with the substrate 510, in which case occurrence of unintended separation of the first insulating film 501A from the substrate for use in manufacturing processes can be reduced.

Specifically, a 0.7-mm-thick glass plate is used as the substrate 510, and a stacked-layer material in which a 200-nm-thick silicon oxynitride film and a 30-nm-thick tungsten film are stacked in this order from the substrate 510 side is used for the separation film 510W. In addition, a film including a stacked-layer material in which a 600-nm-thick silicon oxynitride film and a 200-nm-thick silicon nitride film are stacked in this order from the separation film 510W side can be used for the first insulating film 501A. Note that a silicon oxynitride film refers to a film that includes more oxygen than nitrogen, and a silicon nitride oxide film refers to a film that includes more nitrogen than oxygen.

Specifically, instead of the first insulating film 501A, a film including a stacked-layer material in which a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film are stacked in this order from the separation film 510W side can be used.

<<Step 2>>

In a step 2, a conductive film and a terminal are formed (see U2 in FIG. 10). Note that in this embodiment, an example in which the conductive film has a stacked structure of a transparent conductive film and a reflective film, the first electrode 751(*i, j*) is used as the transparent conductive film, and the electrode 751A(i, j) is used as the reflective film is described.

The reflective film includes the opening 751H. The terminals include the terminals 519B and 519C.

For example, a film containing a conductive material is formed in contact with the first insulating film 501A. Specifically, a chemical vapor deposition method, a sputtering method, a coating method, or the like can be employed. Then, unnecessary portions are removed by a photolithography process or the like, so that the first electrode 751 used as the reflective film and the terminals 519B and 519C are completed.

<<Step 3>>

In a step 3, the second insulating film 501C covering the conductive film and the terminal is formed (see U3 in FIG. 10). Note that a third insulating film having a region overlapping with the second insulating film 501C may be formed successively after the second insulating film 501C is formed.

The second insulating film 501C includes an opening.

For example, a film having a function of preventing impurity diffusion is formed to cover the reflective film and the terminal. Specifically, a chemical vapor deposition method, a sputtering method, a coating method, or the like can be employed.

Then, an opening reaching the electrode 751A and an opening reaching the terminals 519B and 519C are formed by a photolithography process or the like, so that the second insulating film 501C is completed.

<<Step 4>>

Figure 11:
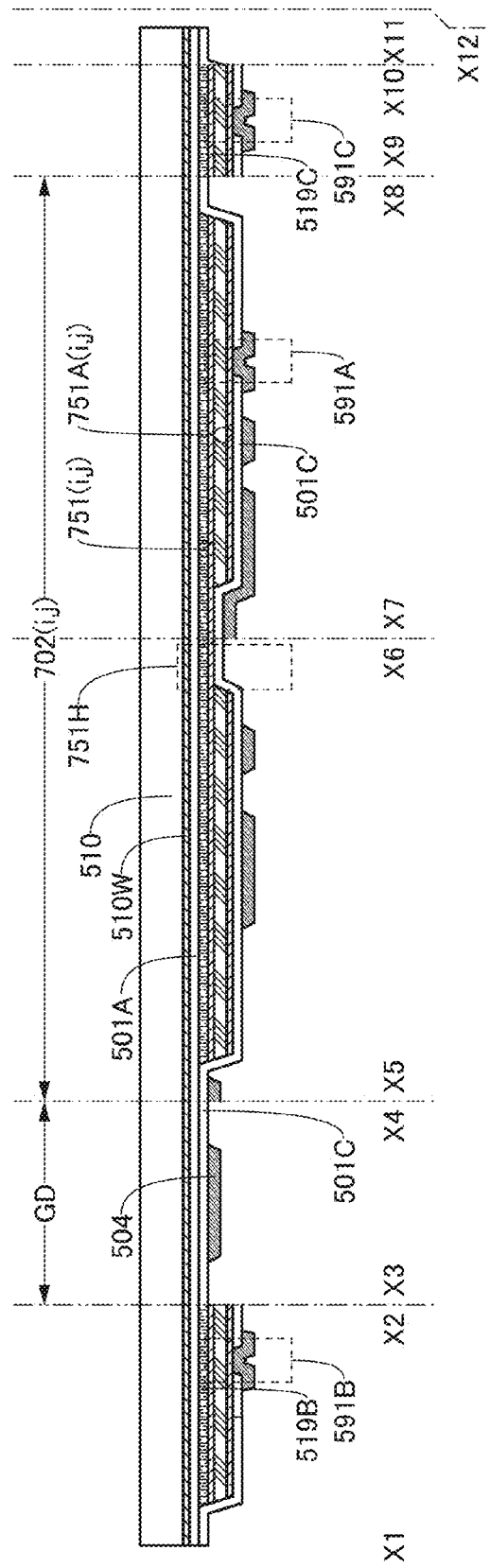
FIG. 11 illustrates a method for manufacturing a display panel of Embodiment.

In a step 4, the first connection portion 591A and the third connection portions 591B and 591C are formed (see U4 in FIG. 10 and FIG. 11). The reflective film is electrically connected to the first connection portion 591A. The terminals 519B and 519C are electrically connected to the third connection portions 591B and 591C. Note that the conductive film 504 serving as a gate electrode of the transistor M, the transistor MD, or the transistor that can be used as the switch SW1 may be formed together with the first connection portion 591A and the terminals 519B and 519C.

A film containing a conductive material is formed to be in contact with the second insulating film 501C, the opening reaching the electrode 751A, and the opening reaching the terminals 519B and 519C. Specifically, a chemical vapor deposition method, a sputtering method, a coating method, or the like can be employed.

Then, unnecessary portions are removed by a photolithography process or the like, so that the first connection portion 591A, third connection portions 593B and 593C, and the conductive film 504 are completed.

<<Step 5>>

In a step 5, a pixel circuit electrically connected to the first connection 591 and the third connection portion 593 is formed (see U5 in FIG. 10).

A film containing a conductive material, a film containing an insulating material, a film containing a semiconductor material, and the like are formed by a chemical vapor deposition method, a sputtering method, or the like. Then, unnecessary portions of the films are removed by a photolithography process or the like. With combination of a deposition method and a photolithography process or the like, the pixel circuit including the transistor M, the transistor MD, the transistor serving as the switch SW1, and the like is completed.

Next, the insulating films 516 and 518 protecting elements, such as transistors, of the pixel circuit are formed. Furthermore, the conductive film 524 serving as a second gate electrode is formed between the insulating films 516 and 518.

Then, the insulating film 521 is formed. An opening reaching the pixel circuit is formed in the insulating films 516, 518, and 521.

<<Step 6>>

Figure 12:
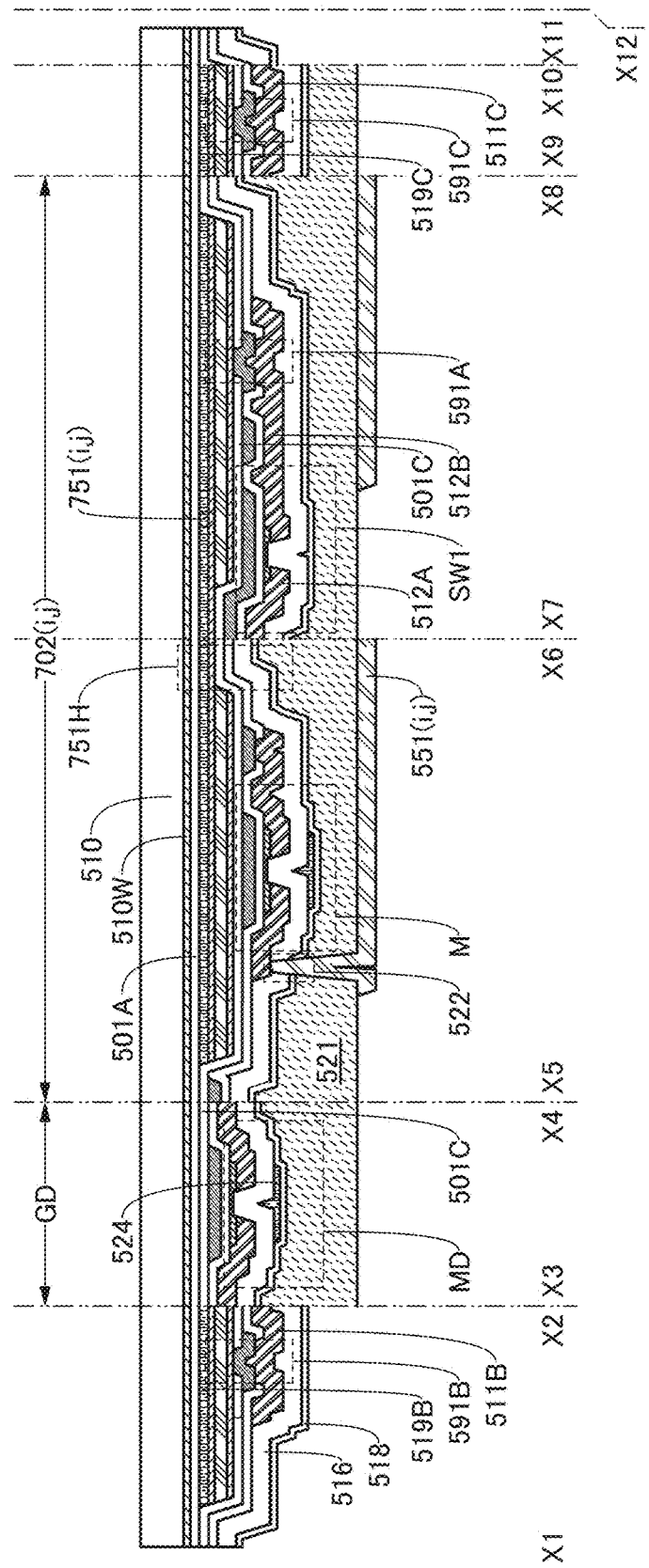
FIG. 12 illustrates a method for manufacturing a display panel of Embodiment.

In a step 6, the second connection portion 592 electrically connected to the pixel circuit is formed (see U6 in FIG. 10 and FIG. 12). Note that a wiring may be formed together with the second connection portion 592.

For example, a film containing a conductive material is formed. Specifically, a chemical vapor deposition method, a sputtering method, a coating method, or the like can be employed.

Then, unnecessary portions of the films are removed by a photolithography process or the like to form the second connection portion 592.

<<Step 7>>

Figure 13:
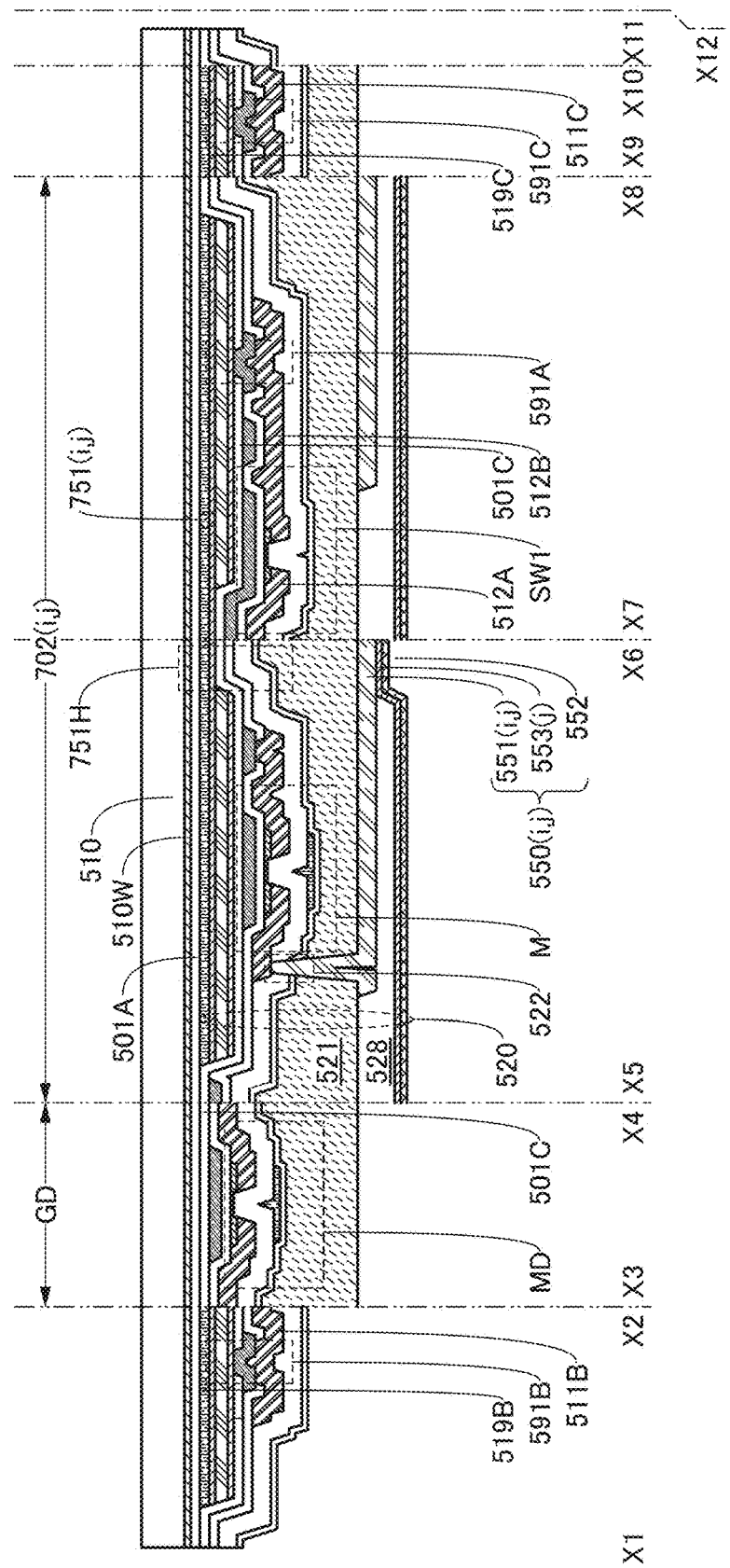
FIG. 13 illustrates a method for manufacturing a display panel of Embodiment.

In a step 7, the second display element 550 electrically connected to the second connection portion 592 is formed (see U7 in FIG. 10 and FIG. 13).

The third electrode 551(i, j) is formed to be electrically connected to the second connection portion 592. For example, a film containing a conductive material is formed. Specifically, a chemical vapor deposition method, a sputtering method, or the like can be employed. Then, unnecessary portions are removed by a photolithography process or the like, so that the third electrode 551(i, j) is completed.

Next, the insulating film 528 having an opening in a region overlapping with the third electrode 551(i, j) is formed. Note that the ends of the third electrode 551(i, j) are covered with the insulating film 528. For example, a photosensitive polymer film is formed. Specifically, a coating method or the like can be employed. Then, unnecessary portions are removed by a photolithography process or the like, so that the insulating film 528 is completed.

Then, a layer 553(j) containing a light-emitting organic compound is formed to cover the third electrode 551(i, j) exposed in the opening of the insulating film 528. Specifically, an evaporation method, a printing method, an ink-jet method, or the like using a shadow mask can be used.

Then, the fourth electrode 552 is formed such that the layer 553(j) containing a light-emitting organic compound is sandwiched between the third electrode 551(i, j) and the fourth electrode 552. Specifically, an evaporation method, a sputtering method, or the like using a shadow mask can be used.

<<Step 8>>

Figure 14:
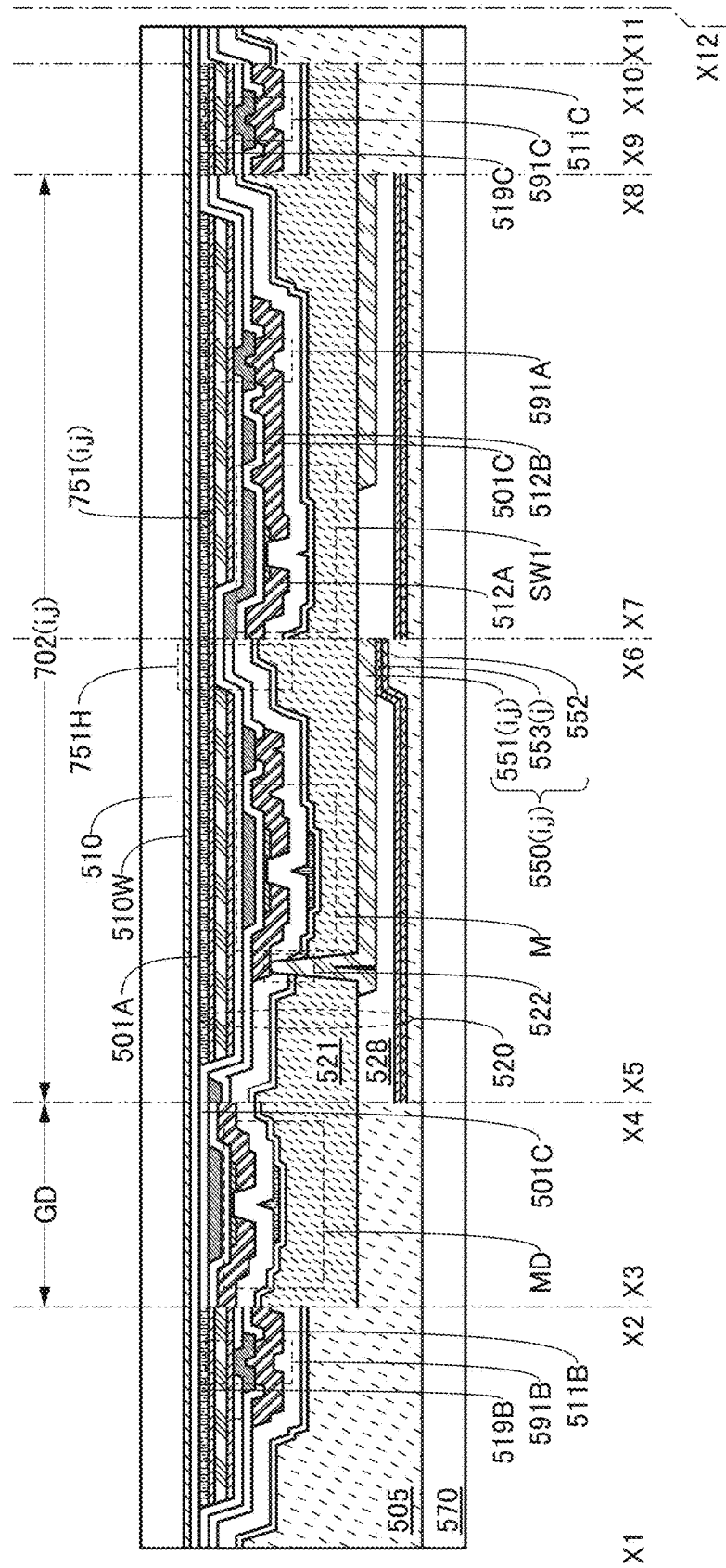
FIG. 14 illustrates a method for manufacturing a display panel of Embodiment.

In a step 8, the substrate 570 is stacked (see U8 in FIG. 10 and FIG. 14).

A fluid resin or the like is applied to form the bonding layer 505. Specifically, a coating method, a printing method, an ink-jet method, or the like can be used. Alternatively, a sheet-like fluid resin or the like is bonded to form the bonding layer 505.

Then, the functional layer 520 and the substrate 570 are bonded using the bonding layer 505.

<<Step 9>>

Figure 15:
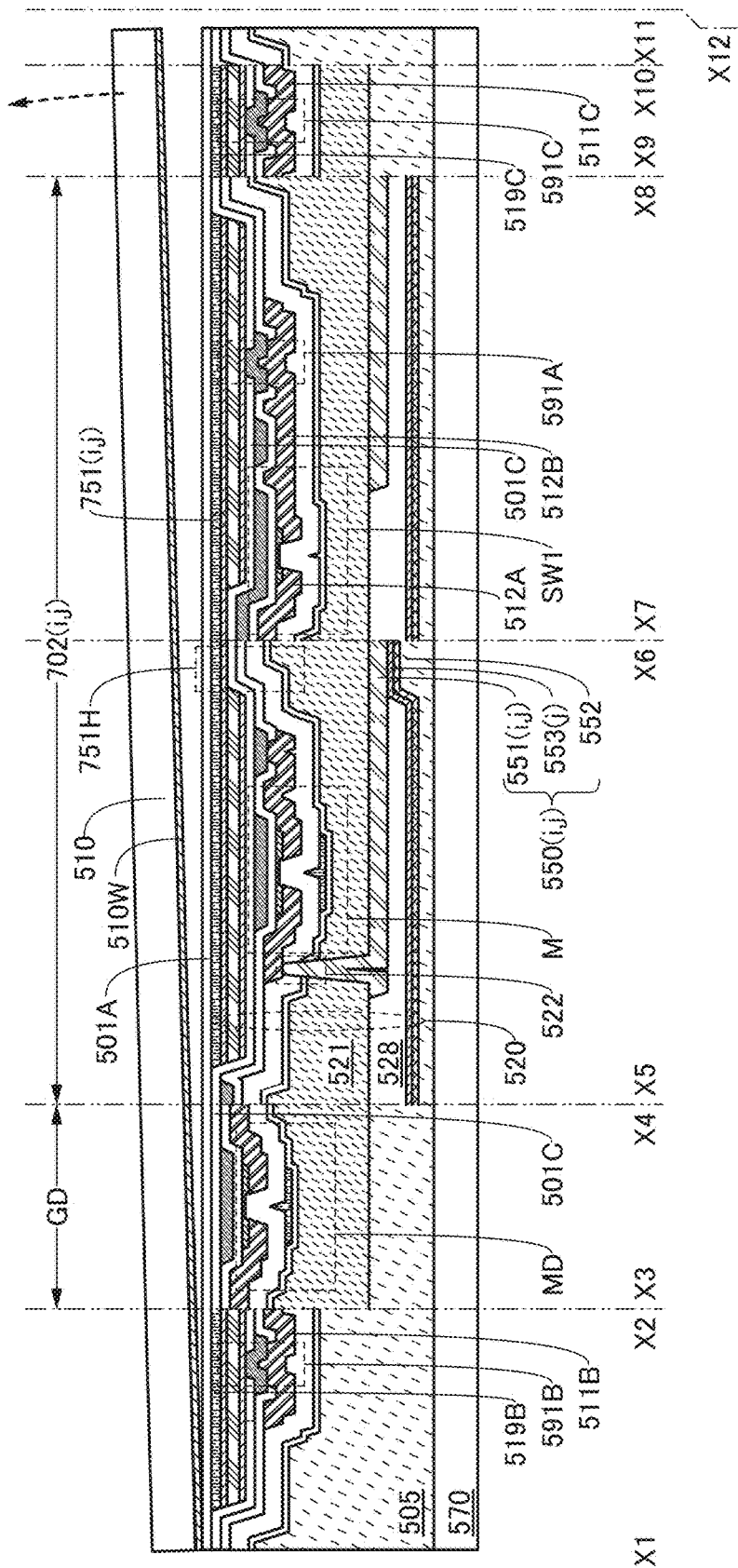
FIG. 15 illustrates a method for manufacturing a display panel of Embodiment.

In a step 9, the substrate 510 for use in manufacturing processes is separated (see U9 in FIG. 10 and FIG. 15).

For example, part of the separation film 510W is separated from the first insulating film 501A by sticking a sharp tip into the separation film 510W from the substrate 510 for use in manufacturing processes, by a method using a laser (e.g., a laser ablation method), or the like, whereby a separation starting point can be formed.

Then, the substrate 510 for use in manufacturing processes is gradually separated from the separation starting point.

Note that the separation may be performed while the vicinity of the interface between the separation film 510W and the first insulating film 501A is irradiated with ions to remove static electricity. Specifically, the ions may be generated by an ionizer. Alternatively, a liquid may be ejected and sprayed from a nozzle to the interface between the separation film 510W and the first insulating film 501A. For example, as the liquid to be injected or the liquid to be sprayed, water, a polar solvent, or a liquid that dissolves the separation film 510W can be used. By injecting such a liquid, influence of static electricity and the like accompanying the separation can be reduced.

Particularly in the case where a film containing tungsten oxide is used for the separation film 510W, the substrate 510 is separated while a water-containing liquid is injected or sprayed, which leads to a reduction in stress caused by separation.

<<Step 10>>

Figure 16:
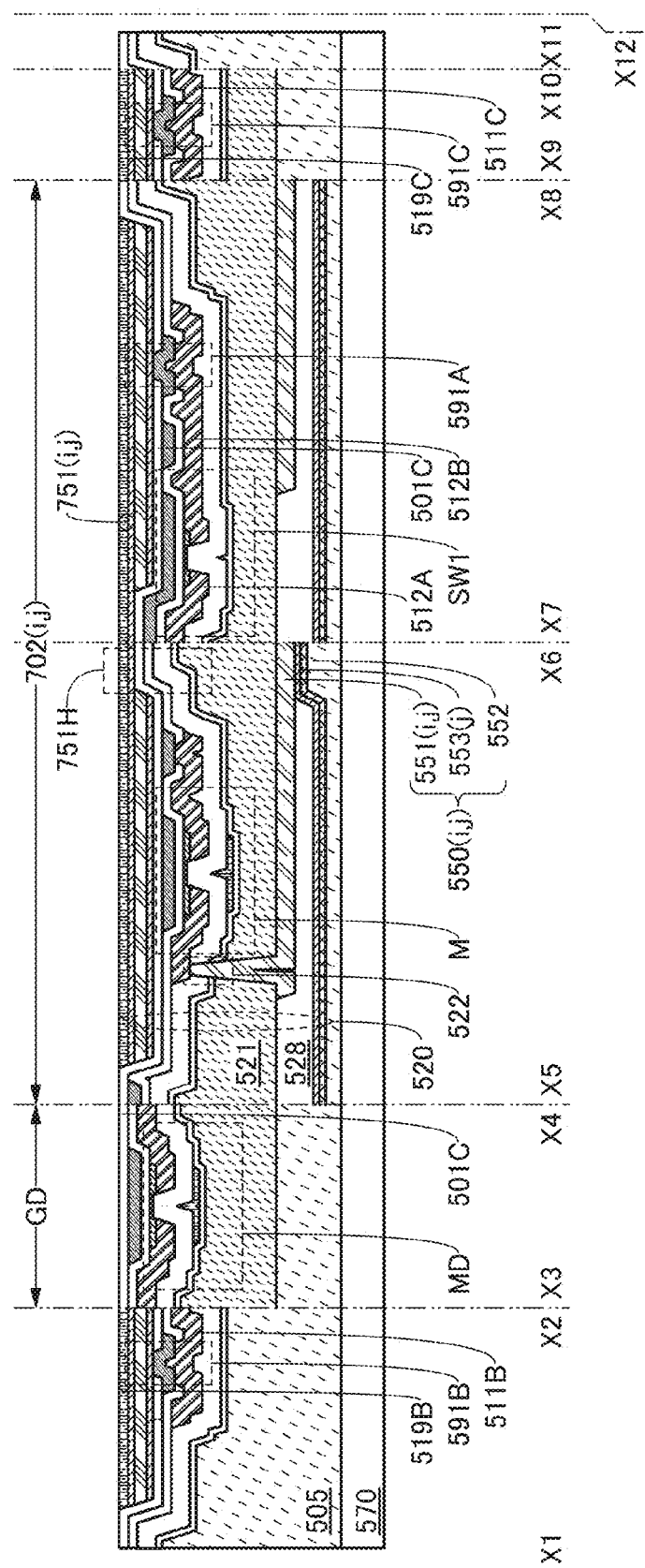
FIG. 16 illustrates a method for manufacturing a display panel of Embodiment.

In a step 10, the first insulating film 501A is removed to expose the reflective film and the terminal (see U10 in FIG. 10 and FIG. 16).

For example, the first insulating film 501A can be removed by etching or chemical mechanical polishing. Specifically, a wet etching method, a dry etching method, or the like can be used.

<<Step 11>>

Figure 17:
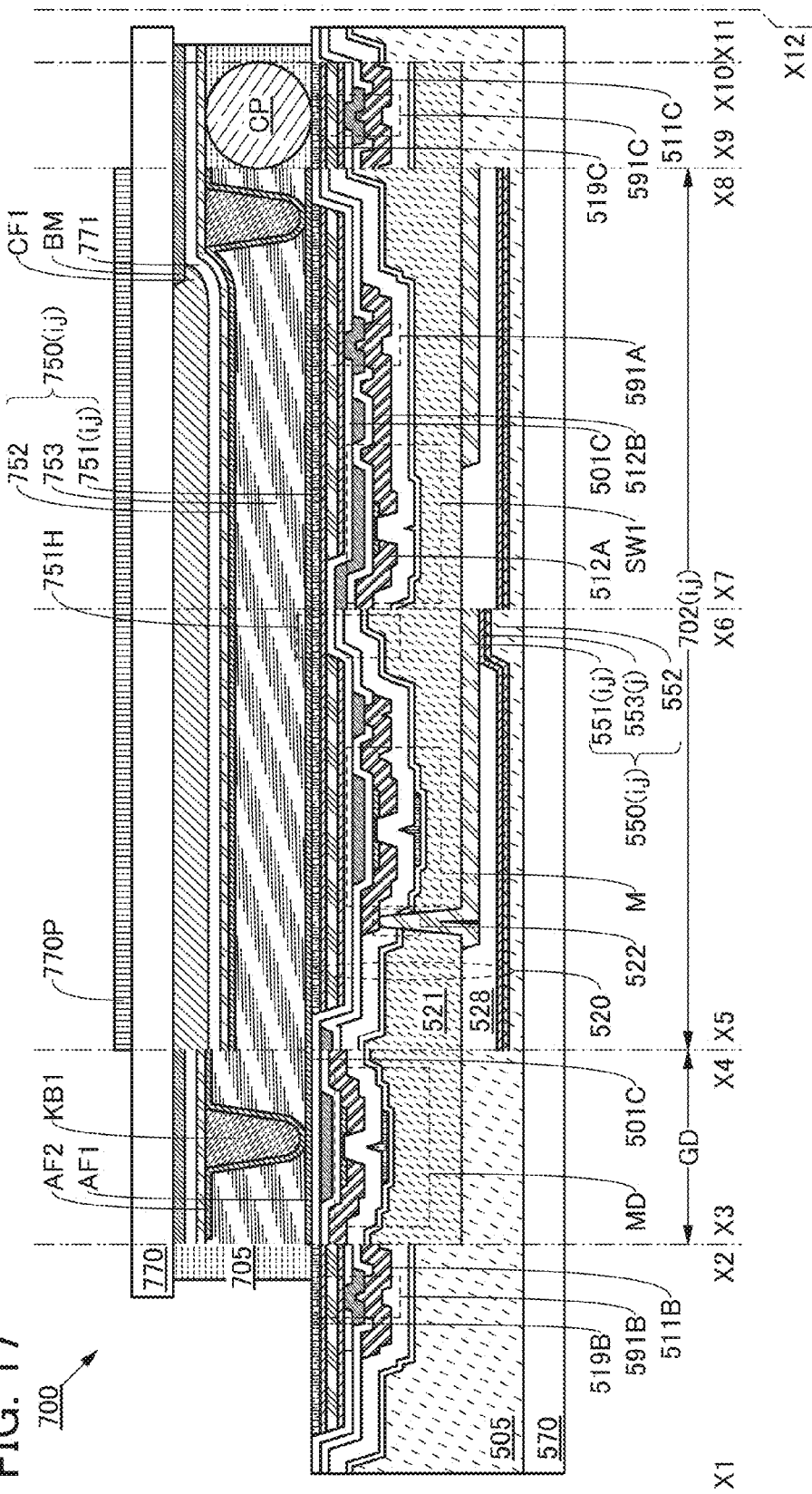
FIG. 17 illustrates a method for manufacturing a display panel of Embodiment.

In a step 11, the first display element is formed (see U11 in FIG. 10 and FIG. 17).

A counter substrate is prepared. Specifically, the substrate 770 including the light blocking film BM, the color film CF1, the insulating film 771, the second electrode 752, the structure KB1, and the alignment film AF2 is prepared as the counter substrate.

Next, the alignment film AF1 having a region overlapping with the second insulating film 501C and the first electrode 751(i, j) is formed. Specifically, the alignment film AF1 is formed by a printing method, a rubbing method, or the like.

The sealant 705 is formed. Specifically, a fluid resin is applied to form a frame-like shape using a dispensing method, a printing method, or the like. Note that a material containing the conductive member CP is applied to a region of the sealant 705 overlapping with the terminal 519C.

Next, a liquid crystal material is dropped into a region surrounded by the frame-shaped sealant 705. Specifically, a dispenser method or the like is used.

Then, the substrate 770 is bonded to the second insulating film 501C using the sealant 705. Note that the structure KB1 is provided between the second insulating film 501C and the substrate 770 to electrically connect the terminal 519C and the second electrode 752 using the conductive member CP.

The method for manufacturing the display panel 700 in this embodiment includes the step of separating the substrate 510 for use in manufacturing processes and the step of removing the first insulating film 501A to expose the reflective film and the terminal. Accordingly, a step at the edge of the reflective film can be minimized to reduce the possibility of alignment defects due to the step. In addition, the surface of the terminal at which contact with other components is made can be exposed. Thus, a method for manufacturing a novel display panel that is highly convenient or reliable can be provided.

This embodiment can be combined with any of the other embodiments in this specification as appropriate.

(Embodiment 3)

In this embodiment, the structure of a transistor which can be used for the display panel of one embodiment of the present invention will be described with reference to FIGS. 18A to 18D.

<Structural Example of Semiconductor Device>

Figure 18A:
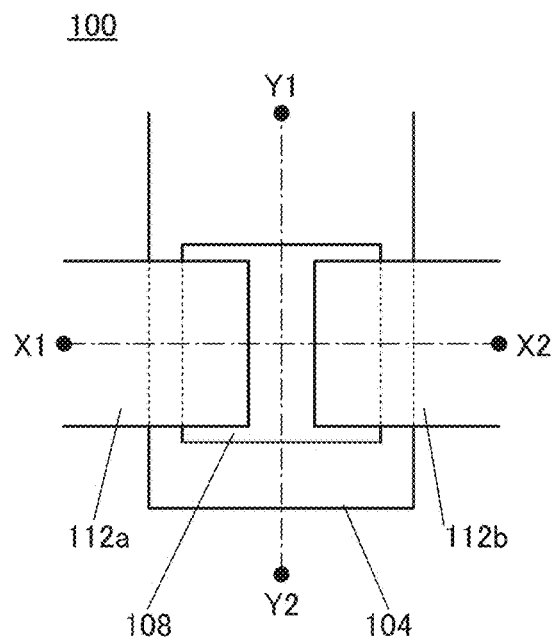
FIGS. 18A to 18D illustrate a structure of a transistor of Embodiment.

FIG. 18A is a top view of the transistor 100. FIG. 18C is a cross-sectional view taken along the section line X1-X2 in FIG. 18A, and FIG. 18D is a cross-sectional view taken along the section line Y1-Y2 in FIG. 18A. Note that in FIG. 18A, some components of the transistor 100 (e.g., an insulating film serving as a gate insulating film) are not illustrated to avoid complexity. In some cases, the direction of the section line Y1-Y2 is referred to as a channel length direction and the direction of the section line X1-X2 is referred to as a channel width direction. As in FIG. 18A, some components might not be illustrated in some top views of transistors described below.

Note that the transistor 100 can be used in the display panel described in Embodiment 1.

For example, when the transistor 100 is used as the transistor M, a substrate 102, a conductive film 104, a stacked film of an insulating film 106 and an insulating film 107, an oxide semiconductor film 108, a conductive film 112a, a conductive film 112b, a stacked film of an insulating film 114 and an insulating film 116, and an insulating film 118 can be referred to as the second insulating film 501C, the conductive film 504, the insulating film 506, the semiconductor film 508, the conductive film 512A, the conductive film 512B, an insulating film 516, and the insulating film 518, respectively.

The transistor 100 includes a conductive film 104 functioning as a gate electrode over a substrate 102, an insulating film 106 over the substrate 102 and the conductive film 104, an insulating film 107 over the insulating film 106, an oxide semiconductor film 108 over the insulating film 107, and conductive films 112a and 112b functioning as source and drain electrodes electrically connected to the oxide semiconductor film 108. Over the transistor 100, specifically, over the conductive films 112a and 112b and the oxide semiconductor film 108, insulating films 114, 116, and 118 are provided. The insulating films 114, 116, and 118 function as protective insulating films for the transistor 100.

The oxide semiconductor film 108 includes a first oxide semiconductor film 108a on the conductive film 104 side and a second oxide semiconductor film 108b over the first oxide semiconductor film 108a. Furthermore, the insulating films 106 and 107 function as gate insulating films of the transistor 100.

An In-M oxide (M is Ti, Ga, Sn, Y, Zr, La, Ce, Nd, or Hf) or an In-M-Zn oxide can be used for the oxide semiconductor film 108. It is particularly preferable to use an In-M-Zn oxide for the semiconductor film 108.

The first oxide semiconductor film 108a includes a first region in which the atomic proportion of In is larger than the atomic proportion of M The second oxide semiconductor film 108b includes a second region in which the atomic proportion of In is smaller than that in the first oxide semiconductor film 108a. The second region include a portion thinner than the first region.

The first oxide semiconductor film 108a including the first region in which the atomic proportion of In is larger than that of M can increase the field-effect mobility (also simply referred to as mobility or μFE) of the transistor 100. Specifically, the field-effect mobility of the transistor 100 can exceed 10 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the first oxide semiconductor film 108a including the first region in which the atomic proportion of In is larger than that of M makes it easier to change electrical characteristics of the transistor 100 in light irradiation. However, in the semiconductor device of one embodiment of the present invention, the second oxide semiconductor film 108b is formed over the first oxide semiconductor film 108a. In addition, the thickness of a portion including a channel region and the vicinity of the channel region in the second oxide semiconductor film 108b is smaller than the thickness of the first oxide semiconductor film 108a.

Furthermore, the second oxide semiconductor film 108b includes the second region in which the atomic proportion of In is smaller than the first oxide semiconductor film 108a and thus has larger Eg than that of the first oxide semiconductor film 108a. For this reason, the oxide semiconductor film 108 which is a layered structure of the first oxide semiconductor film 108a and the second oxide semiconductor film 108b has high resistance to a negative bias stress test with light irradiation.

The amount of light absorbed by the oxide semiconductor film 108 can be reduced during light irradiation. As a result, the change in electrical characteristics of the transistor 100 due to light irradiation can be reduced. In the semiconductor device of one embodiment of the present invention, the insulating film 114 or the insulating film 116 includes excess oxygen. This structure can further reduce the change in electrical characteristics of the transistor 100 due to light irradiation.

Here, the oxide semiconductor film 108 is described in detail with reference to FIG. 18B.

Figure 18B:
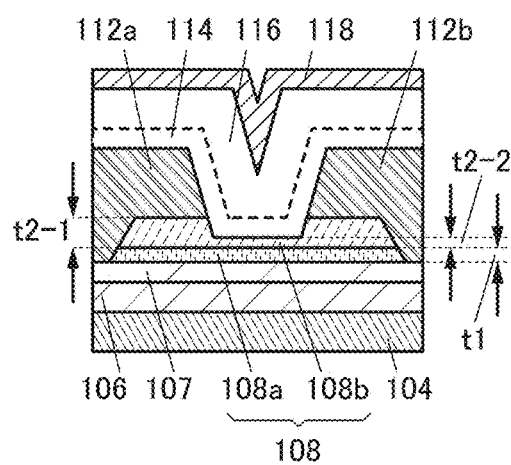
Figure 18C:
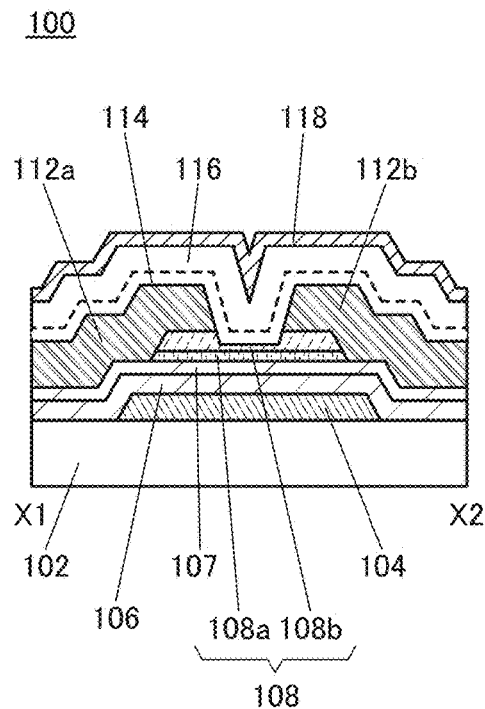
Figure 18D:
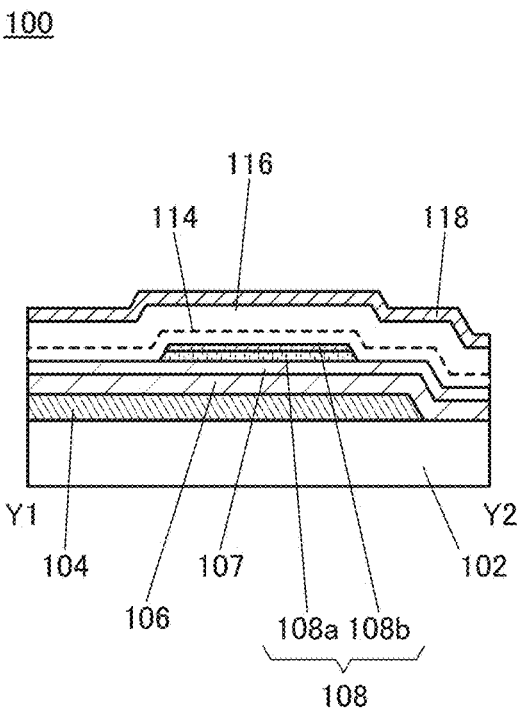

FIG. 18B is a cross-sectional enlarged view of the oxide semiconductor film 108 and the vicinity thereof in the transistor 100 illustrated in FIG. 18C.

In FIG. 18B, t1, t2-1, and t2-2 denote a thickness of the first oxide semiconductor film 108a, one thickness of the second oxide semiconductor film 108b, and the other thickness of the second oxide semiconductor film 108b, respectively. The second oxide semiconductor film 108b over the first oxide semiconductor film 108a prevents the first oxide semiconductor film 108a from being exposed to an etching gas, an etchant, or the like when the conductive films 112a and 112b are formed. This is why the first oxide semiconductor film 108a is not or is hardly reduced in thickness. In contrast, in the second oxide semiconductor film 108b, a portion not overlapping with the conductive films 112a and 112b is etched by formation of the conductive films 112a and 112b, so that a depression is formed in the etched region. In other words, a thickness of the second oxide semiconductor film 108b in a region overlapping with the conductive films 112a and 112b is t2-1, and a thickness of the second oxide semiconductor film 108b in a region not overlapping with the conductive films 112a and 112b is t2-2.

As for the relationships between the thicknesses of the first oxide semiconductor film 108a and the second oxide semiconductor film 108b, $t2\text{-}1 > t1 > t2\text{-}2$ is preferable. A transistor with the thickness relationships can have high field-effect mobility and less variation in threshold voltage in light irradiation.

When oxygen vacancy is formed in the oxide semiconductor film 108 included in the transistor 100, electrons serving as carriers are generated; as a result, the transistor 100 tends to be normally-on. Therefore, for stable transistor characteristics, it is important to reduce oxygen vacancy in the oxide semiconductor film 108 particularly oxygen vacancy in the first oxide semiconductor film 108a. In the structure of the transistor of one embodiment of the present invention, excess oxygen is introduced into an insulating film over the oxide semiconductor film 108, here, the insulating film 114 and/or the insulating film 116 over the oxide semiconductor film 108, whereby oxygen is moved from the insulating film 114 and/or the insulating film 116 to the oxide semiconductor film 108 to fill oxygen vacancy in the oxide semiconductor film 108 particularly in the first oxide semiconductor film 108a.

It is preferable that the insulating films 114 and 116 each include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

In order to fill oxygen vacancy in the first oxide semiconductor film 108a, the thickness of the portion including the channel region and the vicinity of the channel region in the second oxide semiconductor film 108b is preferably small, and $t2\text{-}2 < t1$ is preferably satisfied. For example, the thickness of the portion including the channel region and the vicinity of the channel region in the second oxide semiconductor film 108b is preferably more than or equal to 1 nm and less than or equal to 20 nm, more preferably more than or equal to 3 nm and less than or equal to 10 nm.

Other constituent elements of the semiconductor device of this embodiment are described below in detail.

<<Substrate>>

There is no particular limitation on the property of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used as the substrate 102. Alternatively, any of these substrates provided with a semiconductor element, an insulating film, or the like may be used as the substrate 102. In the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<<Conductive Film Functioning as Gate Electrode and Source and Drain Electrodes>>

The conductive film 104 functioning as a gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<<Insulating Film Functioning as Gate Insulating Film>>

As each of the insulating films 106 and 107 functioning as gate insulating films of the transistor 100, an insulating film including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 has a function as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the physical thickness of the insulating film can be increased. This makes it possible to reduce a decrease in withstand voltage of the transistor 100 and furthermore to increase the withstand voltage, thereby reducing electrostatic discharge damage to the transistor 100.

<<Oxide Semiconductor Film>>

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In≥M and Zn≥M As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratios of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

The oxide semiconductor film 108a can be formed using the sputtering target having an atomic ratio of In:M:Zn=2:1:3, In:M:Zn=3:1:2, or In:M:Zn=4:2:4.1. The second oxide semiconductor film 108b can be formed using the sputtering target having an atomic ratio of In:M:Zn=1:1:1 or In:M:Zn=1:1:1.2. Note that the atomic ratio of metal elements in a sputtering target used for forming the second oxide semiconductor film 108b does not necessarily satisfy In≥M and Zn≥M, and may satisfy In≥M and Zn<M, such as In:M:Zn=1:3:2.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the first oxide semiconductor film 108a, and an oxide semiconductor film having an energy gap more than or equal to 2.5 eV and less than or equal to 3.5 eV is preferably used as the second oxide semiconductor film 108b. Furthermore, the second oxide semiconductor film 108b preferably has a higher energy gap than that of the first oxide semiconductor film 108a.

Each thickness of the oxide semiconductor film 108a and the second oxide semiconductor film 108b is more than or equal to 3 nm and less than or equal to 200 nm, preferably more than or equal to 3 nm and less than or equal to 100 nm, more preferably more than or equal to 3 nm and less than or equal to 50 nm. Note that the above-described thickness relationships between them are preferably satisfied.

An oxide semiconductor film with low carrier density is used as the second oxide semiconductor film 108b. For example, the carrier density of the second oxide semiconductor film 108b is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the first oxide semiconductor film 108a and the second oxide semiconductor film 108b be set to be appropriate.

Note that it is preferable to use, as the first oxide semiconductor film 108a and the second oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and thus has a low density of trap states in some cases. Furthermore, the highly purified intrinsic or substantially highly purified intrinsic oxide semiconductor film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The first oxide semiconductor film 108a preferably has a region in which hydrogen concentration is smaller than that in the second oxide semiconductor film 108b. A semiconductor device including the first oxide semiconductor film 108a having the region in which hydrogen concentration is smaller than that in the second oxide semiconductor film 108b can be increased in reliability.

When silicon or carbon that is one of elements belonging to Group 14 is included in the first oxide semiconductor film 108a, oxygen vacancy is increased in the first oxide semiconductor film 108a, and the first oxide semiconductor film 108a becomes an n-type film. Thus, the concentration of silicon or carbon (the concentration is measured by SIMS) in the first oxide semiconductor film 108a or the concentration of silicon or carbon (the concentration is measured by SIMS) in the vicinity of an interface with the first oxide semiconductor film 108a is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the first oxide semiconductor film 108a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the first oxide semiconductor film 108a.

Furthermore, when including nitrogen, the first oxide semiconductor film 108a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

Each of the first and second oxide semiconductor films 108a and 108b may have a non-single-crystal structure, for example. The non-single crystal structure includes a c-axis aligned crystalline oxide semiconductor (CAAC-OS) which is described later, a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Film Functioning as Protective Insulating Film of Transistor>>

The insulating films 114 and 116 each have a function of supplying oxygen to the oxide semiconductor film 108. The insulating film 118 has a function of a protective insulating film of the transistor 100. The insulating films 114 and 116 include oxygen. Furthermore, the insulating film 114 is an insulating film which can transmit oxygen. The insulating film 114 also serves as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in TDS analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a film surface temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal which appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are sequentially introduced plural times to form an initial tungsten film, and then a $WF_6$ gas and an $H_2$ gas are used, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a GaO layer is formed using a $Ga(CH_3)_3$ gas and an $O_3$ gas, and then a ZnO layer is formed using a $Zn(CH_3)_2$ gas and an $O_3$ gas. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments in this specification as appropriate.

(Embodiment 4)

In this embodiment, structures of a transistor that can be used in the display panel of one embodiment of the present invention will be described with reference to FIGS. 19A to 19C.

<Structure Example of Semiconductor Device>

Figure 19A:
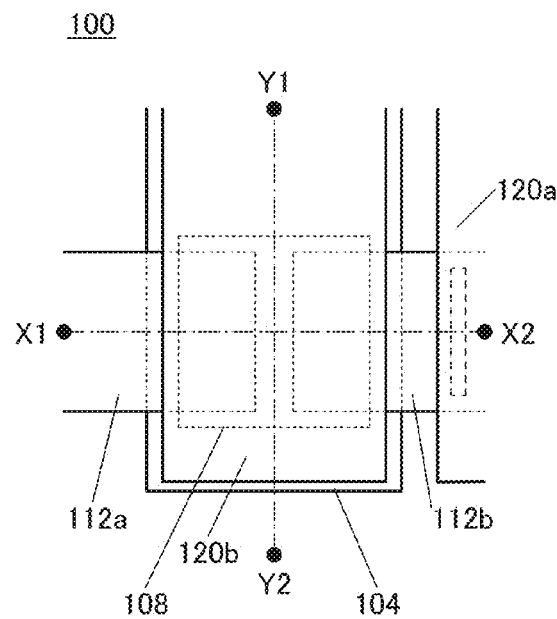
FIGS. 19A to 19C illustrate a structure of a transistor of Embodiment.
Figure 19B:
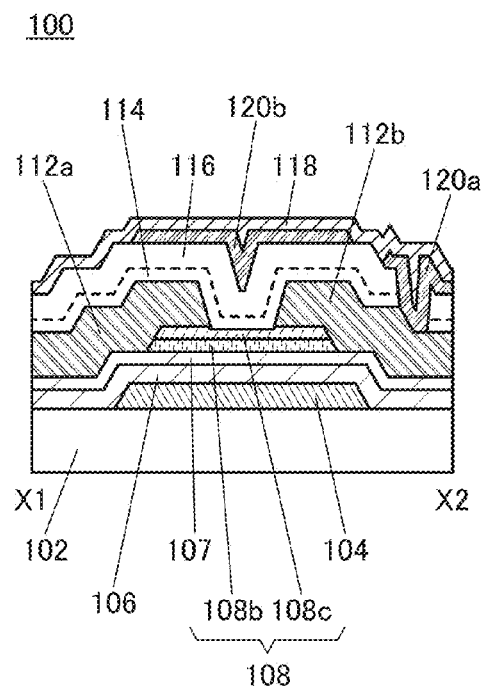
Figure 19C:
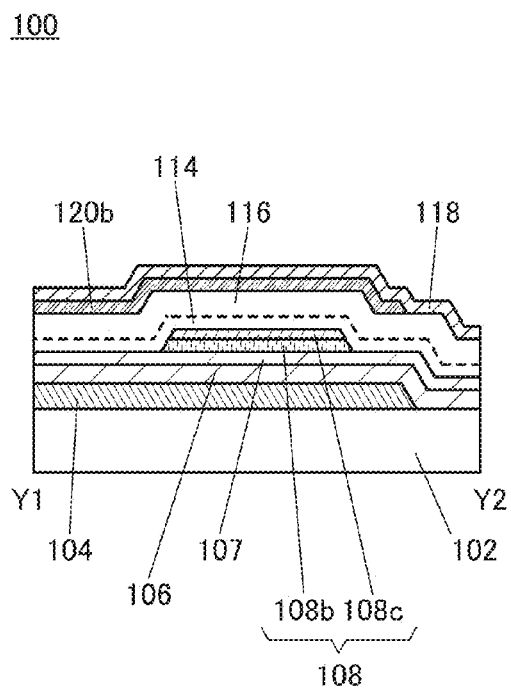

FIG. 19A is a top view of the transistor 100. FIG. 19B is a cross-sectional view taken along the cutting plane line X1-X2 in FIG. 19A, and FIG. 19C is a cross-sectional view taken along the cutting plane line Y1-Y2 in FIG. 19A. Note that in FIG. 19A, some components of the transistor 100 (e.g., an insulating film serving as a gate insulating film) are not illustrated to avoid complexity. Furthermore, the direction of the cutting plane line X1-X2 may be called a channel length direction, and the direction of the cutting plane line Y1-Y2 may be called a channel width direction. As in FIG. 19A, some components are not illustrated in some cases in top views of transistors described below.

The transistor 100 can be used for the display panel described in Embodiment 1.

For example, when the transistor 100 is used as the transistor MD, the substrate 102, the conductive film 104, a stacked film of the insulating film 106 and the insulating film 107, the oxide semiconductor film 108, the conductive film 112a, the conductive film 112b, a stacked film of the insulating film 114 and the insulating film 116, the insulating film 118, and a conductive film 120b can be referred to as the second insulating film 501C, the conductive film 504, the insulating film 506, the semiconductor film 508, the conductive film 512A, the conductive film 512B, the insulating film 516, the insulating film 518, and the conductive film 524, respectively.

The transistor 100 includes a conductive film 104 functioning as a first gate electrode over a substrate 102, an insulating film 106 over the substrate 102 and the conductive film 104, an insulating film 107 over the insulating film 106, an oxide semiconductor film 108 over the insulating film 107, and conductive films 112a and 112b functioning as source and drain electrodes electrically connected to the oxide semiconductor film 108, the insulating films 114 and 116 over the oxide semiconductor film 108 and the conductive films 112a and 112b, a conductive film 120a that is over the insulating film 116 and electrically connected to the conductive film 112b, the conductive film 120b over the insulating film 116, and the insulating film 118 over the insulating film 116 and the conductive films 120a and 120b.

The insulating films 106 and 107 function as a first gate insulating film of the transistor 100. The insulating films 114 and 116 function as a second gate insulating film of the transistor 100. The insulating film 118 serves as a protective insulating film of the transistor 100. In this specification and the like, the insulating films 106 and 107 are collectively referred to as a first insulating film, the insulating films 114 and 116 are collectively referred to as a second insulating film, and the insulating film 118 is referred to as a third insulating film in some cases.

The conductive film 120b can be used as a second gate electrode of the transistor 100.

In the case where the transistor 100 is used in a pixel portion of a display panel, the conductive film 120a can be used as an electrode of a display element, or the like.

The oxide semiconductor film 108 includes the oxide semiconductor film 108b (on the conductive film 104 side) that serves as a first gate electrode, and an oxide semiconductor film 108c over the oxide semiconductor film 108b. The oxide semiconductor films 108b and 108c contain In, M (M is Al, Ga, Y, or Sn), and Zn.

The oxide semiconductor film 108b preferably includes a region in which the atomic proportion of In is larger than the atomic proportion of M, for example. The oxide semiconductor film 108c preferably includes a region in which the atomic proportion of In is smaller than that in the oxide semiconductor film 108b.

The oxide semiconductor film 108b including the region in which the atomic proportion of In is larger than that of M can increase the field-effect mobility (also simply referred to as mobility or μFE) of the transistor 100. Specifically, the field-effect mobility of the transistor 100 can exceed 10 $cm^2/Vs$, preferably exceed 30 $cm^2/Vs$.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108b including the region in which the atomic proportion of In is larger than that of M makes it easier to change electrical characteristics of the transistor 100 in light irradiation. However, in the semiconductor device of one embodiment of the present invention, the oxide semiconductor film 108c is formed over the oxide semiconductor film 108b. Furthermore, the oxide semiconductor film 108c including the region in which the atomic proportion of In is smaller than that in the oxide semiconductor film 108b has larger Eg than the oxide semiconductor film 108b. For this reason, the oxide semiconductor film 108 which is a layered structure of the oxide semiconductor film 108b and the oxide semiconductor film 108c has high resistance to a negative bias stress test with light irradiation.

Impurities such as hydrogen or moisture entering the channel region of the oxide semiconductor film 108, particularly the oxide semiconductor film 108b adversely affect the transistor characteristics and therefore cause a problem.

Moreover, it is preferable that the amount of impurities such as hydrogen or moisture in the channel region of the oxide semiconductor film 108b be as small as possible. Furthermore, oxygen vacancies formed in the channel region in the oxide semiconductor film 108b adversely affect the transistor characteristics and therefore cause a problem. For example, oxygen vacancies formed in the channel region in the oxide semiconductor film 108b are bonded to hydrogen to serve as a carrier supply source. The carrier supply source generated in the channel region in the oxide semiconductor film 108b causes a change in the electrical characteristics, typically, shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which insulating films in contact with the oxide semiconductor film 108, specifically the insulating film 107 formed under the oxide semiconductor film 108 and the insulating films 114 and 116 formed over the oxide semiconductor film 108 include excess oxygen. Oxygen or excess oxygen is transferred from the insulating film 107 and the insulating films 114 and 116 to the oxide semiconductor film 108, whereby the oxygen vacancies in the oxide semiconductor film can be reduced. As a result, a change in electrical characteristics of the transistor 100, particularly a change in the transistor 100 due to light irradiation, can be reduced.

In one embodiment of the present invention, a manufacturing method is used in which the number of manufacturing steps is not increased or an increase in the number of manufacturing steps is extremely small, because the insulating film 107 and the insulating films 114 and 116 are made to contain excess oxygen. Thus, the transistor 100 can be manufactured with high yield.

Specifically, in a step of forming the oxide semiconductor film 108b, the oxide semiconductor film 108b is formed by a sputtering method in an atmosphere containing an oxygen gas, whereby oxygen or excess oxygen is added to the insulating film 107 over which the oxide semiconductor film 108b is formed.

Furthermore, in a step of forming the conductive films 120a and 120b, the conductive films 120a and 120b are formed by a sputtering method in an atmosphere containing an oxygen gas, whereby oxygen or excess oxygen is added to the insulating film 116 over which the conductive films 120a and 120b are formed. Note that in some cases, oxygen or excess oxygen is added also to the insulating film 114 and the oxide semiconductor film 108 under the insulating film 116 when oxygen or excess oxygen is added to the insulating film 116.

<Oxide Conductor>

Next, an oxide conductor is described. In a step of forming the conductive films 120a and 120b, the conductive films 120a and 120b serve as a protective film for suppressing release of oxygen from the insulating films 114 and 116. The conductive films 120a and 120b serve as semiconductors before a step of forming the insulating film 118 and serve as conductors after the step of forming the insulating film 118.

To allow the conductive films 120a and 120b to serve as conductors, an oxygen vacancy is formed in the conductive films 120a and 120b and hydrogen is added from the insulating film 118 to the oxygen vacancy, whereby a donor level is formed in the vicinity of the conduction band. As a result, the conductivity of each of the conductive films 120a and 120b is increased, so that the oxide semiconductor film becomes a conductor. The conductive films 120a and 120b having become conductors can each be referred to as oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

<Components of the Semiconductor Device>

Components of the semiconductor device of this embodiment will be described below in detail.

As materials described below, materials described in Embodiment 3 can be used.

The material that can be used for the substrate 102 described in Embodiment 3 can be used for the substrate 102 in this embodiment. Furthermore, the materials that can be used for the insulating films 106 and 107 described in Embodiment 3 can be used for the insulating films 106 and 107 in this embodiment.

In addition, the materials that can be used for the conductive films functioning as the gate electrode, the source electrode, and the drain electrode described in Embodiment 3 can be used for the conductive films functioning as the first gate electrode, the source electrode, and the drain electrode in this embodiment.

<<Oxide Semiconductor Film>>

The oxide semiconductor film 108 can be formed using the materials described above.

In the case where the oxide semiconductor film 108b includes In-M-Zn oxide, it is preferable that the atomic ratio of metal elements of a sputtering target used for forming the In-M-Zn oxide satisfy In >M. The atomic ratio between metal elements in such a sputtering target is, for example, In:M:Zn=2:1:3, In:M:Zn=3:1:2, or In:M:Zn=4:2:4.1.

In the case where the oxide semiconductor film 108c is In-M-Zn oxide, it is preferable that the atomic ratio of metal elements of a sputtering target used for forming a film of the In-M-Zn oxide satisfy In≤M. The atomic ratio of metal elements in such a sputtering target is, for example, In:M:Zn=1:1:1, In:M:Zn=1:1:1.2, In:M:Zn=1:3:2, In:M:Zn=1:3:4, In:M:Zn=1:3:6, or In:M:Zn=1:4:5.

In the case where the oxide semiconductor films 108b and 108c are formed of In-M-Zn oxide, it is preferable to use a target including polycrystalline In-M-Zn oxide as the sputtering target. The use of the target including polycrystalline In-M-Zn oxide facilitates formation of the oxide semiconductor films 108b and 108c having crystallinity. Note that the atomic ratios of metal elements in each of the formed oxide semiconductor films 108b and 108c vary from the above atomic ratio of metal elements of the sputtering target within a range of ±40% as an error. For example, when a sputtering target of the oxide semiconductor film 108b with an atomic ratio of In to Ga and Zn of 4:2:4.1 is used, the atomic ratio of In to Ga and Zn in the oxide semiconductor film 108b may be 4:2:3 or in the vicinity of 4:2:3.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108b, and an oxide semiconductor film having an energy gap more than or equal to 2.5 eV and less than or equal to 3.5 eV is preferably used as the oxide semiconductor film 108c. Furthermore, the oxide semiconductor film 108c preferably has a higher energy gap than the oxide semiconductor film 108b.

Each thickness of the oxide semiconductor film 108b and the oxide semiconductor film 108c is more than or equal to 3 nm and less than or equal to 200 nm, preferably more than or equal to 3 nm and less than or equal to 100 nm, more preferably more than or equal to 3 nm and less than or equal to 50 nm.

An oxide semiconductor film with low carrier density is used as the oxide semiconductor film 108c. For example, the carrier density of the oxide semiconductor film 108c is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108b and the oxide semiconductor film 108c be set to be appropriate.

Note that it is preferable to use, as the oxide semiconductor film 108b and the oxide semiconductor film 108c, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and thus has a low density of trap states in some cases. Furthermore, the highly purified intrinsic or substantially highly purified intrinsic oxide semiconductor film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, and alkaline earth metal are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The oxide semiconductor film 108b preferably includes a region in which hydrogen concentration is smaller than that in the oxide semiconductor film 108c. A semiconductor device including the oxide semiconductor film 108b having the region in which hydrogen concentration is smaller than that in the oxide semiconductor film 108c can be increased in reliability.

When silicon or carbon that is one of elements belonging to Group 14 is included in the oxide semiconductor film 108b, oxygen vacancy is increased in the oxide semiconductor film 108b, and the oxide semiconductor film 108b becomes an n-type film. Thus, the concentration of silicon or carbon (the concentration is measured by SIMS) in the oxide semiconductor film 108b or the concentration of silicon or carbon (the concentration is measured by SIMS) in the vicinity of an interface with the oxide semiconductor film 108b is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108b, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108b.

Furthermore, when including nitrogen, the oxide semiconductor film 108b easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

The oxide semiconductor film 108b and the oxide semiconductor film 108c may have a non-single-crystal structure, for example. The non-single crystal structure includes a c-axis aligned crystalline oxide semiconductor (CAAC-OS) which is described later, a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Films Functioning as Second Gate Insulating Film>>

The insulating films 114 and 116 function as a second gate insulating film of the transistor 100. In addition, the insulating films 114 and 116 each have a function of supplying oxygen to the oxide semiconductor film 108. That is, the insulating films 114 and 116 contain oxygen. Furthermore, the insulating film 114 is an insulating film which can transmit oxygen. Note that the insulating film 114 also serves as a film which relieves damage to the oxide semiconductor film 108 at the time of forming the insulating film 116 in a later step.

For example, the insulating films 114 and 116 described in Embodiment 3 can be used as the insulating films 114 and 116 in this embodiment.

<<Oxide Semiconductor Film Functioning as Conductive Film, Oxide Semiconductor Film Functioning as Second Gate Electrode>>

The material of the oxide semiconductor film 108 described above can be used for the conductive film 120a and the conductive film 120b functioning as the second gate electrode.

That is, the conductive film 120a and the conductive film 120b functioning as a second gate electrode contain a metal element which is the same as that contained in the oxide semiconductor film 108 (the oxide semiconductor film 108b and the oxide semiconductor film 108c). For example, the conductive film 120b functioning as a second gate electrode and the oxide semiconductor film 108 (the oxide semiconductor film 108b and the oxide semiconductor film 108c) contain the same metal element; thus, the manufacturing cost can be reduced.

For example, in the case where the conductive film 120a and the conductive film 120b functioning as a second gate electrode are each In-M-Zn oxide, the atomic ratio of metal elements in a sputtering target used for forming the In-M-Zn oxide preferably satisfies In≥M The atomic ratio of metal elements in such a sputtering target is In:M:Zn=2:1:3, InM:Zn=3:1:2, In:M:Zn=4:2:4.1, or the like.

The conductive film 120a and the conductive film 120b functioning as a second gate electrode can each have a single-layer structure or a stacked-layer structure of two or more layers. Note that in the case where the conductive film 120a and the conductive film 120b each have a stacked-layer structure, the composition of the sputtering target is not limited to that described above.

<<Insulating Film Functioning as Protective Insulating Film of Transistor>>

The insulating film 118 serves as a protective insulating film of the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118.

The insulating film 118 has a function of supplying one or both of hydrogen and nitrogen to the conductive film 120a and the conductive film 120b functioning as a second gate electrode. The insulating film 118 preferably includes hydrogen and has a function of supplying the hydrogen to the conductive films 120a and 120b. The conductive films 120a and 120b supplied with hydrogen from the insulating film 118 function as conductors.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include an MOCVD method and an ALD method. Specifically, the methods described above can be used.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2$ $H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are sequentially introduced plural times to form an initial tungsten film, and then a $WF_6$ gas and an $H_2$ gas are used, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a GaO layer is formed using a $Ga(CH_3)_3$ gas and an $O_3$ gas, and then a ZnO layer is formed using a $Zn(CH_3)_2$ gas and an $O_3$ gas. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments in this specification as appropriate.

(Embodiment 5)
<Composition of CAC-OS>

Described below is the composition of a cloud aligned complementary oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ and $In_{X2}Zn_{Y2}O_{Z2}$ forming the mosaic pattern are evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R. T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 29:
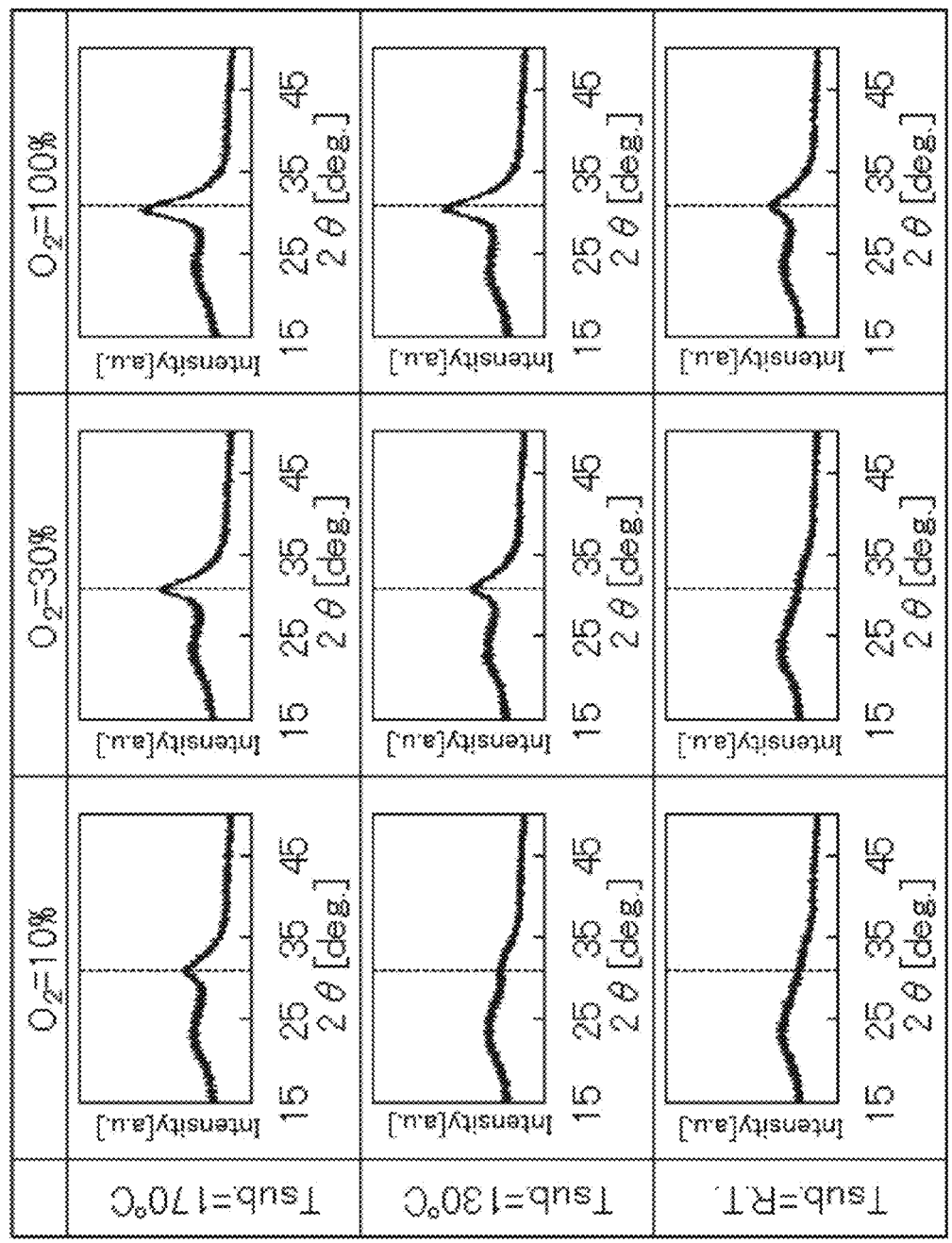
FIG. 29 shows measured XRD spectra of samples.

FIG. 29 shows XRD spectra measured by an out-of-plane method. In FIG. 29, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 29, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 29, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 30A is a plan-view TEM image of the sample formed at a substrate temperature of R.T. and with an oxygen gas flow rate ratio of 10%. FIG. 30B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 30A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 30C, 30D, 30E, 30F, and 30G show the results of the points indicated by the black dots a1, a2, a3, a4, and a5, respectively.

In FIGS. 30C, 30D, 30E, 30F, and 30G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 30B of the sample formed at a substrate temperature of R.T. and an oxygen gas flow rate ratio of 10% are observed. FIGS. 30H, 30I, 30J, 30K, and 30L show the results of the points indicated by the black dots b1, b2, b3, b4, and b5, respectively.

In FIGS. 30H, 30I, 30J, 30K, and 30L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 31A:
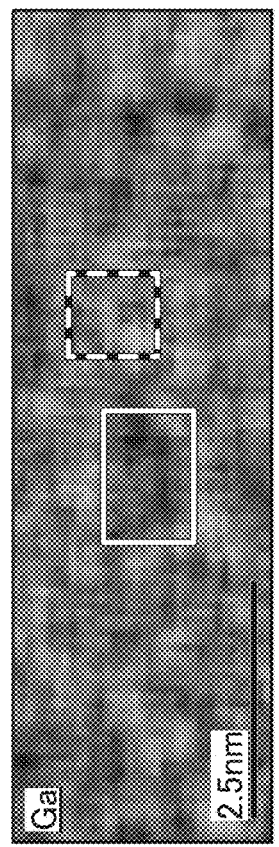
FIGS. 31A to 31C show EDX mapping images of a sample.
Figure 31B:
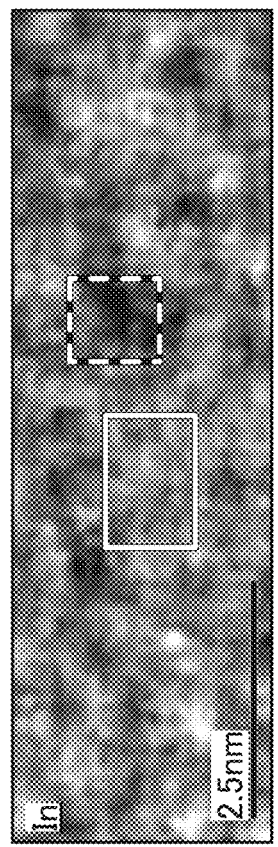
Figure 31C:
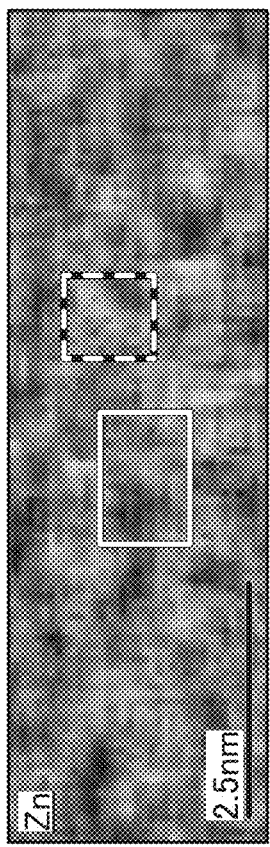

FIGS. 31A to 31C show EDX mapping images in a cross section of the sample formed at a substrate temperature of R.T. and with an oxygen gas flow rate ratio of 10%. FIG. 31A shows an EDX mapping image of Ga atoms. The proportion of the Ga atoms in all the atoms is 1.18 atomic % to 18.64 atomic %. FIG. 31B shows an EDX mapping image of In atoms. The proportion of the In atoms in all the atoms is 9.28 atomic % to 33.74 atomic %. FIG. 31C shows an EDX mapping image of Zn atoms. The proportion of the Zn atoms in all the atoms is 6.69 atomic % to 24.99 atomic %. FIGS. 31A to 31C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 31A to 31C is 7200000 times.

The EDX mapping images in FIGS. 31A to 31C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 31A to 31C are examined.

In FIG. 31A, a relatively dark region occupies a large area in the area surrounded by the solid line, while a relatively bright region occupies a large area in the area surrounded by the dashed line. In FIG. 31B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 31C, the right portion of the area surrounded by the solid line is relatively bright and the left portion thereof is relatively dark. Thus, the area surrounded by the solid line is a region including In$_{X2}$Zn$_{Y2}$O$_{Z2}$, InO$_{X1}$, and the like as main components.

The area surrounded by the solid line is a region including a relatively small number of Ga atoms and the area surrounded by the dashed line is a region including a relatively large number of Ga atoms. In FIG. 31C, the upper left portion of the area surrounded by the dashed line is relatively bright and the lower right portion thereof is relatively dark. Thus, the area surrounded by the dashed line is a region including GaO$_{X3}$, Ga$_{X4}$Zn$_{Y4}$O$_{Z4}$, and the like as main components.

Furthermore, as shown in FIGS. 31A to 31C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 31A to 31C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor exhibits. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

(Embodiment 6)

In this embodiment, a structure of an input/output device of one embodiment of the present invention will be described with reference to FIG. 20.

Figure 20:
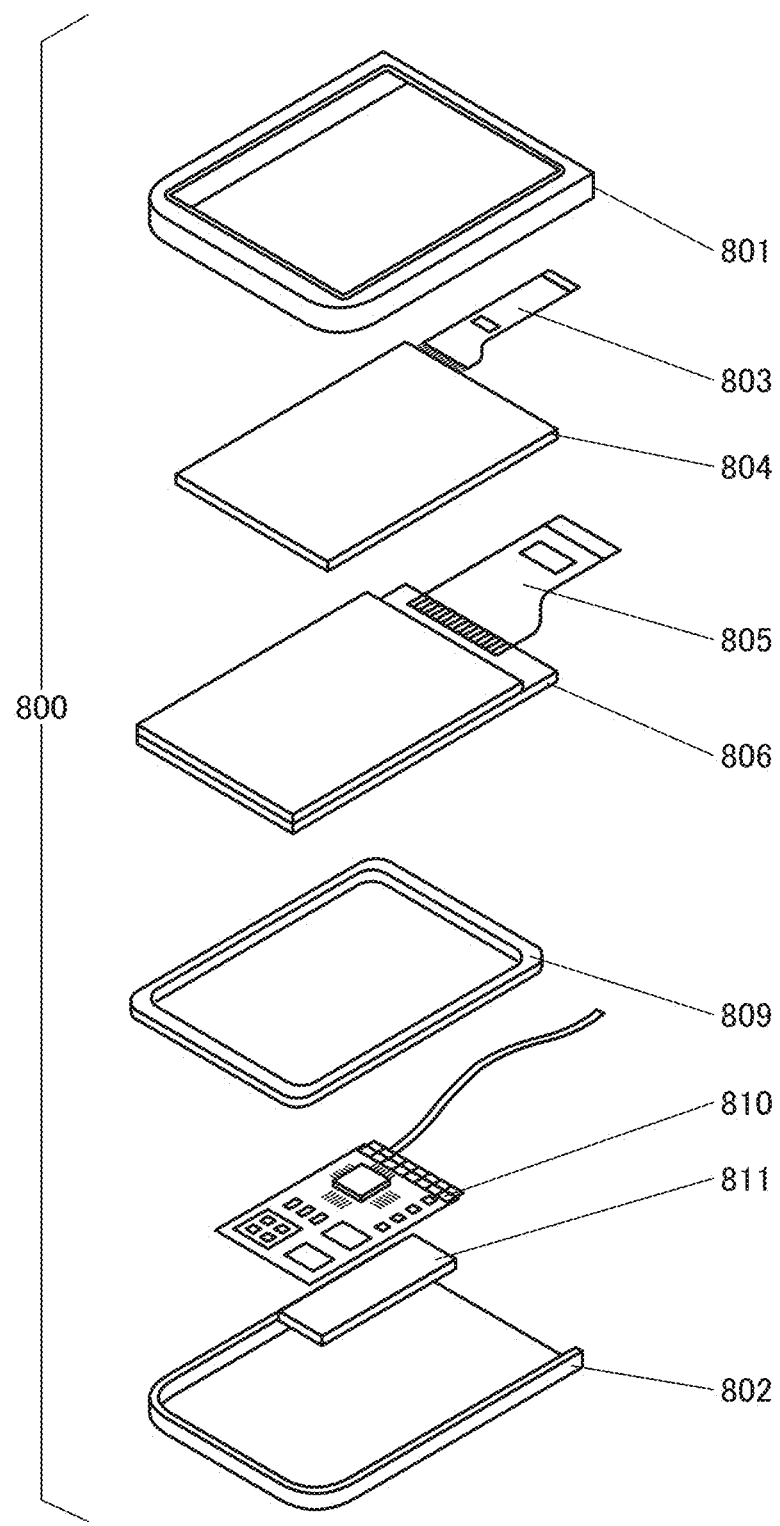
FIG. 20 illustrates a structure of an input/output device of Embodiment.

FIG. 20 is an exploded view of an input/output device 800 for illustrating the components.

The input/output device 800 includes a display panel 806 and a touch sensor 804 having a region overlapping with the display panel 806. Note that the input/output device 800 can be referred to as a touch panel.

The input/output device 800 is provided with a driver circuit 810 for driving the touch sensor 804 and the display panel 806, a battery 811 for supplying power to the driver circuit 810, and a housing where the touch sensor 804, the display panel 806, the driver circuit 810, and the battery 811 are stored.

<<Touch Sensor 804>>

The touch sensor 804 includes a region overlapping with the display panel 806. Note that an FPC 803 is electrically connected to the touch sensor 804.

For the touch sensor 804, a resistive touch sensor, a capacitive touch sensor, or a touch sensor using a photoelectric conversion element can be used, for example.

Note that the touch sensor 804 may be used as part of the display panel 806.

<<Display Panel 806>>

For example, the display panel described in Embodiment 1 can be used as the display panel 806. Note that an FPC 805 is electrically connected to the display panel 806.

<<Driver Circuit 810>>

As the driver circuit 810, a power supply circuit or a signal processing circuit can be used, for example. Power supplied to the battery or an external commercial power supply can be utilized.

The signal processing circuit has a function of outputting a video signal and a clock signal.

The power supply circuit has a function of supplying predetermined power.

<<Housing>>

An upper cover 801, a lower cover 802 which fits the upper cover 801, and a frame 809 which is stored in a region surrounded by the upper cover 801 and the lower cover 802 can be used for the housing, for example.

The frame 809 has a function of protecting the display panel 806, and a function of blocking electromagnetic waves generated by the operation of the driver circuit 810 or a function of a radiator plate.

Metal, a resin, an elastomer, or the like can be used for the upper cover 801, the lower cover 802, or the frame 809.

<<Battery 811>>

The battery 811 has a function of supplying power.

Note that a member such as a polarizing plate, a retardation plate, or a prism sheet can be used for the input/output device 800.

This embodiment can be combined with any of the other embodiments in this specification as appropriate.

(Embodiment 7)

In this embodiment, a structure of an information processing device of one embodiment of the present invention will be described with reference to FIGS. 21A and 21B, FIGS. 22A to 22C, FIGS. 23A and 23B, and FIG. 24.

Figure 21A:
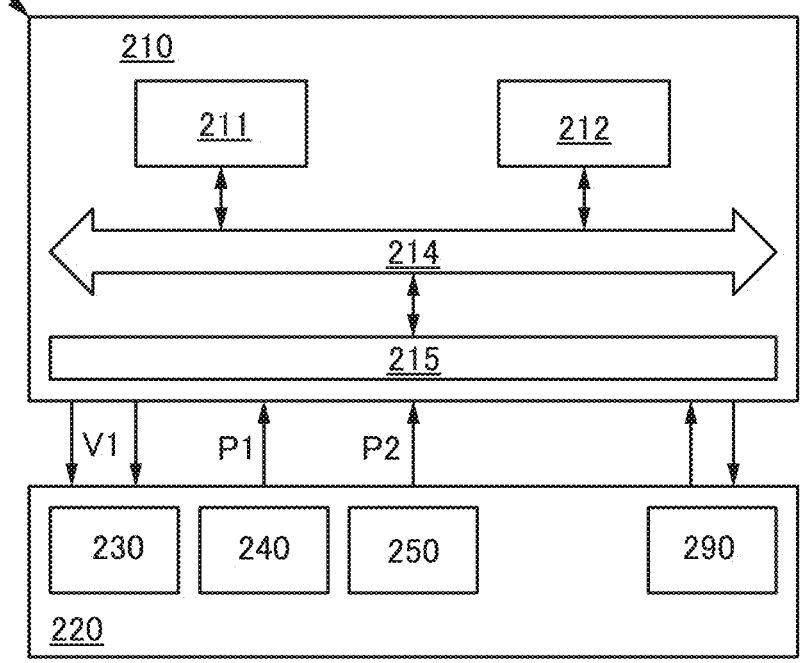
FIGS. 21A and 21B are a block diagram and a perspective view, respectively, illustrating a structure of an information processing device of Embodiment.
Figure 21B:
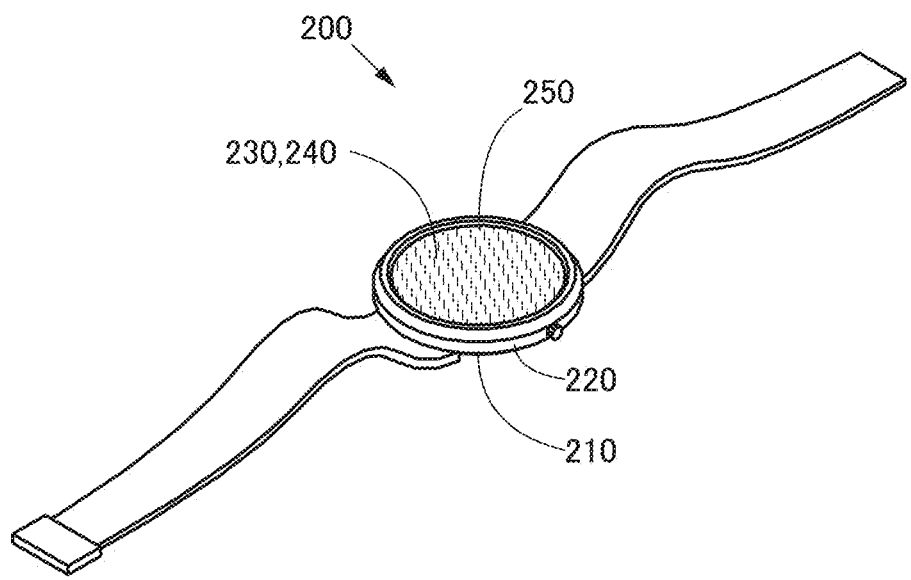

FIG. 21A is a block diagram illustrating a structure of an information processing device 200. FIG. 21B is a perspective view illustrating an example of an external view of the information processing device 200.

Figure 22A:
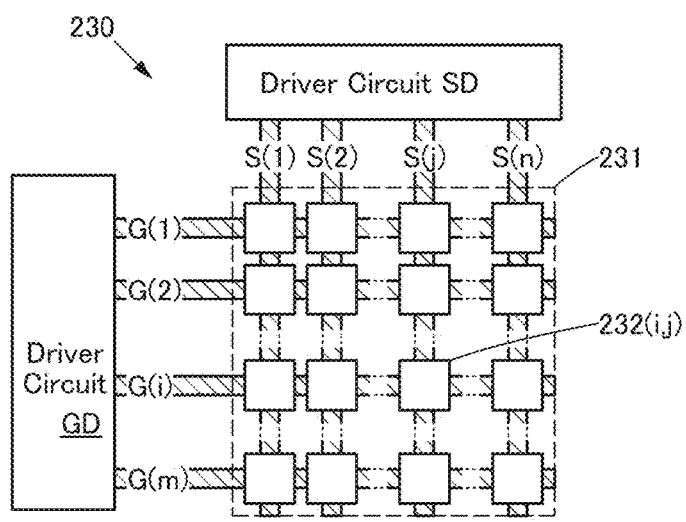
FIGS. 22A to 22C are block diagrams and a circuit diagram, respectively, illustrating a display portion of Embodiment.
Figure 22B:
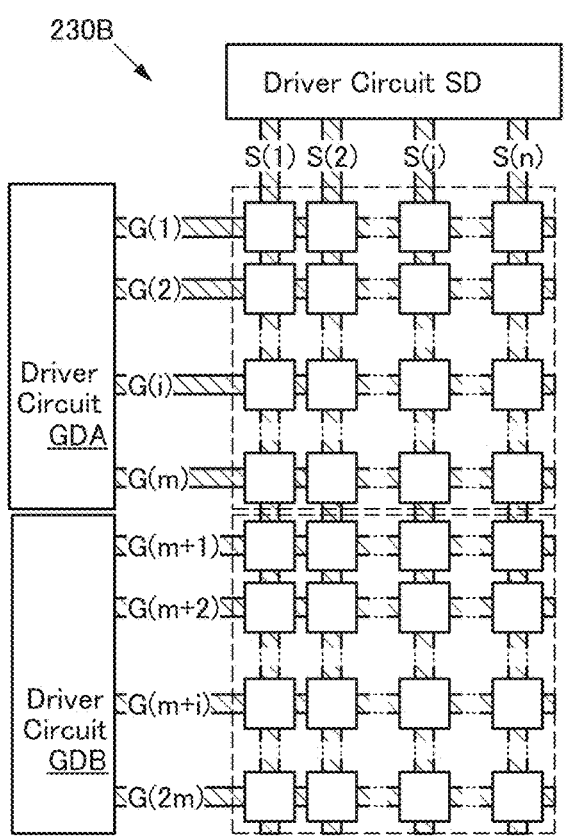
Figure 22C:
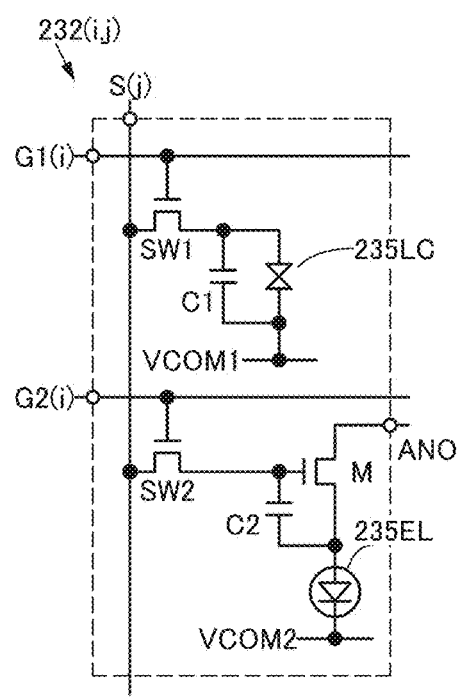

FIG. 22A is a block diagram illustrating a configuration of a display portion 230. FIG. 22B is a block diagram illustrating a configuration of a display portion 230B. FIG. 22C is a circuit diagram illustrating a configuration of a pixel 232(i, j).

<Configuration Example of Information Processing Device>

Figure 23A:
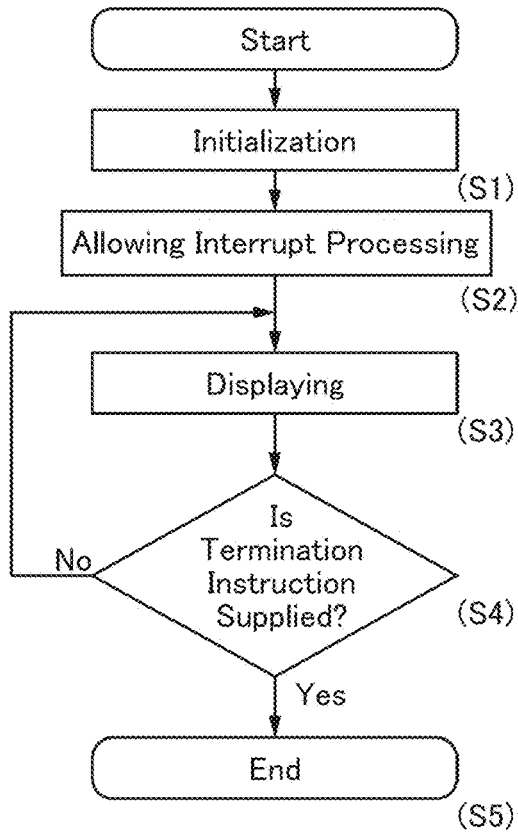
FIGS. 23A and 23B are flow charts each showing a program of Embodiment.

The information processing device 200 described in this embodiment includes an arithmetic device 210 and an input/output device 220 (see FIG. 23A).

The arithmetic device 210 is configured to receive positional information P1 and supply image information V and control information.

The input/output device 220 is configured to supply the positional information P1 and receive the image information V and the control information.

The input/output device 220 includes the display portion 230 that displays the image information V and an input portion 240 that supplies the positional information P1.

The display portion 230 includes a first display element and a second display element overlapping with the opening in the reflective film of the first display element. The display portion 230 further includes a first pixel circuit for driving the first display element and a second pixel circuit for driving the second display element.

The input portion 240 is configured to detect the position of a pointer and supply the positional information P1 determined in accordance with the position.

The arithmetic device 210 is configured to determine the moving speed of the pointer in accordance with the positional information P1.

The arithmetic device 210 is configured to determine the contrast or brightness of the image information V in accordance with the moving speed.

The information processing device 200 described in this embodiment includes the input/output device 220 that supplies the positional information P1 and receives the image information V and the arithmetic device 210 that receives the positional information P1 and supplies the image information V. The arithmetic device 210 is configured to determine the contrast or brightness of the image information V in accordance with the moving speed of the positional information P1.

With this structure, eyestrain on a user caused when the display position of image information is moved can be reduced, that is, eye-friendly display can be achieved. Moreover, the power consumption can be reduced and excellent visibility can be provided even in a bright place exposed to direct sunlight, for example. Thus, the novel information processing device that is highly convenient or reliable can be provided.

<Configuration>

The information processing device of one embodiment of the present invention includes the arithmetic device 210 or the input/output device 220.

<<Arithmetic Device 210>>

The arithmetic device 210 includes an arithmetic portion 211 and a memory portion 212. The arithmetic device 210 further includes a transmission path 214 and an input/output interface 215 (see FIG. 21A).

<<Arithmetic Portion 211>>

The arithmetic portion 211 is configured to, for example, execute a program. For example, a CPU described in Embodiment 7 can be used. Thus, power consumption can be sufficiently reduced.

<<Memory Portion 212>>

The memory portion 212 is configured to, for example, store the program executed by the arithmetic portion 211, initial information, setting information, an image, or the like. Specifically, a hard disk, a flash memory, a memory including a transistor including an oxide semiconductor, or the like can be used for the memory portion 212.

<<Input/Output Interface 215, Transmission Path 214>>

The input/output interface 215 includes a terminal or a wiring and is configured to supply and receive information. For example, the input/output interface 215 can be electrically connected to the transmission path 214 and the input/output device 220.

The transmission path 214 includes a wiring and is configured to supply and receive information. For example, the transmission path 214 can be electrically connected to the input/output interface 215. In addition, the transmission path 214 can be electrically connected to the arithmetic portion 211 or the memory portion 212.

<<Input/Output Device 220>>

The input/output device 220 includes the display portion 230, the input portion 240, a sensor portion 250, or a communication portion 290.

<<Display Portion 230>>

The display portion 230 includes a display region 231, a driver circuit GD, and a driver circuit SD (see FIG. 22A). For example, the display panel described in Embodiment 1 can be used. Thus, low power consumption can be achieved.

The display region 231 includes a plurality of pixels $232(i, 1)$ to $232(i, n)$ arranged in the row direction, a plurality of pixels $232(1, j)$ to $232(m, j)$ arranged in the column direction, a scan line $G(i)$ electrically connected to the pixels $232(i, 1)$ to $232(i, n)$, and a signal line $S(j)$ electrically connected to the pixels $232(i, j)$ to $232(m, j)$. Note that i is an integer greater than or equal to 1 and less than or equal to m, j is an integer greater than or equal to 1 and less than or equal to n, and each of m and n is an integer greater than or equal to 1.

Note that the pixel $232(i, j)$ is electrically connected to the scan line $G1(i)$, the scan line $G2(i)$, the signal line $S(j)$, the wiring ANO, the wiring VCOM1, and the wiring VCOM2 (see FIG. 22C).

Note that the scan line $G1(i)$ includes the scan line $G1(i)$ and the scan line $G2(i)$ (see FIGS. 22A and 22B).

The display portion can include a plurality of driver circuits. For example, the display portion 230B can include a driver circuit GDA and a driver circuit GDB (see FIG. 22B).

<<Driver Circuit GD>>

The driver circuit GD is configured to supply a selection signal in accordance with the control information.

For example, the driver circuit GD is configured to supply a selection signal to one scan line at a frequency of 30 Hz or higher, preferably 60 Hz or higher, in accordance with the control information. Accordingly, moving images can be smoothly displayed.

For example, the driver circuit GD is configured to supply a selection signal to one scan line at a frequency of lower than 30 Hz, preferably lower than 1 Hz, more preferably less than once per minute, in accordance with the control information. Accordingly, a still image can be displayed while flickering is suppressed.

For example, in the case where a plurality of driver circuits is provided, the driver circuits GDA and GDB may supply the selection signals at different frequencies. Specifically, the selection signal can be supplied at a higher frequency to a region on which moving images are smoothly displayed than to a region on which a still image is displayed in a state where flickering is suppressed.

<<Driver Circuit SD>>

The driver circuit SD is configured to supply an image signal in accordance with the image information V.

<<Pixel 232(i, j)>>

The pixel 232(i, j) includes a first display element 235LC and a second display element 235EL overlapping with the opening in the reflective film of the first display element 235LC. The pixel 232(i, j) further includes a first pixel circuit for driving the first display element 235LC and a second pixel circuit for driving the second display element 235EL (see FIG. 22C).

<<First Display Element 235LC>>

For example, a display element having a function of controlling light transmission can be used as the first display element 235LC. Specifically, a polarizing plate and a liquid crystal element, a MEMS shutter display element, or the like can be used.

Specifically, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The first display element 235LC includes a first electrode, a second electrode, and a liquid crystal layer. The liquid crystal layer contains a liquid crystal material whose orientation is controlled by voltage applied between the first electrode and the second electrode. For example, the orientation of the liquid crystal material can be controlled by an electric field in the thickness direction (also referred to as the vertical direction), the horizontal direction, or the diagonal direction of the liquid crystal layer.

For example, thermotropic liquid crystal, low-molecular liquid crystal, high-molecular liquid crystal, polymer dispersed liquid crystal, ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions. Alternatively, a liquid crystal material that exhibits a blue phase can be used.

<<Second Display Element 235EL>>

A display element having a function of emitting light, such as an organic EL element, can be used as the second display element 235EL.

Specifically, an organic EL element which emits white light can be used as the second display element 235EL. Alternatively, an organic EL element which emits blue light, green light, or red light can be used as the second display element 235EL.

<<Pixel Circuit>>

A pixel circuit including a circuit which is configured to drive the first display element 235LC and/or the second display element 235EL can be used.

For example, a pixel circuit which is electrically connected to the scan line G1(i), the scan line G2(i), the signal line S(j), the wiring ANO, the wiring VCOM1, and the wiring VCOM2 and which drives a light-emitting element and an organic EL element is described (see FIG. 22C).

Alternatively, for example, a switch, a transistor, a diode, a resistor, a capacitor, or an inductor can be used in the pixel circuit.

For example, one or a plurality of transistors can be used as a switch. Alternatively, a plurality of transistors connected in parallel, in series, or in combination of parallel connection and series connection can be used as a switch.

For example, a capacitor may be formed by the first electrode of the first display element 235LC and a conductive film having a region overlapping with the first electrode.

For example, the pixel circuit includes a transistor functioning as the switch SW1, the first display element 235LC, and the capacitor C1. A gate electrode of the transistor is electrically connected to the scan line G1 (i), and a first electrode of the transistor is electrically connected to the signal line S(j). A first electrode of the first display element 235LC is electrically connected to a second electrode of the transistor, and a second electrode of the first display element 235LC is electrically connected to the wiring VCOM1. A first electrode of the capacitor C1 is electrically connected to the second electrode of the transistor, and a second electrode of the capacitor C1 is electrically connected to the wiring VCOM1.

The pixel circuit includes the transistor functioning as the switch SW2. A gate electrode of the transistor is electrically connected to the scan line G2(i), a first electrode of the transistor is electrically connected to the signal line S(j). In addition, the pixel circuit includes the transistor M. A gate electrode of the transistor M is electrically connected to a second electrode of the transistor functioning as the switch SW2. A first electrode of the transistor M is electrically connected to the wiring ANO. In addition, the pixel circuit includes the capacitor C2. A first electrode of the capacitor C2 is electrically connected to the second electrode of the transistor functioning as the switch SW2. A second electrode of the capacitor C2 is electrically connected to the second electrode of the transistor M. In addition, the pixel circuit includes a second display element 235EL. A first electrode and a second electrode of the second display element 235EL are electrically connected to the second electrode of the transistor M and the wiring VCOM2, respectively.

<<Transistor>>

For example, a semiconductor film formed at the same step can be used for transistors in the driver circuit and the pixel circuit.

As the transistors in the driver circuit and the pixel circuit, bottom-gate transistors, top-gate transistors, or the like can be used.

For example, a manufacturing line for a bottom-gate transistor including amorphous silicon as a semiconductor can be easily remodeled into a manufacturing line for a bottom-gate transistor including an oxide semiconductor as a semiconductor. Furthermore, for example, a manufacturing line for a top-gate transistor including polysilicon as a semiconductor can be easily remodeled into a manufacturing line for a top-gate transistor including an oxide semiconductor as a semiconductor.

For example, a transistor including a semiconductor containing an element of Group 4 can be used. Specifically, a semiconductor containing silicon can be used for a semiconductor film. For example, single crystal silicon, polysilicon, microcrystalline silicon, or amorphous silicon can be used for the semiconductor of the transistor.

Note that the temperature for forming a transistor using polysilicon in a semiconductor is lower than the temperature for forming a transistor using single crystal silicon in a semiconductor.

In addition, the transistor using polysilicon in a semiconductor has higher field-effect mobility than the transistor using amorphous silicon in a semiconductor, and therefore a pixel including the transistor using polysilicon can have a high aperture ratio. Moreover, pixels arranged at a high density, a gate driver circuit, and a source driver circuit can be formed over the same substrate. As a result, the number of components included in an electronic device can be reduced.

In addition, the transistor using polysilicon in a semiconductor has higher reliability than the transistor using amorphous silicon in a semiconductor.

For example, a transistor including an oxide semiconductor can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used. Specifically, a transistor that uses an oxide semiconductor for a semiconductor film can be used.

A pixel circuit in the transistor that uses an oxide semiconductor for the semiconductor film can hold an image signal for a longer time than a pixel circuit in a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the information processing device can be reduced, and power consumption for driving can be reduced.

Alternatively, for example, a transistor including a compound semiconductor can be used. Specifically, a semiconductor containing gallium arsenide can be used for a semiconductor film.

For example, a transistor including an organic semiconductor can be used. Specifically, an organic semiconductor containing any of polyacenes and graphene can be used for the semiconductor film.

<<Input Portion 240>>

A variety of human interfaces or the like can be used as the input portion 240 (see FIG. 21A).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor having a region overlapping with the display portion 230 can be referred to as a touch panel.

For example, a user can make various gestures (e.g., tap, drag, swipe, and pinch in) using his/her finger as a pointer on the touch panel.

The arithmetic device 210, for example, analyzes information on the position, track, or the like of the finger on the touch panel and determines that a specific gesture is supplied when the analysis results meet predetermined conditions. Therefore, the user can supply a certain operation instruction associated with a certain gesture by using the gesture.

For instance, the user can supply a "scrolling instruction" for changing a portion where image information is displayed by using a gesture of touching and moving his/her finger on the touch panel.

<<Sensor Portion 250>>

The sensor portion 250 is configured to acquire information P2 by measuring the surrounding state.

For example, a camera, an acceleration sensor, a direction sensor, a pressure sensor, a temperature sensor, a humidity sensor, an illuminance sensor, or a global positioning system (GPS) signal receiving circuit can be used as the sensor portion 250.

For example, when the arithmetic device 210 determines that the ambient light level measured by an illuminance sensor of the sensor portion 250 is sufficiently higher than the predetermined illuminance, image information is displayed using the first display element 235LC. When the arithmetic device 210 determines that it is dim, image information is displayed using the first display element 235LC and the second display element 235EL. When the arithmetic device 210 determines that it is dark, image information is displayed using the second display element 235EL.

Specifically, an image is displayed with a reflective display element and/or a self-luminous display element depending on the ambient brightness. For example, a liquid crystal element and an organic EL element can be used as the reflective display element and the self-luminous display element, respectively.

Thus, image information can be displayed in such a manner that, for example, a reflective display element is used under strong ambient light, a reflective display element and a self-luminous display element are used in dim light, and a self-luminous display element is used in dark light. Thus, a novel display device with high visibility can be provided. A novel display device with low power consumption can be provided. A novel information processing device which is highly convenient or reliable can be provided.

For example, a sensor measuring chromaticity of ambient light, such as a CCD camera, can be used in the sensor portion 250, white balance can be adjusted in accordance with the chromaticity of ambient light measured by the sensor portion 250.

Specifically, the white balance is adjusted through first to third steps described below.

In the first step, imbalance disruption of white balance of ambient light is measured.

In the second step, the intensity of light of a color which is insufficient in an image to be displayed by the first display element using reflection of ambient light is estimated.

In the third step, ambient light is reflected by the first display element, and light is emitted from the second display element so that light of the insufficient color is supplemented, whereby the image is displayed.

In this manner, display can be performed with adjusted white balance by utilizing light reflected by the first display element and light emitted from the second display element. Thus, a novel information processing device which can display an image with low power consumption or with adjusted white balance and which is highly convenient and reliable can be provided.

<<Communication Portion 290>>

The communication portion 290 is configured to supply and acquire information to/from a network.

<<Program>>

A program of one embodiment of the present invention will be described with reference to FIGS. 23A and 23B and FIG. 24.

Figure 23B:
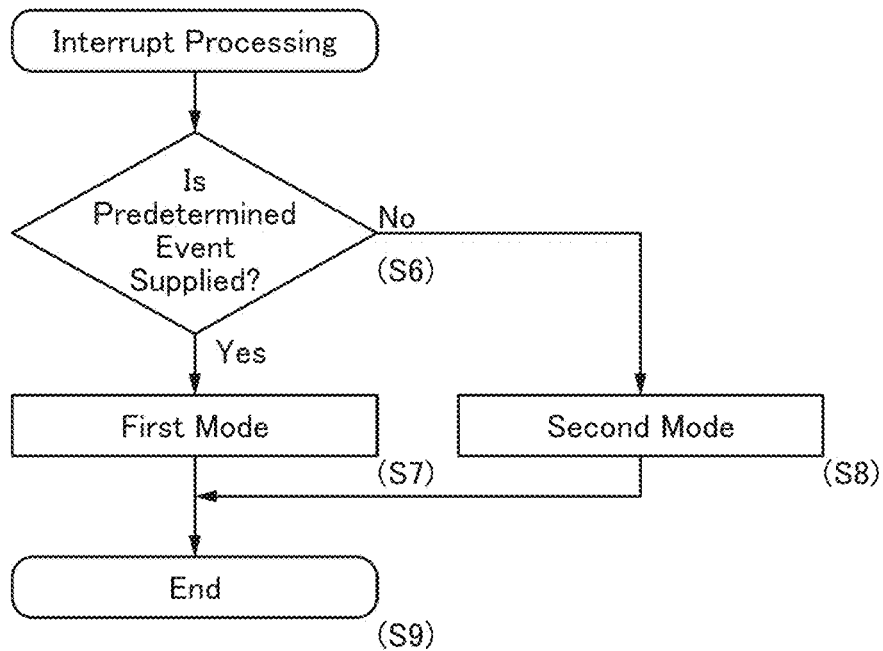

FIG. 23A is a flow chart showing main processing of the program of one embodiment of the present invention, and FIG. 23B is a flow chart showing interrupt processing.

Figure 24:
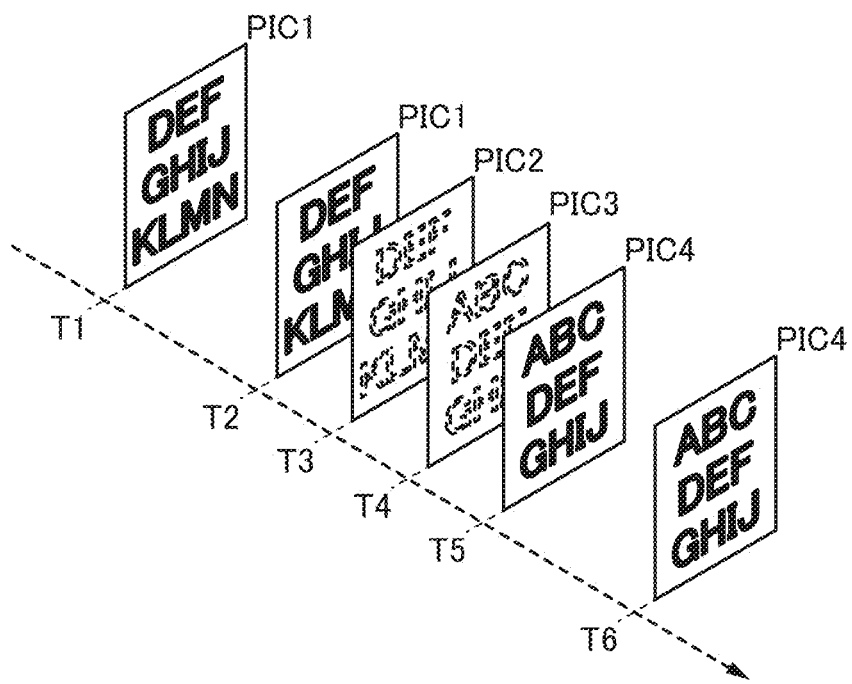
FIG. 24 is a schematic diagram illustrating image information of Embodiment.

FIG. 24 schematically illustrates a method for displaying image information on the display portion 230.

The program of one embodiment of the present invention has the following steps (see FIG. 23A).

In a first step, setting is initialized (see S1 in FIG. 23A).

For instance, predetermined image information and the second mode can be used for the initialization.

For example, a still image can be used as the predetermined image information. Alternatively, a mode in which the selection signal is supplied at a frequency of lower than 30 Hz, preferably lower than 1 Hz, more preferably less than once per minute can be used as the second mode. For example, in the case where the time is displayed on the information processing device on the second time scale, a mode in which the selection signal is supplied at a frequency of 1 Hz can be used as the second mode. In the case where the time is displayed on the information processing device on the minute time scale, a mode in which the selection signal is supplied once per minute can be used as the second mode.

In a second step, interrupt processing is allowed (see S2 in FIG. 23A). Note that an arithmetic device allowed to execute the interrupt processing can perform the interrupt processing in parallel with the main processing. The arithmetic device which has returned from the interrupt processing to the main processing can reflect the results of the interrupt processing in the main processing.

The arithmetic device may execute the interrupt processing when a counter has an initial value, and the counter may be set at a value other than the initial value when the arithmetic device returns from the interrupt processing. Thus, the interrupt processing is ready to be executed after the program is started up.

In a third step, image information is displayed in a mode selected in the first step or the interrupt processing (see S3 in FIG. 23A).

For instance, predetermined image information is displayed in the second mode, in accordance with the initialization.

Specifically, the predetermined image information is displayed in a mode in which the selection signal is supplied to one scan line at a frequency of lower than 30 Hz, preferably lower than 1 Hz, more preferably less than once per minute.

For example, the selection signal is supplied at Time T1 so that first image information PIC1 is displayed on the display portion 230 (see FIG. 24). At Time T2, which is, for example, one second after Time T1, the selection signal is supplied so that the predetermined image information is displayed.

Alternatively, in the case where a predetermined event is not supplied in the interrupt processing, image information is displayed in the second mode.

For example, the selection signal is supplied at Time T5 so that fourth image information PIC4 is displayed on the display portion 230. At Time T6, which is, for example, one second after Time T5, the selection signal is supplied so that the same image information is displayed. Note that the length of a period from Time T5 to Time T6 can be equal to that of a period from Time T1 to Time T2.

For instance, in the case where the predetermined event is supplied in the interrupt processing, predetermined image information is displayed in the first mode.

Specifically, in the case where an event associated with a "page turning instruction" is supplied in the interrupt processing, image information is switched from one to another in a mode in which the selection signal is supplied to one scan line at a frequency of 30 Hz or higher, preferably 60 Hz or higher.

Alternatively, in the case where an event associated with the "scrolling instruction" is supplied in the interrupt processing, second image information PIC2, which includes part of the displayed first image information PIC1 and the following part, is displayed in a mode in which the selection signal is supplied to one scan line at a frequency of 30 Hz or higher, preferably 60 Hz or higher.

Thus, for example, moving images in which images are gradually switched in accordance with the "page turning instruction" can be displayed smoothly. Alternatively, a moving image in which an image is gradually moved in accordance with the "scrolling instruction" can be displayed smoothly.

Specifically, the selection signal is supplied at Time T3 after the event associated with the "scrolling instruction" is supplied so that the second image information PIC2 whose display position and the like are changed from those of the first image information PIC1 is displayed (see FIG. 24). The selection signal is supplied at Time T4 so that third image information PIC3 whose display position and the like are changed from those of the second image information PIC2 is displayed. Note that each of a period from Time T2 to Time T3, a period from Time T3 to Time T4, and a period from Time T4 to Time T5 is shorter than the period from Time Ti to Time T2.

In the fourth step, the program moves to the fifth step when a termination instruction is supplied, and the program moves to the third step when the termination instruction is not supplied (see S4 in FIG. 23A).

Note that in the interrupt processing, for example, the termination instruction can be supplied.

In the fifth step, the program terminates (see S5 in FIG. 23A).

The interrupt processing includes sixth to ninth steps described below (see FIG. 23B).

In the sixth step, the processing proceeds to the seventh step when a predetermined event has been supplied during a predetermined period, whereas the processing proceeds to the eighth step when the predetermined event has not been supplied (see S6 in FIG. 23B).

For example, the predetermined period is shorter than 0.5 seconds, preferably shorter than 0.1 seconds.

For example, the predetermined event can include an event associated with the termination instruction.

In the seventh step, the first mode is selected (see S7 in FIG. 23B).

In the eighth step, the second mode is selected (see S8 in FIG. 23B).

In the ninth step, the operation returns from the interrupt processing (see S9 in FIG. 23B).

<<Predetermined Event>>

A variety of instructions can be associated with a variety of events.

The following instructions can be given as examples: "page-turning instruction" for switching displayed image information from one to another and "scroll instruction" for moving the display position of part of image information and displaying another part continuing from that part.

For example, the following events can be used: events supplied using a pointing device such as a mouse (e.g., "click" and "drag") and events supplied to a touch panel with a finger or the like used as a pointer (e.g., "tap", "drag", and "swipe").

For example, the position of a slide bar pointed by a pointer, the swipe speed, and the drag speed can be used as parameters of various instructions.

Specifically, a parameter that determines the page-turning speed or the like can be used to execute the "page-turning instruction," and a parameter that determines the moving speed of the display position or the like can be used to execute the "scroll instruction."

For example, the display brightness, contrast, or saturation may be changed in accordance with the page-turning speed and/or the scroll speed.

Specifically, in the case where the page-turning speed and/or the scroll speed are/is higher than the predetermined speed, the display brightness may be decreased in synchronization with the speed.

Alternatively, in the case where the page-turning speed and/or the scroll speed are/is higher than the predetermined speed, the contrast may be decreased in synchronization with the speed.

For example, the speed at which user's eyes cannot follow displayed images can be used as the predetermined speed.

The contrast can be reduced in such a manner that the gray level of a bright region (with a high gray level) included in image information is brought close to the gray level of a dark region (with a low gray level) included in the image information.

Alternatively, the contrast can be reduced in such a manner that the gray level of the dark region included in image information is brought close to the gray level of the bright region included in the image information.

Specifically, in the case where the page-turning speed and/or the scroll speed are/is higher than the predetermined speed, display may be performed such that the yellow tone is increased or the blue tone is decreased in synchronization with the speed.

Image information may be generated on the basis of information of the usage environment of the information processing device acquired by the sensor portion 250. For example, user's favorite color can be used as the background color of the image information in accordance with the acquired ambient brightness or the like.

Thus, favorable environment can be provided for a user of the information processing device 200.

This embodiment can be combined with any of the other embodiments in this specification as appropriate.

(Embodiment 8)

In this embodiment, a semiconductor device (memory device) that can retain stored data even when not powered and that has an unlimited number of write cycles, and a CPU including the semiconductor device will be described. The CPU described in this embodiment can be used for the information processing device described in Embodiment 6, for example.

<Memory Device>

Figure 25A:
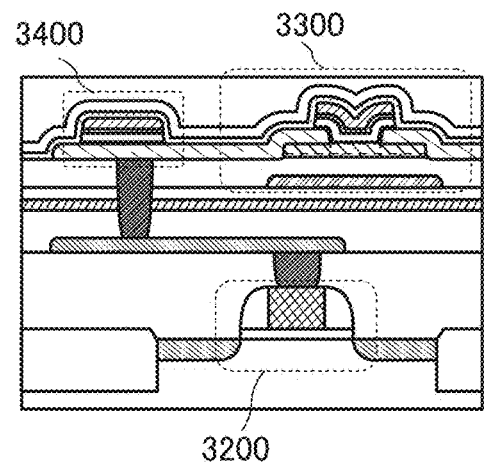
FIGS. 25A to 25C are a cross-sectional view and circuit diagrams each illustrating a structure of a semiconductor device of Embodiment.
Figure 25B:
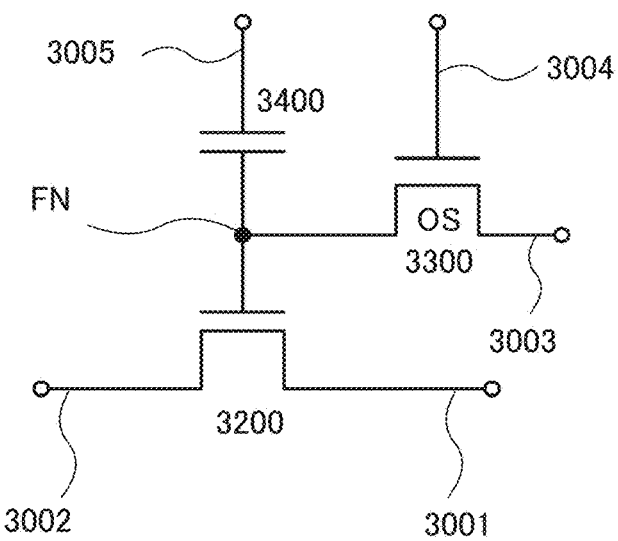
Figure 25C:
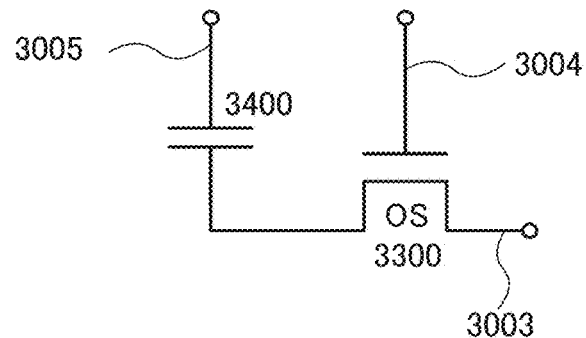

An example of a semiconductor device (memory device) which can retain stored data even when not powered and which has an unlimited number of write cycles is shown in FIGS. 25A to 25C. Note that FIG. 25B is a circuit diagram of the structure in FIG. 25A.

The semiconductor device illustrated in FIGS. 25A and 25B includes a transistor 3200 using a first semiconductor material, a transistor 3300 using a second semiconductor material, and a capacitor 3400.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 25B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 25A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ (>$V_{th\_H}$), the transistor 3200 is turned on. On the other hand, in the case where the low-level charge is supplied to the gate electrode of the transistor 3200 in writing, even when the potential of the fifth wiring 3005 is $V_0$ (<$V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell be read. For example, the fifth wiring 3005 of memory cells from which data is not read may be supplied with a potential at which the transistor 3200 is turned off regardless of the potential supplied to the gate electrode, that is, a potential lower than $V_{th\_H}$, whereby only data of a desired memory cell can be read.

The semiconductor device illustrated in FIG. 25C differs from the semiconductor device illustrated in FIG. 25A in that the transistor 3200 is not provided. Also in this case, writing and retaining operation of data can be performed in a manner similar to the semiconductor device illustrated in FIG. 25A.

Next, reading of data of the semiconductor device illustrated in FIG. 25C is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0}+C \times V)/(C_B+C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1$>$V_0$), the potential of the bit line BL in the case of retaining the potential $V_1$ (=$(C_B \times V_{B0}+C \times V_1)/(C_B+C)$) is higher than the potential of the bit line BL in the case of retaining the potential $V_0$ (=$(C_B \times V_{B0}+C \times V_0)/(C_B+C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device described in this embodiment does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The above memory device can also be used in an LSI such as a digital signal processor (DSP), a custom LSI, or a programmable logic device (PLD), in addition to a central processing unit (CPU), and a radio frequency (RF) device, for example.

<CPU>

A CPU including the above memory device is described below.

Figure 26:
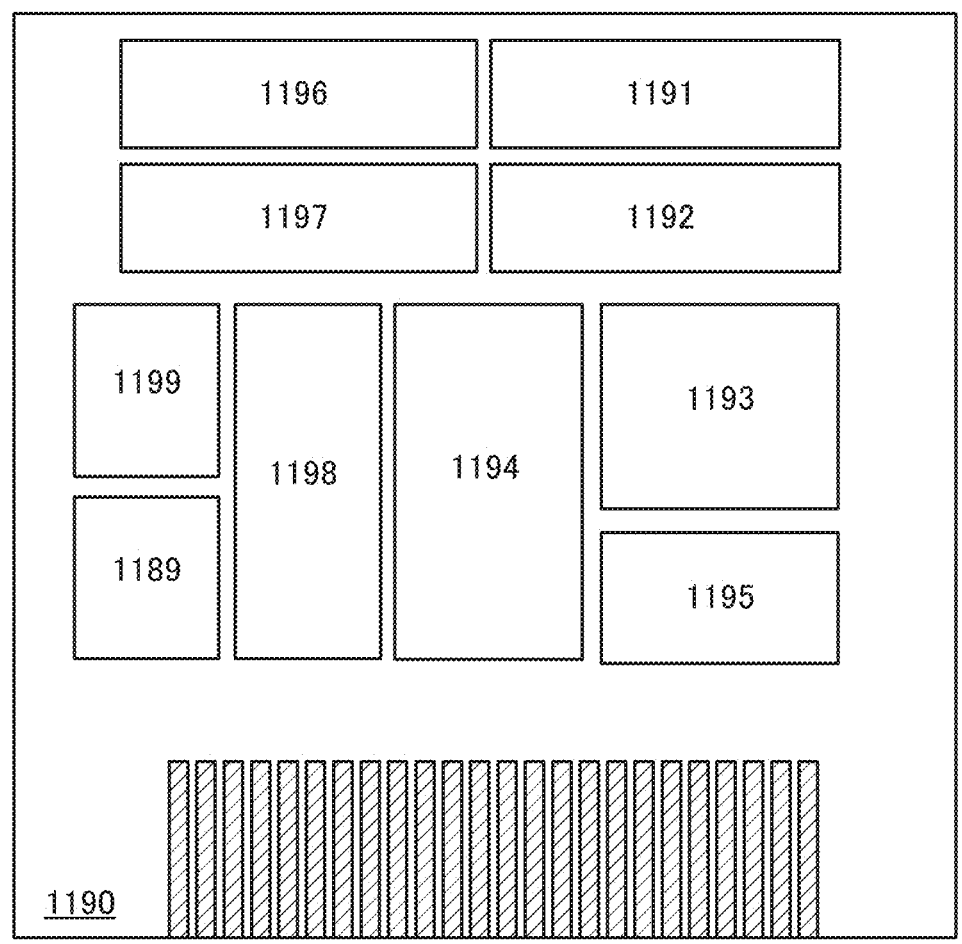
FIG. 26 is a block diagram illustrating a structure of a CPU of Embodiment.

FIG. 26 is a block diagram illustrating a configuration example of the CPU including the above memory device.

The CPU illustrated in FIG. 26 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 26 is just an example in which the configuration is simplified, and an actual CPU may have a variety of configurations depending on the application. For example, the CPU may have the following configuration: a structure including the CPU illustrated in FIG. 26 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 26, a memory cell is provided in the register 1196.

In the CPU illustrated in FIG. 26, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Figure 27:
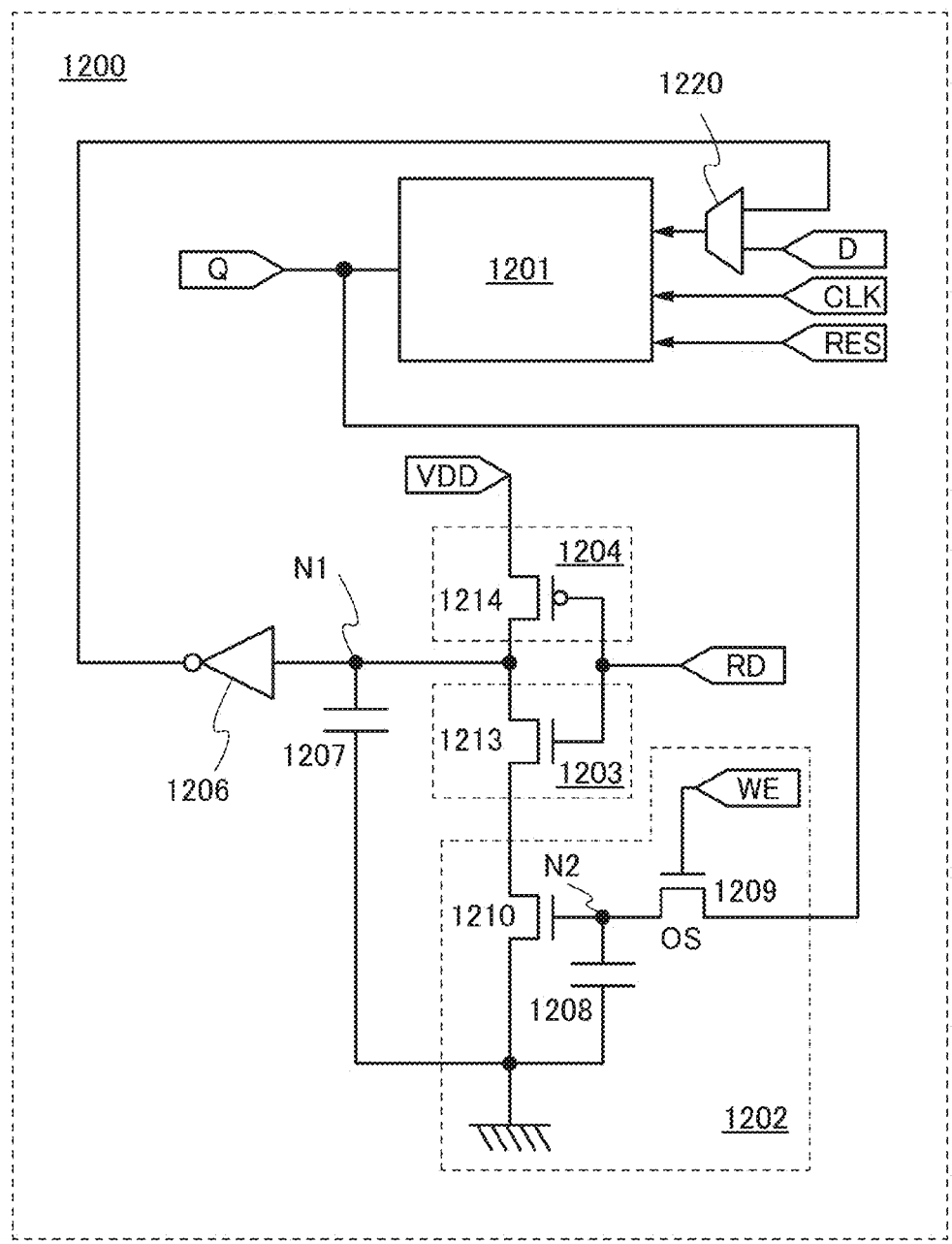
FIG. 27 is a circuit diagram illustrating a structure of a memory element of Embodiment.

FIG. 27 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node N2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node N1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to a first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 27 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 27, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 27, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory element 1200. Further alternatively, in the memory element 1200, a transistor in which a channel is formed in an oxide semiconductor film can be included besides the transistor 1209, and a transistor in which a channel is formed in a layer formed using a semiconductor other than an oxide semiconductor or the substrate 1190 can be used for the rest of the transistors.

As the circuit 1201 in FIG. 27, for example, a flip-flop circuit can be used. As the logic element 1206, for example, an inverter or a clocked inverter can be used.

In a period during which the memory element 1200 is not supplied with the power supply voltage, the semiconductor device described in this embodiment can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when the transistor in which a channel is formed in an oxide semiconductor film is used as the transistor 1209, a signal is retained in the capacitor 1208 for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the state (the on state or the off state) of the transistor 1210 is determined in accordance with the signal retained by the capacitor 1208 and can be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and an RF device.

At least part of this embodiment can be implemented in combination with any of the other embodiments described in this specification as appropriate.

(Embodiment 9)

In this embodiment, a display module and electronic devices which include a reflective display device of one embodiment of the present invention will be described with reference to FIGS. 28A to 28H.

FIGS. 28A to 28G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 28A:
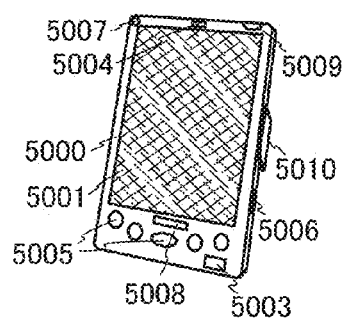
FIGS. 28A to 28H each illustrate a structure of an electronic device of Embodiment.
Figure 28B:
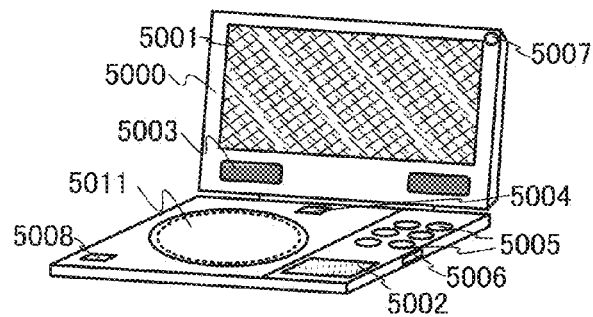
Figure 28C:
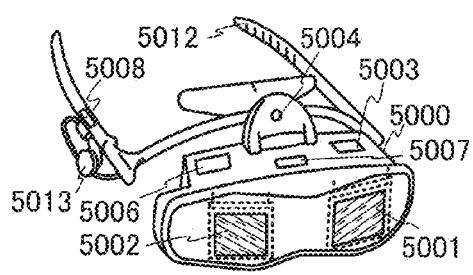
Figure 28D:
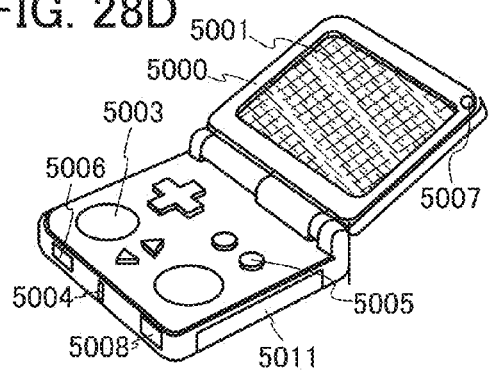
Figure 28E:
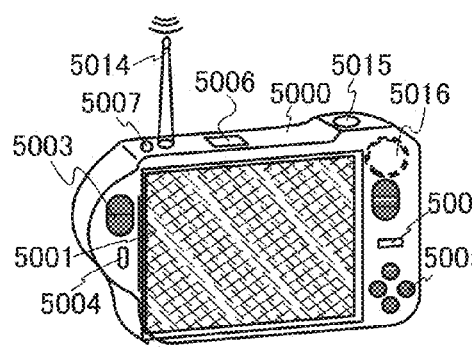
Figure 28F:
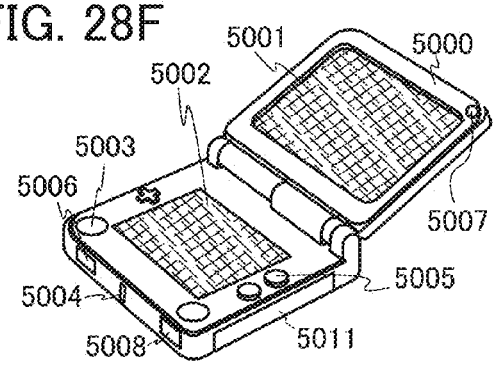
Figure 28G:
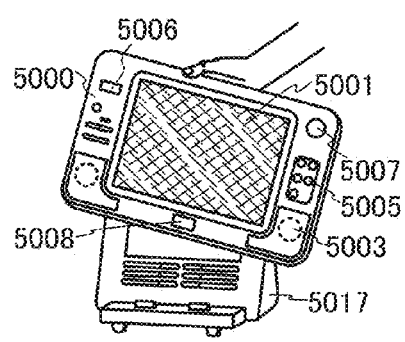

FIG. 28A illustrates a mobile computer which can include a switch 5009, an infrared port 5010, and the like in addition to the above components. FIG. 28B illustrates a portable image reproducing device (e.g., a DVD reproducing device) provided with a recording medium, and the portable image reproducing device can include a second display portion 5002, a recording medium reading portion 5011, and the like in addition to the above components. FIG. 28C illustrates a goggle-type display which can include the second display portion 5002, a support portion 5012, an earphone 5013, and the like in addition to the above components. FIG. 28D illustrates a portable game console which can include the recording medium reading portion 5011 and the like in addition to the above components. FIG. 28E illustrates a digital camera with a television reception function, and the digital camera can include an antenna 5014, a shutter button 5015, an image receiving portion 5016, and the like in addition to the above components. FIG. 28F illustrates a portable game console which can include the second display portion 5002, the recording medium reading portion 5011, and the like in addition to the above components. FIG. 28G illustrates a portable television receiver which can include a charger 5017 capable of transmitting and receiving signals, and the like in addition to the above components.

The electronic devices in FIGS. 28A to 28G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIGS. 28A to 28G are not limited thereto, and the electronic devices can have a variety of functions.

Figure 28H:
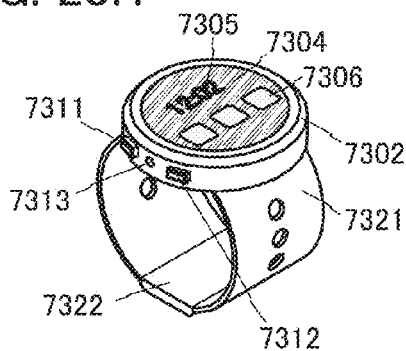

FIG. 28H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 28H can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

This embodiment can be combined with any of the other embodiments in this specification as appropriate.

In this specification and the like, for example, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X and Y each denote an object (e.g., a device, an element, a circuit, a line, an electrode, a terminal, a conductive film, or a layer).

For example, in the case where X and Y are directly connected, an element that enables electrical connection between X and Y (e.g., a switch, a transistor, a capacitor, an inductor, a resistor, a diode, a display element, a light-emitting element, or a load) is not connected between X and Y, and X and Y are connected without the element that enables electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also serves as an electrode, one conductive film serves as the wiring and the electrode. Thus, "electrical connection" in this specification includes in its category such a case where one conductive film has functions of a plurality of components.

This application is based on Japanese Patent Application serial no. 2015-157369 filed with Japan Patent Office on Aug. 7, 2015 and Japanese Patent Application serial no. 2016-125619 filed with Japan Patent Office on Jun. 24, 2016, the entire contents of which are hereby incorporated by reference.

What is claimed is:

1. A display panel comprising:
   a signal line; and
   a pixel comprising a first switch, a second switch, a third switch, a reflective display element, and a light-emitting element,
   wherein the reflective display element and the light-emitting element overlap each other,
   wherein one of a source and a drain of the first switch and one of a source and a drain of the second switch are electrically connected to the signal line,
   wherein the other of the source and the drain of the first switch is electrically connected to the reflective display element,
   wherein the other of the source and the drain of the second switch is electrically connected to the light-emitting element through the third switch,
   wherein a first gate of the third switch and a second gate of the third switch are electrically connected to the other of the source and the drain of the second switch, and
   wherein one of a source and a drain of the third switch is electrically connected to the light-emitting element.

2. The display panel according to claim 1,
   wherein a gate of the first switch is electrically connected to a first scan line, and
   wherein a gate of the second switch is electrically connected to a second scan line.

3. The display panel according to claim 1,
   wherein one of the first switch, the second switch, and the third switch comprises an oxide semiconductor.

4. The display panel according to claim 1, further comprising:
   a first signal line driver circuit;
   a second signal line driver circuit;
   a first transistor; and
   a second transistor,
   wherein the first signal line driver circuit is electrically connected to the signal line through the first transistor, and
   wherein the second signal line driver circuit is electrically connected to the signal line through the second transistor.

5. The display panel according to claim 1,
   wherein the reflective display element comprises a reflective film and is configured to reflect an incident light,
   wherein the reflective film comprises an opening, and
   wherein the light-emitting element is configured to emit light toward the opening.

6. The display panel according to claim 1,
   wherein a display region of the light-emitting element is surrounded by a display region of the reflective display element.

7. The display panel according to claim 1,
   wherein the reflective display element comprises a liquid crystal material.

8. An electronic device comprising:
   a sensor portion configured to measure an illuminance of an ambient light;
   an arithmetic device configured to compare the measured illuminance with the predetermined illuminance and generate image information in accordance with the comparison result; and
   a display panel configured to perform display based on the image information,
   wherein the display panel comprises:
      a signal line; and
      a pixel comprising a first switch, a second switch, a third switch, a reflective display element, and a light-emitting element,
   wherein the reflective display element and the light-emitting element overlap each other,
   wherein one of a source and a drain of the first switch and one of a source and a drain of the second switch are electrically connected to the signal line,
   wherein the other of the source and the drain of the first switch is electrically connected to the reflective display element,
   wherein the other of the source and the drain of the second switch is electrically connected to the light-emitting element through the third switch, wherein a first gate of the third switch and a second gate of the third switch are electrically connected to the other of the source and the drain of the second switch, wherein one of a source and a drain of the third switch is electrically connected to the light-emitting element, and wherein, depending on the measured illuminance of the ambient light, at least one of the reflective display element and the light-emitting element is configured to be used for display.

9. The electronic device according to claim 8, wherein the arithmetic device comprises a CPU.

10. The electronic device according to claim 8, wherein a gate of the first switch is electrically connected to a first scan line, and wherein a gate of the second switch is electrically connected to a second scan line.

11. The electronic device according to claim 8, wherein one of the first switch, the second switch, and the third switch comprises an oxide semiconductor.

12. The electronic device according to claim 8, further comprising:

a first signal line driver circuit;
a second signal line driver circuit;
a first transistor; and
a second transistor, wherein the first signal line driver circuit is electrically connected to the signal line through the first transistor, and wherein the second signal line driver circuit is electrically connected to the signal line through the second transistor.

13. The electronic device according to claim 8, wherein the reflective display element comprises a reflective film and is configured to reflect an incident light, wherein the reflective film comprises an opening, and wherein the light-emitting element is configured to emit light toward the opening.

14. The electronic device according to claim 8, wherein a display region of the light-emitting element is surrounded by a display region of the reflective display element.

15. The electronic device according to claim 8, wherein the reflective display element comprises a liquid crystal material.

* * * * *